United States Patent
Yamazaki et al.

(10) Patent No.: US 12,400,693 B2
(45) Date of Patent: Aug. 26, 2025

(54) SEMICONDUCTOR DEVICE WITH FIRST AND SECOND ELEMENTS AND ELECTRONIC DEVICE

(71) Applicant: Semiconductor Energy Laboratory Co., Ltd., Atsugi (JP)

(72) Inventors: Shunpei Yamazaki, Setagaya (JP); Hajime Kimura, Atsugi (JP); Hideki Uochi, Atsugi (JP); Atsushi Miyaguchi, Hadano (JP); Tatsunori Inoue, Yamato (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 103 days.

(21) Appl. No.: 18/025,009

(22) PCT Filed: Sep. 13, 2021

(86) PCT No.: PCT/IB2021/058288
§ 371 (c)(1),
(2) Date: Mar. 7, 2023

(87) PCT Pub. No.: WO2022/064315
PCT Pub. Date: Mar. 31, 2022

(65) Prior Publication Data
US 2023/0326503 A1  Oct. 12, 2023

(30) Foreign Application Priority Data
Sep. 25, 2020 (JP) .................. 2020-161173

(51) Int. Cl.
| | | |
|---|---|---|
| *G11C 7/22* | (2006.01) | |
| *G11C 11/22* | (2006.01) | |
| *H10B 53/30* | (2023.01) | |

(52) U.S. Cl.
CPC ............ *G11C 7/22* (2013.01); *G11C 11/2273* (2013.01); *G11C 11/2275* (2013.01);
(Continued)

(58) Field of Classification Search
CPC ... G11C 7/22; G11C 11/2273; G11C 11/2275; G11C 11/2293; G11C 11/221;
(Continued)

(56) References Cited

U.S. PATENT DOCUMENTS

| | | |
|---|---|---|
| 5,060,191 A | 10/1991 | Nagasaki et al. |
| 5,519,234 A | 5/1996 | Paz de Araujo et al. |

(Continued)

FOREIGN PATENT DOCUMENTS

| | | |
|---|---|---|
| CN | 001438650 A | 8/2003 |
| CN | 001571067 A | 1/2005 |

(Continued)

OTHER PUBLICATIONS

International Search Report (Application No. PCT/IB2021/058288) Dated Nov. 22, 2021.

(Continued)

*Primary Examiner* — Jerome Leboeuf
(74) *Attorney, Agent, or Firm* — Eric J. Robinson; Robinson Intellectual Property Law Office, P.C.

(57) ABSTRACT

A semiconductor device that has reduced power consumption and is capable of non-destructive reading is provided. The semiconductor device includes a first circuit including a first transistor and a first FTJ element, and a second circuit including a second transistor and a second FTJ element. A first terminal of the first transistor is electrically connected to an output terminal of the first FTJ element, and a first terminal of the second transistor is electrically connected to an input terminal of the second FTJ element. A second terminal of the first transistor and a second terminal of the (Continued)

second transistor are electrically connected to a read circuit. In a data writing method, a voltage is applied between the input terminal and the output terminal of each of the first FTJ element and the second FTJ element to polarize the first FTJ element and the second FTJ element. In a data reading method, a differential current flowing through the first FTJ element and the second FTJ element is input to the read circuit.

5 Claims, 24 Drawing Sheets

(52) U.S. Cl.
CPC .......... *G11C 11/2293* (2013.01); *H10B 53/30* (2023.02); *G11C 11/221* (2013.01)

(58) Field of Classification Search
CPC .......... G11C 7/062; G11C 11/38; G11C 7/08; G11C 13/00; H10B 53/30; H01L 29/78645; H01L 29/7869; H01L 29/78696
See application file for complete search history.

(56) References Cited

U.S. PATENT DOCUMENTS

| | | | |
|---|---|---|---|
| 5,851,841 A | 12/1998 | Ushikubo et al. | |
| 5,883,828 A | 3/1999 | Cuchiaro et al. | |
| 6,901,002 B2 | 5/2005 | Matsushita | |
| 7,126,843 B2 | 10/2006 | Higashi | |
| 7,368,298 B2 | 5/2008 | Wang | |
| 7,446,361 B2 | 11/2008 | Maruyama | |
| 7,842,989 B2 | 11/2010 | Kato | |
| 8,891,285 B2 | 11/2014 | Takemura | |
| 9,779,797 B2 | 10/2017 | Ino et al. | |
| 9,934,838 B1 * | 4/2018 | Han | G11C 13/004 |
| 2003/0156450 A1 | 8/2003 | Higashi | |
| 2004/0151019 A1 | 8/2004 | Matsushita | |
| 2007/0171693 A1 | 7/2007 | Koyama | |
| 2009/0173978 A1 | 7/2009 | Kato | |
| 2012/0294069 A1 | 11/2012 | Ohmaru et al. | |
| 2012/0314482 A1 | 12/2012 | Takemura | |
| 2020/0005848 A1 * | 1/2020 | Frank | G06N 3/065 |
| 2020/0357453 A1 * | 11/2020 | Slesazeck | G11C 11/2273 |
| 2021/0066318 A1 * | 3/2021 | Chang | G11C 11/54 |
| 2022/0076733 A1 * | 3/2022 | Yudanov | G06F 9/546 |
| 2022/0351768 A1 * | 11/2022 | Liao | G11C 11/221 |
| 2023/0012093 A1 * | 1/2023 | Kakushima | H10B 10/18 |

FOREIGN PATENT DOCUMENTS

| | | |
|---|---|---|
| DE | 3922423 | 1/1990 |
| JP | 02-154389 A | 6/1990 |
| JP | 05-347422 A | 12/1993 |
| JP | 09-161473 A | 6/1997 |
| JP | 2003-178577 A | 6/2003 |
| JP | 2003-242771 A | 8/2003 |
| JP | 2004-241483 A | 8/2004 |
| JP | 2009-164473 A | 7/2009 |
| KR | 10-0518287 | 10/2005 |
| KR | 10-0682435 | 2/2007 |
| WO | WO-2015/141625 | 9/2015 |

OTHER PUBLICATIONS

Written Opinion (Application No. PCT/IB2021/058288) Dated Nov. 22, 2021.

* cited by examiner

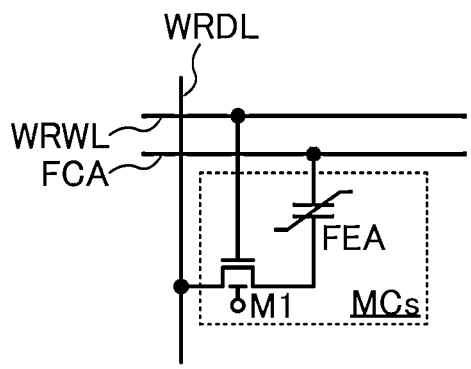 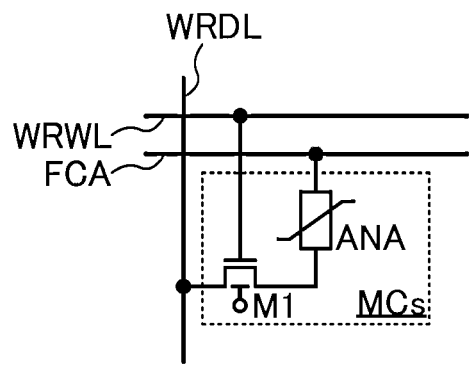

FIG. 21A
| Amorphous | Intermediate state<br>New crystalline phase<br>Crystalline | Crystal |
|---|---|---|
| •completely amorphous | •CAAC<br>•nc<br>•CAC<br>excluding single crystal and poly crystal | •single crystal<br>•poly crystal |
FIG. 21B
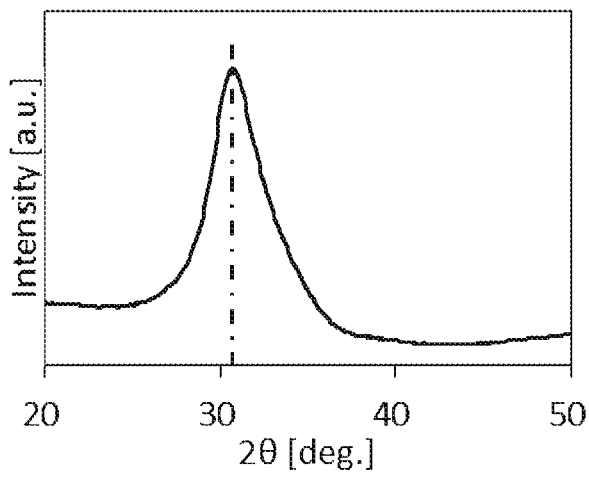
FIG. 21C
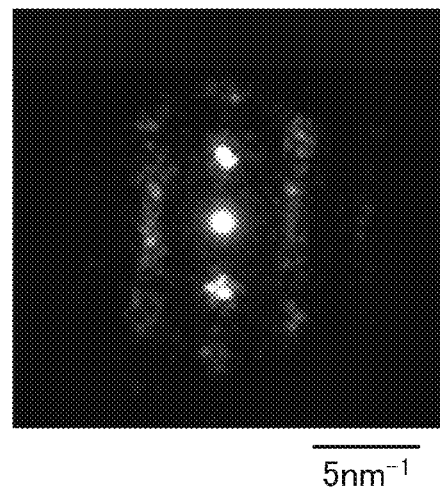

SEMICONDUCTOR DEVICE WITH FIRST AND SECOND ELEMENTS AND ELECTRONIC DEVICE

TECHNICAL FIELD

One embodiment of the present invention relates to a semiconductor device and an electronic device.

Note that one embodiment of the present invention is not limited to the above technical field. The technical field of the invention disclosed in this specification and the like relates to an object, a driving method, or a manufacturing method. Alternatively, one embodiment of the present invention relates to a process, a machine, manufacture, or a composition of matter. Therefore, specific examples of the technical field of one embodiment of the present invention disclosed in this specification include a semiconductor device, a display device, a liquid crystal display device, a light-emitting device, a power storage device, an imaging device, a memory device, a signal processing device, a processor, an electronic device, a system, a driving method thereof, a manufacturing method thereof, and a testing method thereof.

BACKGROUND ART

In recent years, semiconductor devices have been developed, and a CPU (Central Processing Unit), a memory, and the like have been mainly used as LSI (Large Scale Integration) in semiconductor devices. A CPU is an assembly of semiconductor elements and includes a chip of a semiconductor integrated circuit (at least a transistor and a memory) obtained by processing a semiconductor wafer. An electrode serving as a connection terminal is formed in the CPU.

Furthermore, semiconductor devices in which a ferroelectric capacitor, an FTJ (Ferroelectric Tunnel Junction or Ferroelectric Transportation Junction) element, an FeFET (Ferroelectric FET), or the like each using a dielectric with ferroelectricity is provided in the above-described semiconductor integrated circuit have been developed. For example, Patent Document 1 discloses a semiconductor memory cell including a transistor in which a ferroelectric film is provided as a gate insulating film on the back gate side. As another example, Patent Document 2 discloses a memory having a configuration in which a ferroelectric capacitor is electrically connected to a gate of a transistor.

REFERENCE

Patent Document

[Patent Document 1] Japanese Published Patent Application No. 2009-164473
[Patent Document 2] Japanese Published Patent Application No. 2003-178577

SUMMARY OF THE INVENTION

Problems to be Solved by the Invention

As the amount of data handled in electronic devices and the like tends to increase in recent years, an attempt to reduce the size of a memory device, particularly a memory cell, has been made to increase the memory capacity. When the size of a capacitor is reduced to reduce the size of a memory cell, the electrostatic capacitance value of the capacitor decreases and thus it becomes difficult to retain data for a long time. Moreover, the number of refresh operations for retaining data is increased, which may result in higher power consumption. Hence, a memory device preferably employs a memory cell capable of long-term data retention.

In particular, in a memory device with a DRAM (Dynamic Random Access Memory) configuration, when data is read from a memory cell, the retained data is destroyed (destructive reading occurs); thus, data rewriting is essential. Therefore, a circuit for writing back data after reading is required for a DRAM in some cases. Data rewriting may lead to higher power consumption.

An object of one embodiment of the present invention is to provide a semiconductor device that requires no data rewriting (a semiconductor device that performs non-destructive reading). Another object of one embodiment of the present invention is to provide a semiconductor device with reduced power consumption. Another object of one embodiment of the present invention is to provide a semiconductor device with a reduced circuit area. Another object of one embodiment of the present invention is to provide a novel semiconductor device. Another object of one embodiment of the present invention is to provide an electronic device including any of the above-described semiconductor devices.

Note that the objects of one embodiment of the present invention are not limited to the objects listed above. The objects listed above do not preclude the existence of other objects. Note that the other objects are objects that are not described in this section and will be described below. The objects that are not described in this section are derived from the description of the specification, the drawings, and the like and can be extracted as appropriate from the description by those skilled in the art. Note that one embodiment of the present invention is to achieve at least one of the objects listed above and the other objects. Note that one embodiment of the present invention does not necessarily achieve all the objects listed above and the other objects.

Means for Solving the Problems (1)
One embodiment of the present invention is a semiconductor device including a first circuit, a second circuit, and a third circuit. Specifically, the first circuit includes a first transistor and a first FTJ element; the second circuit includes a second transistor and a second FTJ element; and the third circuit includes a switch, an operational amplifier, and a load. The first FTJ element and the second FTJ element each include an input terminal, a tunnel insulating film, a dielectric, and an output terminal; in each of the first FTJ element and the second FTJ element, the input terminal, the tunnel insulating film, the dielectric, and the output terminal are stacked in this order. One of a source and a drain of the first transistor is electrically connected to the output terminal of the first FTJ element, and one of a source and a drain of the second transistor is electrically connected to the input terminal of the second FTJ element. A first terminal of the switch is electrically connected to the other of the source and the drain of the first transistor and the other of the source and the drain of the second transistor; a second terminal of the switch is electrically connected to an inverting input terminal of the operational amplifier and a first terminal of the load; and an output terminal of the operational amplifier is electrically connected to a second terminal of the load. Note that the load includes at least one of a resistor, a capacitor, and a transistor.

(2)

Another embodiment of the present invention is a semiconductor device including a first transistor and a first FTJ element. The first FTJ element includes an input terminal, a tunnel insulating film, a dielectric, and an output terminal; in the first FTJ element, the input terminal, the tunnel insulating film, the dielectric, and the output terminal are stacked in this order. One of a source and a drain of the first transistor is electrically connected to the output terminal of the first FTJ element.

(3)

In another embodiment of the present invention according to the above (1) or (2), the tunnel insulating film may include silicon oxide or silicon nitride, and the dielectric may include an oxide containing one or both of hafnium and zirconium.

(4)

Another embodiment of the present invention is a semiconductor device that includes a first circuit, a second circuit, and a third circuit and is different from the semiconductor device according to the above (1). The first circuit includes a first transistor and a first ferroelectric capacitor; the second circuit includes a second transistor and a second ferroelectric capacitor; and the third circuit includes a switch, an operational amplifier, and a load. One of a source and a drain of the first transistor is electrically connected to a first terminal of the first ferroelectric capacitor, and one of a source and a drain of the second transistor is electrically connected to a first terminal of the second ferroelectric capacitor. A first terminal of the switch is electrically connected to the other of the source and the drain of the first transistor and the other of the source and the drain of the second transistor; a second terminal of the switch is electrically connected to an inverting input terminal of the operational amplifier and a first terminal of the load; and an output terminal of the operational amplifier is electrically connected to a second terminal of the load. The load includes at least one of a resistor, a capacitor, and a transistor. The first ferroelectric capacitor and the second ferroelectric capacitor each include a dielectric, and the dielectric includes an oxide containing one or both of hafnium and zirconium.

(5)

Another embodiment of the present invention is a semiconductor device that includes a first circuit, a second circuit, and a third circuit and is different from the semiconductor devices according to the above (1) and (4). The first circuit includes a first transistor and a first circuit element; the second circuit includes a second transistor and a second circuit element; and the third circuit includes a switch, an operational amplifier, and a load. One of a source and a drain of the first transistor is electrically connected to a first terminal of the first circuit element, and one of a source and a drain of the second transistor is electrically connected to a first terminal of the second circuit element. A first terminal of the switch is electrically connected to the other of the source and the drain of the first transistor and the other of the source and the drain of the second transistor; a second terminal of the switch is electrically connected to an inverting input terminal of the operational amplifier and a first terminal of the load; and an output terminal of the operational amplifier is electrically connected to a second terminal of the load. The load includes at least one of a resistor, a capacitor, and a transistor. The first circuit element and the second circuit element each include any one of a variable resistor, an MTJ element, and a phase change memory element.

(6)

Another embodiment of the present invention is an electronic device including the semiconductor device according to any one of the above (1) to (5) and a housing.

Note that in this specification and the like, a semiconductor device refers to a device that utilizes semiconductor characteristics, and means a circuit including a semiconductor element (a transistor, a diode, a photodiode, or the like), a device including the circuit, and the like. The semiconductor device also means all devices that can function by utilizing semiconductor characteristics. For example, an integrated circuit, a chip including an integrated circuit, and an electronic component including a chip or the like in a package are examples of the semiconductor device. Moreover, a memory device, a display device, a light-emitting device, a lighting device, an electronic device, and the like themselves may be semiconductor devices or may each include a semiconductor device.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or texts, a connection relation other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, or a load) can be connected between X and Y. Note that a switch has a function of being controlled to be turned on or off. That is, the switch has a function of being in a conduction state (on state) or a non-conduction state (off state) to control whether current flows or not.

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. For instance, even if another circuit is provided between X and Y, X and Y are regarded as being functionally connected when a signal output from X is transmitted to Y.

Note that an explicit description "X and Y are electrically connected" includes the case where X and Y are electrically connected (i.e., the case where X and Y are connected with another element or another circuit provided therebetween) and the case where X and Y are directly connected (i.e., the case where X and Y are connected without another element or another circuit provided therebetween).

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X; a drain (or a second terminal or the like) of the transistor is electrically connected to Y; and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when a circuit diagram shows that independent components are electrically connected to each other, one component has functions of a plurality of components in some cases. For example, when part of a wiring also functions as an electrode, one conductive film has functions of both components, a function of the wiring and a function of the electrode. Thus, electrical connection in this specification includes, in its category, such a case where one conductive film has functions of a plurality of components.

In this specification and the like, a "resistor" can be, for example, a circuit element having a resistance value higher than $0\Omega$ or a wiring having a resistance value higher than $0\Omega$. Therefore, in this specification and the like, a "resistor" sometimes includes a wiring having a resistance value, a transistor in which current flows between its source and drain, a diode, and a coil. Thus, the term "resistor" can be sometimes replaced with the terms "resistance", "load", "region having a resistance value", and the like; conversely, the terms "resistance", "load", and "region having a resistance value" can be sometimes replaced with the term "resistor" and the like. The resistance value can be, for example, preferably greater than or equal to 1 m$\Omega$ and less than or equal to 10$\Omega$, further preferably greater than or equal to 5 m$\Omega$ and less than or equal to 5$\Omega$, still further preferably greater than or equal to 10 m$\Omega$ and less than or equal to 1$\Omega$. As another example, the resistance value may be greater than or equal to 1$\Omega$ and less than or equal to $1\times10^9\Omega$.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. Therefore, in this specification and the like, a "capacitor" includes a circuit element that has a pair of electrodes and a dielectric between the electrodes. The terms "capacitor", "parasitic capacitance", "gate capacitance", and the like can be replaced with the term "capacitance" or the like in some cases. Conversely, the term "capacitance" can be replaced with the terms "capacitor", "parasitic capacitance", "gate capacitance", and the like in some cases. The term "pair of electrodes" of "capacitor" can be replaced with "pair of conductors", "pair of conductive regions", "pair of regions", and the like. Note that the electrostatic capacitance value can be greater than or equal to 0.05 fF and less than or equal to 10 pF, for example. As another example, the electrostatic capacitance value may be greater than or equal to 1 pF and less than or equal to 10 µF.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor. Therefore, the terms "source" and "drain" can sometimes be replaced with each other in this specification and the like. In this specification and the like, expressions "one of a source and a drain" (or a first electrode or a first terminal) and "the other of the source and the drain" (or a second electrode or a second terminal) are used to describe the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, for example, a transistor with a multi-gate structure having two or more gate electrodes can be used as the transistor. With the multi-gate structure, channel formation regions are connected in series; accordingly, a plurality of transistors are connected in series. Hence, with the multi-gate structure, the amount of off-state current can be reduced, and the withstand voltage of the transistor can be increased (the reliability can be improved). Alternatively, with the multi-gate structure, in the case of operation in a saturation region, current flowing between the drain and the source does not change much even if the drain-source voltage changes, and thus the voltage-current characteristics having a flat slope can be obtained. By utilizing the flat slope of the voltage-current characteristics, an ideal current source circuit or an active load having an extremely high resistance value can be obtained. Accordingly, a differential circuit, a current mirror circuit, or the like having excellent properties can be obtained.

The case where a single circuit element is illustrated in a circuit diagram may indicate a case where the circuit element includes a plurality of circuit elements. For example, the case where a single resistor is illustrated in a circuit diagram may indicate a case where two or more resistors are electrically connected to each other in series. As another example, the case where a single capacitor is illustrated in a circuit diagram may indicate a case where two or more capacitors are electrically connected to each other in parallel. As another example, the case where a single transistor is illustrated in a circuit diagram may indicate a case where two or more transistors are electrically connected to each other in series and their gates are electrically connected to each other. Similarly, as another example, the case where a single switch is illustrated in a circuit diagram may indicate a case where the switch includes two or more transistors which are electrically connected to each other in series or in parallel and whose gates are electrically connected to each other.

In this specification and the like, a node can be referred to as a terminal, a wiring, an electrode, a conductive layer, a conductor, an impurity region, or the like depending on the circuit configuration, the device structure, or the like. Furthermore, a terminal, a wiring, or the like can be referred to as a node.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, change with a change of the reference potential.

In this specification and the like, the terms "high-level potential" and "low-level potential" do not mean a particular potential. For example, in the case where two wirings are both described as "functioning as a wiring for supplying a high-level potential", the levels of the high-level potentials supplied from the wirings are not necessarily equal to each other. Similarly, in the case where two wirings are both described as "functioning as a wiring for supplying a low-level potential", the levels of the low-level potentials supplied from the wirings are not necessarily equal to each other.

"Current" means a charge transfer (electrical conduction); for example, the description "electrical conduction of positively charged particles occurs" can be rephrased as "electrical conduction of negatively charged particles occurs in the opposite direction". Therefore, unless otherwise specified, "current" in this specification and the like refers to a charge transfer (electrical conduction) accompanied by carrier movement. Examples of a carrier here include an electron, a hole, an anion, a cation, and a complex ion, and the type of carrier differs between current flow systems (e.g., a semiconductor, a metal, an electrolyte solution, and a vacuum). The "direction of current" in a wiring or the like refers to the direction in which a carrier with a positive charge moves, and the amount of current is expressed as a positive value. In other words, the direction in which a carrier with a negative charge moves is opposite to the direction of current, and the amount of current is expressed as a negative value. Thus, in the case where the polarity of current (or the direction of current) is not specified in this specification and the like, the description "current flows from element A to element B" can be rephrased as "current flows from element B to element A", for example. The description "current is input to element A" can be rephrased as "current is output from element A", for example.

Ordinal numbers such as "first", "second", and "third" in this specification and the like are used to avoid confusion among components. Thus, the ordinal numbers do not limit the number of components. Furthermore, the ordinal numbers do not limit the order of components. In this specification and the like, for example, a "first" component in one embodiment can be referred to as a "second" component in other embodiments or the scope of claims. As another example, a "first" component in one embodiment in this specification and the like can be omitted in other embodiments or the scope of claims.

In this specification and the like, the terms for describing positioning, such as "over" and "under", are sometimes used for convenience to describe the positional relation between components with reference to drawings. The positional relation between components is changed as appropriate in accordance with the direction from which each component is described. Thus, the positional relation is not limited to the terms described in the specification and the like, and can be described with another term as appropriate depending on the situation. For example, the expression "an insulator positioned over (on) a top surface of a conductor" can be replaced with the expression "an insulator positioned under (on) a bottom surface of a conductor" when the direction of a drawing showing these components is rotated by 180°.

Furthermore, the terms such as "over" and "under" do not necessarily mean that a component is placed directly over or directly under and in direct contact with another component. For example, the expression "electrode B over insulating layer A" does not necessarily mean that the electrode B is formed on and in direct contact with the insulating layer A, and does not exclude the case where another component is provided between the insulating layer A and the electrode B.

In this specification and the like, the terms "film", "layer", and the like can be interchanged with each other depending on the situation. For example, the term "conductive layer" can be changed into the term "conductive film" in some cases. As another example, the term "insulating film" can be changed into the term "insulating layer" in some cases. Alternatively, the term "film", "layer", or the like is not used and can be interchanged with another term depending on the case or the situation. For example, the term "conductive layer" or "conductive film" can be changed into the term "conductor" in some cases. As another example, the term "insulating layer" or "insulating film" can be changed into the term "insulator" in some cases.

In this specification and the like, the term "electrode", "wiring", "terminal", or the like does not limit the function of a component. For example, an "electrode" is used as part of a wiring in some cases, and vice versa. Furthermore, the term "electrode" or "wiring" also includes the case where a plurality of "electrodes" or "wirings" are formed in an integrated manner, for instance. For example, a "terminal" is used as part of a "wiring" or an "electrode" in some cases, and vice versa. Furthermore, the term "terminal" also includes the case where a plurality of "electrodes", "wirings", "terminals", or the like are formed in an integrated manner, for example. Therefore, for example, an "electrode" can be part of a "wiring" or a "terminal", and a "terminal" can be part of a "wiring" or an "electrode". Moreover, the terms "electrode", "wiring", "terminal", and the like are sometimes replaced with the term "region" or the like depending on the case.

In this specification and the like, the terms "wiring", "signal line", "power supply line", and the like can be interchanged with each other depending on the case or the situation. For example, the term "wiring" can be changed into the term "signal line" in some cases. As another example, the term "wiring" can be changed into the term "power supply line" or the like in some cases. Conversely, the term "signal line", "power supply line", or the like can be changed into the term "wiring" in some cases. The term "power supply line" or the like can be changed into the term "signal line" or the like in some cases. Conversely, the term "signal line" or the like can be changed into the term "power supply line" or the like in some cases. The term "potential" that is applied to a wiring can be changed into the term "signal" or the like depending on the case or the situation. Conversely, the term "signal" or the like can be changed into the term "potential" in some cases.

In this specification and the like, an impurity in a semiconductor refers to, for example, an element other than a main component of a semiconductor layer. For example, an element with a concentration lower than 0.1 atomic % is an impurity. When an impurity is contained, for example, the density of defect states in a semiconductor is increased, carrier mobility is decreased, or crystallinity is decreased in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specific examples are hydrogen (contained also in water), lithium, sodium, silicon, boron, phosphorus, carbon, and nitrogen. Specifically, when the semiconductor is a silicon layer, examples of an impurity that changes characteristics of the semiconductor include Group 1 elements, Group 2 elements, Group 13 elements, and Group 15 elements (except oxygen and hydrogen).

In this specification and the like, a switch has a function of being in a conduction state (on state) or a non-conduction state (off state) to determine whether current flows or not. Alternatively, a switch has a function of selecting and changing a current path. Thus, a switch may have two or more terminals through which current flows, in addition to a control terminal. For example, an electrical switch or a mechanical switch can be used. That is, a switch can be any element capable of controlling current, and is not limited to a particular element.

Examples of an electrical switch include a transistor (e.g., a bipolar transistor and a MOS transistor), a diode (e.g., a PN diode, a PIN diode, a Schottky diode, a MIM (Metal Insulator Metal) diode, a MIS (Metal Insulator Semiconductor) diode, and a diode-connected transistor), and a logic circuit in which such elements are combined. Note that in the case of using a transistor as a switch, a "conduction state" of the transistor refers to a state where a source electrode and a drain electrode of the transistor can be regarded as being electrically short-circuited, a state where current can be made to flow between the source electrode and the drain electrode, or the like. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conduction and non-conduction with movement of the electrode.

In this specification, "parallel" indicates a state where two straight lines are placed at an angle greater than or equal to −10° and less than or equal to 10°. Thus, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Thus, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

Effect of the Invention

One embodiment of the present invention can provide a semiconductor device that requires no data rewriting (a semiconductor device that performs non-destructive reading). Another embodiment of the present invention can provide a semiconductor device with reduced power consumption. Another embodiment of the present invention can provide a semiconductor device with a reduced circuit area. Another embodiment of the present invention can provide a novel semiconductor device. Another embodiment of the present invention can provide an electronic device including any of the above-described semiconductor devices.

Note that the effects of one embodiment of the present invention are not limited to the effects listed above. The effects listed above do not preclude the existence of other effects. Note that the other effects are effects that are not described in this section and will be described below. The effects that are not described in this section are derived from the description of the specification, the drawings, and the like and can be extracted from the description by those skilled in the art. Note that one embodiment of the present invention has at least one of the effects listed above and the other effects. Accordingly, depending on the case, one embodiment of the present invention does not have the effects listed above in some cases.

BRIEF DESCRIPTION OF THE DRAWINGS

FIG. 6A and FIG. 6B are circuit diagrams illustrating configuration examples of a memory cell of a semiconductor device.

FIG. 21A is a diagram showing classification of crystal structures of IGZO, FIG. 21B is a diagram showing an XRD spectrum of crystalline IGZO, and FIG. 21C is a diagram showing a nanobeam electron diffraction pattern of crystalline IGZO.

MODE FOR CARRYING OUT THE INVENTION

Figure 1A:
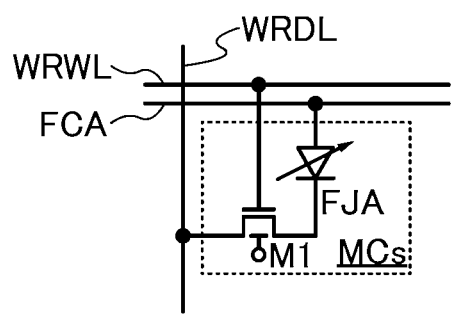
FIG. 1A to FIG. 1C are circuit diagrams illustrating configuration examples of a memory cell of a semiconductor device.

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like. For example, in the case where a metal oxide is included in a channel formation region of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an OS transistor is mentioned, the OS transistor can also be referred to as a transistor including a metal oxide or an oxide semiconductor.

In this specification and the like, a metal oxide containing nitrogen is also collectively referred to as a metal oxide in some cases. A metal oxide containing nitrogen may be referred to as a metal oxynitride.

In this specification and the like, one embodiment of the present invention can be constituted by appropriately combining a structure described in an embodiment with any of the structures described in the other embodiments. In addition, in the case where a plurality of structure examples are described in one embodiment, the structure examples can be combined as appropriate.

Note that a content (or part of the content) described in one embodiment can be applied to, combined with, or replaced with at least one of another content (or part of the content) in the embodiment and a content (or part of the content) described in one or a plurality of different embodiments.

Note that in each embodiment, a content described in the embodiment is a content described using a variety of diagrams or a content described with text disclosed in the specification.

Note that by combining a diagram (or part thereof) described in one embodiment with at least one of another part of the diagram, a different diagram (or part thereof) described in the embodiment, and a diagram (or part thereof) described in one or a plurality of different embodiments, much more diagrams can be formed.

Embodiments described in this specification are described with reference to the drawings. Note that the embodiments can be implemented in many different modes, and it will be readily appreciated by those skilled in the art that modes and details can be changed in various ways without departing from the spirit and scope thereof. Therefore, the present invention should not be construed as being limited to the description in the embodiments. Note that in the structures of the invention in the embodiments, the same portions or portions having similar functions are denoted by the same reference numerals in different drawings, and repeated description thereof is omitted in some cases. In perspective views and the like, some components might not be illustrated for clarity of the drawings.

In this specification and the like, when a plurality of components are denoted with the same reference numerals, and in particular need to be distinguished from each other, an identification sign such as "_1", "[n]", or "[m,n]" is sometimes added to the reference numerals. Components denoted with identification signs such as "_1", "[n]", and "[m,n]" in the drawings and the like are sometimes denoted without such identification signs in this specification and the like when the components do not need to be distinguished from each other.

In the drawings in this specification, the size, the layer thickness, or the region is exaggerated for clarity in some cases. Therefore, the size, the layer thickness, or the region is not necessarily limited to the illustrated scale. The drawings are schematic views showing ideal examples, and embodiments of the present invention are not limited to shapes, values, or the like shown in the drawings. For example, variations in signal, voltage, or current due to noise, variations in signal, voltage, or current due to difference in timing, or the like can be included.

Embodiment 1

In this embodiment, a semiconductor device of one embodiment of the present invention will be described.

Configuration Example 1

FIG. 1A illustrates a circuit configuration example of a circuit MCs included in a memory device that is a semiconductor device of one embodiment of the present invention.

The circuit MCs includes a transistor M1 and an FTJ element FJA. Note that the circuit MCs is sometimes referred to as a memory cell, for example.

The FTJ element FJA is a tunnel junction element including a pair of electrodes, a material that can have ferroelectricity, and an insulator functioning as a tunnel insulating film. The FTJ element has a function of changing its resistance value in accordance with the direction of polarization in the material that can have ferroelectricity.

The insulator is provided to overlap with the material that can have ferroelectricity, and the insulator and the material that can have ferroelectricity are provided between the pair of electrodes. The insulator functioning as a tunnel insulating film is provided to overlap with the material that can have ferroelectricity; thus, the FTJ element has rectifying properties. When the FTJ element has a structure in which one of the pair of electrodes, the insulator functioning as a tunnel insulating film, the material that can have ferroelectricity, and the other of the pair of electrodes are stacked in this order, for example, a forward direction of current flowing through the FTJ element is from the one of the pair of electrodes to the other of the pair of electrodes. Note that in this specification, the one of the pair of electrodes is referred to as an input terminal, and the other of the pair of electrodes is referred to as an output terminal.

The FTJ element described in this specification and the like can be formed by, for example, stacking a first conductor, a tunnel insulating film, a material that can have ferroelectricity, and a second conductor in this order over a flat insulating film or conductive film. Note that the first conductor can be rephrased as a lower electrode, and the second conductor can be rephrased as an upper electrode. In this case, the first conductor and the second conductor correspond to the above-described pair of electrodes; the first conductor (lower electrode) functions as an input terminal and the second conductor (upper electrode) functions as an output terminal, for example. As another example, the FTJ element described in this specification and the like may be formed by stacking the first conductor (lower electrode), the material that can have ferroelectricity, the tunnel insulating film, and the second conductor (upper electrode) in this order over the flat insulating film or conductive film. In this case, the first conductor (lower electrode) functions as an output terminal and the second conductor (upper electrode) functions as an input terminal, for example.

As the tunnel insulating film, for example, silicon oxide, silicon nitride, a stack of silicon oxide and silicon nitride, or the like can be used.

As described above, the resistance value of the FTJ element changes in accordance with the direction of polarization in the material that can have ferroelectricity. For example, when the direction of polarization in the material that can have ferroelectricity between the input terminal and the output terminal of the FTJ element is a direction from the output terminal to the input terminal (the direction of the polarization vector in this case is negative), the amount of current flowing from the input terminal to the output terminal of the FTJ element increases. Meanwhile, when the direction of polarization in the material that can have ferroelectricity between the input terminal and the output terminal of the FTJ element is a direction from the input terminal to the output terminal (the direction of the polarization vector in this case is positive), the amount of current flowing from the input terminal to the output terminal of the FTJ element decreases. That is, in the case where the direction of polarization in the FTJ element is the direction from the input terminal to the output terminal, the resistance value with respect to the current flowing from the input terminal to the output terminal of the FTJ element decreases. Meanwhile, in the case where the direction of polarization in the FTJ element is the direction from the output terminal to the input terminal, the resistance value with respect to the current flowing from the input terminal to the output terminal of the FTJ element increases.

Note that as a method for causing polarization (changing the direction of polarization) in the material that can have ferroelectricity in the FTJ element, for example, application of a high voltage between the input terminal and the output terminal of the FTJ element can be employed. For example, when a high-level potential is supplied to the input terminal side of the FTJ element and a low-level potential is supplied to the output terminal side, polarization in the material that can have ferroelectricity in the FTJ element is in the direction from the input terminal to the output terminal (positive direction), whereas when a low-level potential is supplied to the input terminal side of the FTJ element and a high-level potential is supplied to the output terminal side, polarization is in the direction from the output terminal to the input terminal (negative direction). Note that the FTJ element has hysteresis characteristics in the polarization intensity; thus, causing polarization (changing the direction of polarization) requires application of a voltage corresponding to the structure of the FTJ element, and a voltage lower than such a voltage does not cause polarization (change the direction of polarization) in the FTJ element.

Note that in drawings of this specification, an FTJ element is shown as an object in which an arrow is added to a circuit symbol of a diode. In addition, in drawings of this specification, a side of a triangle that corresponds to an anode of the circuit symbol of the diode connected to a wiring represents an input terminal of the FTJ element, and a vertex of the triangle and a line that correspond to a cathode of the circuit symbol of the diode connected to the wiring represent an output terminal of the FTJ element.

As the material that can have ferroelectricity, for example, hafnium oxide is preferably used. In the case where hafnium oxide is used as the material that can have ferroelectricity in the FTJ element, the thickness of the hafnium oxide (or the distance between the pair of electrodes of the FTJ element) is preferably less than or equal to 10 nm, further preferably less than or equal to nm, still further preferably less than or equal to 2 nm.

Examples of the material that can have ferroelectricity include, besides hafnium oxide, zirconium oxide, zirconium hafnium oxide (sometimes referred to as $HfZrO_X$ (X is a real number greater than 0) or HZO), a material in which an element J1 (the element J1 here is zirconium (Zr), silicon (Si), aluminum (Al), gadolinium (Gd), yttrium (Y), lanthanum (La), strontium (Sr), or the like) is added to hafnium oxide, and a material in which an element J2 (the element J2 here is hafnium (Hf), silicon (Si), aluminum (Al), gadolinium (Gd), yttrium (Y), lanthanum (La), strontium (Sr), or the like) is added to zirconium oxide. Alternatively, as the material that can have ferroelectricity, a piezoelectric ceramic having a perovskite structure, such as lead titanate (sometimes referred to as $PbTiO_X$), barium strontium titanate (BST), strontium titanate, lead zirconate titanate (PZT), strontium bismuth tantalate (SBT), bismuth ferrite (BFO), or barium titanate, may be used. Alternatively, the material that can have ferroelectricity can be a mixture or a compound containing a material selected from the above-listed materials, for example. Alternatively, the material that can have ferroelectricity can have a stacked-layer structure of a plurality of materials selected from the above-listed materials. Since hafnium oxide, zirconium oxide, zirconium hafnium oxide, the material in which the element J1 is added to hafnium oxide, and the like may change their crystal structures (characteristics) according to a variety of processes and the like as well as deposition conditions, the above-described materials are referred to not only as ferroelectrics but also as materials that can have ferroelectricity in this specification and the like.

In the case where zirconium hafnium oxide is used as the material that can have ferroelectricity, an atomic layer deposition (ALD) method, particularly a thermal ALD method, is preferably used for deposition. In the case where the material that can have ferroelectricity is deposited by a thermal ALD method, it is preferable to use a material that does not contain hydrocarbon (also referred to as HC) as a precursor. One or both of hydrogen and carbon contained in the material that can have ferroelectricity may hinder crystallization of the material that can have ferroelectricity. For this reason, it is preferable to lower the concentration of one or both of hydrogen and carbon in the material that can have ferroelectricity by using the precursor that does not contain hydrocarbon, as described above. An example of the precursor that does not contain hydrocarbon includes a chlorine-based material. Note that in the case where a material containing hafnium oxide and zirconium oxide (e.g., zirconium hafnium oxide) is used as the material that can have ferroelectricity, $HfCl_4$ and/or $ZrCl_4$ can be used as the precursor.

Note that in the case where a film using the material that can have ferroelectricity is deposited, an impurity in the film, which is at least one or more of hydrogen, hydrocarbon, and carbon here, is thoroughly removed, so that a highly purified intrinsic film that can have ferroelectricity can be formed. Note that manufacturing processes of the highly purified intrinsic film that can have ferroelectricity and a highly purified intrinsic oxide semiconductor described in the following embodiment are highly compatible with each other. Accordingly, a method for manufacturing a semiconductor device with high productivity can be provided.

In the case where zirconium hafnium oxide is used as the material that can have ferroelectricity, it is preferable to deposit hafnium oxide and zirconium oxide alternately by a thermal ALD method such that the ratio of hafnium oxide to zirconium oxide is 1:1.

In the case where the material that can have ferroelectricity is deposited by a thermal ALD method, $H_2O$ or $O_3$ can be used as an oxidizer. Note that the oxidizer used in the thermal ALD method is not limited thereto. For example, as the oxidizer used in the thermal ALD method, any one or more selected from $O_2$, $O_3$, $N_2O$, $NO_2$, $H_2O$, and $H_2O_2$ may be contained.

There is no particular limitation on the crystal structure of the material that can have ferroelectricity. For example, the crystal structure of the material that can have ferroelectricity is any one crystal structure selected from a cubic crystal structure, a tetragonal crystal structure, an orthorhombic crystal structure, and a monoclinic crystal structure or a composite structure including two or more of these crystal structures. It is particularly preferable that the material that can have ferroelectricity have an orthorhombic crystal structure, in which case ferroelectricity is exhibited. Alternatively, the material that can have ferroelectricity may have a composite structure of an amorphous structure and a crystal structure.

As the transistor M1, an OS transistor can be used, for example. As a metal oxide included in a channel formation region of the OS transistor, an oxide containing at least one of indium, gallium, and zinc is preferably included, for example. Alternatively, for example, the metal oxide may be an oxide containing at least one of indium, an element M (as the element M, for example, one kind or a plurality of kinds selected from aluminum, yttrium, copper, vanadium, beryllium, boron, titanium, iron, nickel, germanium, zirconium, molybdenum, lanthanum, cerium, neodymium, hafnium, tantalum, tungsten, magnesium, and the like can be given), and zinc. Further preferably, the transistor M1 has a structure of a transistor described in Embodiment 3.

Other than the OS transistor, a transistor containing silicon in a channel formation region (hereinafter referred to as a Si transistor) may be used as the transistor M1. The silicon may be amorphous silicon (sometimes referred to as hydrogenated amorphous silicon), microcrystalline silicon, polycrystalline silicon, single crystal silicon, or the like, for example.

Other than the OS transistor and the Si transistor, a transistor containing Ge or the like in a channel formation region, a transistor containing a compound semiconductor such as ZnSe, CdS, GaAs, InP, GaN, or SiGe in a channel formation region, a transistor containing a carbon nanotube in a channel formation region, a transistor containing an organic semiconductor in a channel formation region, or the like may be used as the transistor M1.

The transistor illustrated in FIG. 1A is, for example, a transistor having a structure including gates over and under a channel; the transistor M1 includes a first gate and a second gate. For convenience, for example, the first gate is referred to as a gate (sometimes referred to as a front gate) and the second gate is referred to as a back gate so that they are distinguished from each other; however, the first gate and the second gate can be interchanged with each other. Therefore, in this specification and the like, the term "gate" can be replaced with the term "back gate". Similarly, the term "back gate" can be replaced with the term "gate". As a specific example, a connection structure in which "a gate is electrically connected to a first wiring and a back gate is electrically connected to a second wiring" can be replaced with a connection structure in which "a back gate is electrically connected to a first wiring and a gate is electrically connected to a second wiring".

The circuit MCs in the semiconductor device of one embodiment of the present invention does not depend on the connection structure of a back gate of a transistor. In the transistor M1 illustrated in FIG. 1A, the back gate is illustrated and the connection structure of the back gate is not illustrated; however, a portion to which the back gate is electrically connected can be determined at the design stage. For example, in a transistor including a back gate, a gate and the back gate may be electrically connected to each other to increase the on-state current of the transistor. That is, the gate and the back gate of the transistor M1 may be electrically connected to each other, for example. Alternatively, for example, in a transistor including a back gate, a wiring electrically connected to an external circuit or the like may be provided and a fixed potential or a variable potential may be supplied to the back gate of the transistor by the external circuit or the like to change the threshold voltage of the transistor or to reduce the off-state current of the transistor. Note that the same applies to a transistor described in other parts of the specification and a transistor illustrated in other drawings, not only to that in FIG. 1A.

Figure 1B:
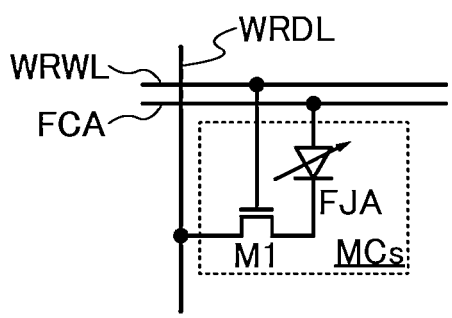

The circuit MCs in the semiconductor device of one embodiment of the present invention does not depend on the structure of a transistor included in the circuit MCs. For example, the transistor M1 illustrated in FIG. 1A may be a transistor having a structure not including a back gate, that is, a single-gate structure as illustrated in FIG. 1B. It is also possible that some transistors have a structure including a back gate and the other transistors have a structure not including a back gate. Note that the same applies to a transistor described in other parts of the specification and a transistor illustrated in other drawings, not only to that in FIG. 1A.

The transistor M1 is illustrated as an n-channel transistor in FIG. 1A as an example but may be a p-channel transistor depending on conditions or circumstances. In the case where an n-channel transistor is replaced with a p-channel transistor, a potential or the like input to the circuit MCs or the like needs to be appropriately changed so that the circuit MCs operates normally. In addition, a result output from the circuit MCs may be changed. Note that the same applies to a transistor described in other parts of the specification and a transistor illustrated in other drawings, not only to that in FIG. 1A. In this embodiment, the structure and operation of the circuit MCs are described assuming that the transistor M1 is an n-channel transistor.

In the circuit MCs in FIG. 1A, a first terminal of the transistor M1 is electrically connected to a wiring WRDL, and a gate of the transistor M1 is electrically connected to a wiring WRWL. An input terminal of the FTJ element FJA is electrically connected to a wiring FCA. An output terminal of the FTJ element FJA is electrically connected to a second terminal of the transistor M1.

The wiring WRDL functions as a wiring that transmits data written to the circuit MCs, for example. The wiring WRDL functions also as a wiring that transmits data read from the circuit MCs, for example. That is, the wiring WRDL functions as a write data line and a read data line.

The wiring WRWL functions as a wiring for selecting the circuit MCs to which data is written, for example. The wiring WRWL functions also as a wiring for selecting the circuit MCs from which retained data is read, for example. That is, the wiring WRWL functions as a write word line and a read word line.

The wiring FCA functions as a wiring that supplies a variable potential with which polarization occurs in the material that can have ferroelectricity in the FTJ element FJA when data is written to the circuit MCs, for example. The wiring FCA functions also as a wiring that supplies a potential with which polarization in the material that can have ferroelectricity does not change when data is read from the circuit MCs, for example.

Figure 1C:
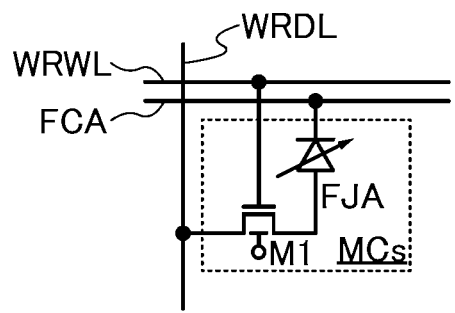

As an example of the circuit configuration of the circuit MCs provided in the memory device, which is the semiconductor device of one embodiment of the present invention, the input terminal and the output terminal of the FTJ element FJA in FIG. 1A may be interchanged with each other as illustrated in FIG. 1C. Specifically, in the circuit MCs in FIG. 1C, the output terminal of the FTJ element FJA is electrically connected to the wiring FCA, and the input terminal of the FTJ element FJA is electrically connected to the second terminal of the transistor M1.

Although a detailed operation example of the circuit MCs will be described later, applying an appropriate voltage between the input terminal and the output terminal of the FTJ element FJA makes a tunneling current flow between the input terminal and the output terminal of the FTJ element FJA. At this time, to prevent leakage of the tunneling current through the transistor M1, an OS transistor is preferably used as the transistor M1. Since the off-state current of the OS transistor is extremely low, leakage of the tunneling current, which flows through the FTJ element FJA, to the wiring WRDL side can be prevented in some cases.

Note that the amount of current flowing through the FTJ element changes depending on the thickness of the material that can have ferroelectricity and the overlapping area of the pair of electrodes between which the material that can have ferroelectricity is positioned. Table 1 shows estimation results of the current flowing through the FTJ element in the case where the material that can have ferroelectricity is HZO, for example.

TABLE 1

| HZO thickness | Electrode area | Current flowing through FTJ |
|---|---|---|
| 4 nm | 1 μm × 1 μm | 1 nA |
| 4 nm | 100 nm × 100 nm | 10 pA |
| 6 nm | 1 μm × 1 μm | 3 pA |
| 6 nm | 100 nm × 100 nm | 30 fA |
| 8 nm | 1 mmφ | 5 nA |
| 8 nm | 1 μm × 1 μm | 7 fA |
| 8 nm | 100 nm × 100 nm | 70 aA |

Operation Example

Next, a memory cell using the circuit MCs in FIG. 1A, an example of a data writing operation, and an example of a data reading operation will be described.

First, to describe an example of a data writing operation and an example of a data reading operation, a memory cell using the circuit MCs and peripheral circuits of the memory cell are described.

Figure 2:
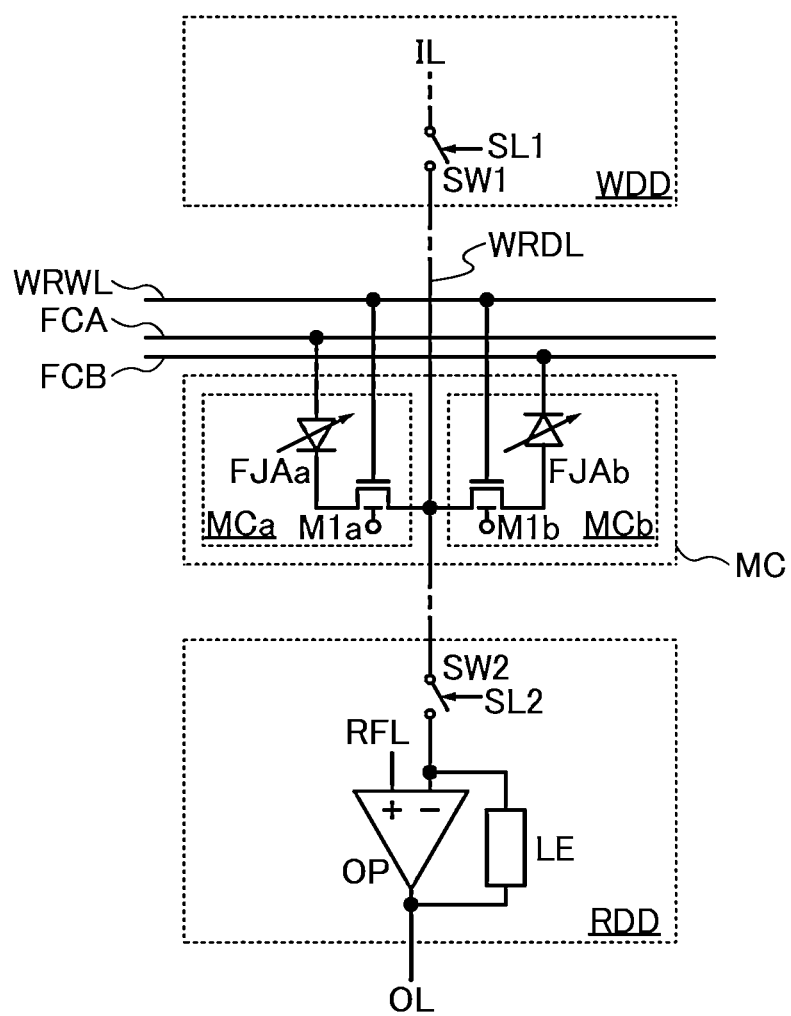
FIG. 2 is a circuit diagram illustrating a configuration example of a semiconductor device.

FIG. 2 is a circuit diagram illustrating a memory cell MC, and a circuit WDD and a circuit RDD that are peripheral circuits of the memory cell MC.

The memory cell MC includes a circuit MCa and a circuit MCb, for example. In FIG. 2, as an example, the circuit MCs in FIG. 1A is used as the circuit MCa and the circuit MCs in FIG. 1C is used as the circuit MCb.

In FIG. 2, the circuit MCa includes a transistor M1a and an FTJ element FJAa. The transistor M1a corresponds to the transistor M1 in the circuit MCs in FIG. 1A, and the FTJ element FJAa corresponds to the FTJ element FJA in the circuit MCs in FIG. 1A. Moreover, in FIG. 2, the circuit MCb includes a transistor M1b and an FTJ element FJAb. The transistor M1b corresponds to the transistor M1 in the circuit MCs in FIG. 1C, and the FTJ element FJAb corresponds to the FTJ element FJA in the circuit MCs in FIG. 1C.

In FIG. 2, an input terminal of the FTJ element FJAa is electrically connected to the wiring FCA, and an output terminal of the FTJ element FJAb is electrically connected to a wiring FCB. A gate of the transistor M1a and a gate of the transistor M1b are electrically connected to the wiring WRWL. A first terminal of the transistor M1a and a first terminal of the transistor M1b are electrically connected to the wiring WRDL.

Like the wiring FCA, the wiring FCB functions as a wiring that supplies a variable potential with which polarization occurs in the material that can have ferroelectricity in the FTJ element FJAb when data is written to the circuit MCb, for example. The wiring FCB functions also as a wiring that supplies a potential with which polarization in the dielectric does not change when data is read from the circuit MCb, for example.

The circuit WDD functions as a write data line driver circuit for the memory cell MC, for example. The circuit WDD includes a switch SW1, for example. Note that FIG. 2 only illustrates the switch SW1, a wiring IL, and a wiring SL1 in the circuit WDD.

The circuit RDD functions as a read circuit for the memory cell MC, for example. The circuit RDD includes a switch SW2, an operational amplifier OP, and a load LE, for example. Note that FIG. 2 only illustrates the switch SW2, the operational amplifier OP, the load LE, a wiring SL2, and a wiring RFL in the circuit RDD.

As the switch SW1 and the switch SW2, an electrical switch such as an analog switch or a transistor can be used, for example. When a transistor is used as the switch SW1 and the switch SW2, for example, the transistor can be a transistor having a structure similar to that of the transistor M1 (the transistor M1a or the transistor M1b). Other than the electrical switch, a mechanical switch may be used. In this specification and the like, each of the switch SW1 and the switch SW2 is turned on when a high-level potential is input to its control terminal and is turned off when a low-level potential is input to the control terminal.

As the load LE, for example, a resistor, a transistor, or the like can be used. In particular, with the use of a resistor or the like as the load LE, a current-voltage converter circuit can be formed of the load LE and the operational amplifier OP. Alternatively, a capacitor can be used as the load LE. In particular, with the use of a capacitor or the like as the load LE, an integrator circuit can be formed of the load LE and the operational amplifier OP.

A first terminal of the switch SW1 is electrically connected to the wiring WRDL, and a second terminal of the switch SW1 is electrically connected to the wiring IL. The control terminal of the switch SW1 is electrically connected to the wiring SL1.

A first terminal of the switch SW2 is electrically connected to the wiring WRDL, and a second terminal of the switch SW2 is electrically connected to an inverting input terminal of the operational amplifier OP and a first terminal of the load LE. An output terminal of the operational amplifier OP is electrically connected to a second terminal of the load LE and a wiring OL. A non-inverting input terminal of the operational amplifier OP is electrically connected to the wiring RFL.

The wiring IL is electrically connected to an internal circuit (not illustrated) included in the circuit WDD. The internal circuit has a function of generating data for writing and a function of transmitting the data from the internal circuit to the memory cell MC through the wiring IL, the switch SW1, and the wiring WRDL, for example.

The wiring SL1 functions as a wiring for switching the on state and the off state of the switch SW1, for example. Accordingly, the wiring SL1 is supplied with a high-level potential or a low-level potential, for example.

The wiring SL2 functions as a wiring for switching the on state and the off state of the switch SW2, for example. Accordingly, the wiring SL2 is supplied with a high-level potential or a low-level potential, for example.

The wiring RFL functions as a wiring that supplies a constant voltage, for example. The constant voltage can be, for example, a reference potential to be input to the non-inverting input terminal of the operational amplifier OP.

The wiring OL functions as a wiring that transmits a potential corresponding to data read from the memory cell MC, for example.

An operation of writing data to the memory cell MC and an operation of reading data from the memory cell MC will be described using the circuits illustrated in FIG. 2.

Operation Example 1 of Data Writing

Figure 3:
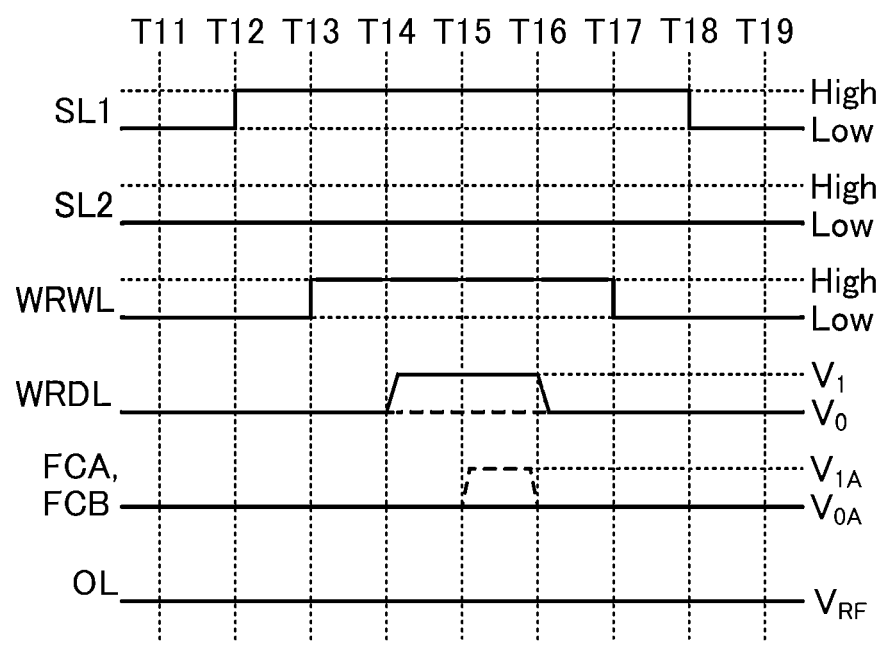
FIG. 3 is a timing chart showing an operation example of a memory cell of a semiconductor device.

FIG. 3 is a timing chart showing an example of the operation of writing data to the memory cell MC in the circuit configuration in FIG. 2. The timing chart in FIG. 3 shows changes in potentials of the wiring SL1, the wiring SL2, the wiring WRWL, the wiring WRDL, the wiring FCA, the wiring FCB, and the wiring OL in a period from Time T11 to Time T19 and around the period.

Note that in this operation example, the wiring FCA and the wiring FCB are supplied with the same potential. Therefore, a potential change of the wiring FCA and a potential change of the wiring FCB are collectively shown in the timing chart of FIG. 3.

A potential supplied from the wiring RFL is $V_{RF}$, for example. $V_{RF}$ may be a fixed potential or a variable potential, for example. Note that $V_{RF}$ in this operation example is a given fixed potential.

The load LE included in the circuit RDD is a resistor, for example.

Changes in the potentials of the wiring WRDL after Time T14 and the wiring FCA and the wiring FCB after Time T15 are shown by a solid line and a broken line in the timing chart of FIG. 3. The potential change shown by the solid line represents a voltage change in the case where $V_0$ is written to the memory cell MC in this writing operation. The potential change shown by the broken line represents a voltage change in the case where $V_1$ is written to the memory cell MC in this writing operation. Note that $V_0$ and $V_1$ will be described later.

[From Time T11 to Time T12]

In the period from Time T11 to Time T12, the potentials of the wiring SL1 and the wiring SL2 are each a low-level potential (denoted as Low in FIG. 3). Thus, the low-level potential is input to the control terminals of the switch SW1 and the switch SW2, so that the switch SW1 and the switch SW2 are in the off state.

Since the switch SW1 is in the off state, data to be written to the memory cell MC is not transmitted to the wiring WRDL from the internal circuit in the circuit WDD. The potential of the wiring WRDL in the period from Time T11 to Time T12 is, for example, $V_0$. Note that $V_0$ will be described later. $V_0$ may be a ground potential, for example.

In the period from Time T11 to Time T12, a low-level potential is input to the wiring WRWL. Thus, the low-level potential is input to the gates of the transistor M1a and the transistor M1b. Accordingly, the transistor M1a and the transistor M1b are in the off state.

Potentials supplied from the wiring FCA and the wiring FCB are $V_{OA}$. For example, $V_{OA}$ can be a reference potential or an approximate value of the reference potential. A reference potential $V_C$ is preferably 0 [V] or a ground potential, for example. Given that the reference potential is $V_C$, for example, the approximate value of the reference potential is preferably a potential higher than or equal to $V_C$−0.1 [V], higher than or equal to $V_C$−0.05 [V], or higher than or equal to $V_C$−0.01 [V] and lower than or equal to $V_C$+0.01 [V], lower than or equal to $V_C$+0.05 [V], or lower than or equal to $V_C$+0.1 [V]. Note that the above-described lower limits and upper limits can be combined with each other.

Since the switch SW2 is in the off state in the period from Time T11 to Time T12, the operational amplifier OP with the above connection structure functions as a voltage follower. Thus, the potential $V_{RF}$ is output to the output terminal of the operational amplifier OP; as a result, the potential $V_{RF}$ is output from the wiring OL.

[From Time T12 to Time T13]

In the period from Time T12 to Time T13, a high-level potential (denoted as High in FIG. 3) is supplied to the wiring SL1. Thus, the high-level potential is input to the control terminal of the switch SW1, so that the switch SW1 is turned on.

In this operation example, in the period from Time T12 to Time T13, data to be written to the memory cell MC is not transmitted to the wiring WRDL from the internal circuit in the circuit WDD. In this operation example, in the period from Time T12 to Time T13, an initialization potential may be supplied to the wiring WRDL from the internal circuit in the circuit WDD. The initialization potential can be a ground potential, the potential $V_0$, or the like. Note that in this operation example, $V_0$ is supplied as the initialization potential.

[From Time T13 to Time T14]

In the period from Time T13 to Time T14, a potential supplied from the wiring WRWL changes from a low-level potential to a high-level potential. Thus, the high-level potential is input to the gates of the transistor M1a and the transistor M1b, so that the transistor M1a and the transistor M1b are turned on. That is, electrical continuity is established between the wiring WRDL and an output terminal of the FTJ element FJAa, and electrical continuity is established between the wiring WRDL and an input terminal of the FTJ element FJAb. Accordingly, an initialization potential is supplied from the wiring WRDL to the output terminal of the FTJ element FJAa and the input terminal of the FTJ element FJAb. In this operation example, the potentials of the output terminal of the FTJ element FJAa and the input terminal of the FTJ element FJAb become $V_0$.

[From Time T14 to Time T15]

In the period from Time T14 to Time T15, data to be written to the memory cell MC is transmitted to the wiring WRDL from the internal circuit in the circuit WDD. Specifically, for example, as a potential corresponding to the data, $V_0$ or $V_1$ is supplied to the wiring WRDL from the internal circuit. The transistor M1a and the transistor M1b are in the on state since before Time T14; thus, $V_0$ or $V_1$ is supplied from the wiring WRDL to the output terminal of the FTJ element FJAa and the input terminal of the FTJ element FJAb. Accordingly, the potentials of the output terminal of the FTJ element FJAa and the input terminal of the FTJ element FJAb become $V_0$ or $V_1$.

Note that $V_0$ and $V_1$ are potentials representing binary data (digital values). For example, $V_0$ can be a potential representing one of "0" and "1", and $V_1$ can be a potential representing the other of "0" and "1". In this operation example, the description is made assuming that $V_0$ is the potential representing "0" and $V_1$ is the potential representing "1". Furthermore, the levels of $V_0$ and $V_1$ can be set such that $V_1-V_0$ is a voltage with which polarization occurs or the direction of polarization is rewritten in the FTJ element FJAa and the FTJ element FJAb. For example, in the case where the voltage with which polarization occurs (the direction of polarization changes) in the FTJ element FJAa and the FTJ element FJAb is 3 V, $V_1$ and $V_0$ are set such that $V_1-V_0$ is higher than or equal to 3 V. Note that $V_0$ is preferably equal to the potential $V_{OA}$, for example. Specifically, $V_0$ is 0 V and $V_1$ is 3 V, for example. Although writing and reading of binary data are described in this operation example, the memory cell MC can sometimes perform writing and/or reading of multilevel data or an analog potential, for example.

[From Time T15 to Time T16]

In the period from Time T15 to Time T16, a potential corresponding to the data, which has been transmitted to the memory cell MC from the internal circuit of the circuit WDD through the wiring WRDL in the period from Time T14 to Time T15, is input to the wiring FCA and the wiring FCB. For example, when a potential corresponding to the data, which has been transmitted to the memory cell MC from the internal circuit of the circuit WDD through the wiring WRDL in the period from Time T14 to Time T15, is $V_0$, $V_{1A}$ is input to the wiring FCA and the wiring FCB. As another example, when a potential corresponding to the data, which has been transmitted to the memory cell MC from the internal circuit of the circuit WDD through the wiring WRDL in the period from Time T14 to Time T15, is $V_1$, $V_{OA}$ is input to the wiring FCA and the wiring FCB.

For example, $V_{1A}$ is a potential higher than $V_{OA}$. $V_{1A}$ is set to a potential with which polarization occurs (the direction of polarization changes) in the FTJ element FJAa when the output terminal of the FTJ element FJAa is at $V_0$. In this case, the direction of the polarization is from the input terminal to the output terminal of the FTJ element FJAa (the positive direction). Moreover, $V_{1A}$ is set to a potential with which polarization occurs (the direction of polarization changes) in the FTJ element FJAb when the input terminal of the FTJ element FJAb is at $V_0$. In this case, the direction of the polarization is from the output terminal to the input terminal of the FTJ element FJAb (the negative direction).

Note that in this operation example, $V_{1A}$ is preferably equal to $V_1$, for example.

First, attention is focused on the FTJ element FJAa. When the potential of the output terminal of the FTJ element FJAa is $V_0$, the potential of the input terminal of the FTJ element FJAa (the wiring FCA) is Via; thus, the dielectric with ferroelectricity included in the FTJ element FJAa is polarized in a direction from the input terminal (the wiring FCA) to the output terminal (the positive direction). On the other hand, when the potential of the output terminal of the FTJ element FJAa is $V_1$, the potential of the input terminal of the FTJ element FJAa (the wiring FCA) is $V_{OA}$; thus, the dielectric with ferroelectricity included in the FTJ element FJAa is polarized in a direction from the output terminal to the input terminal (the wiring FCA) (the negative direction).

Next, attention is focused on the FTJ element FJAb. When the potential of the input terminal of the FTJ element FJAb is $V_0$, the potential of the output terminal of the FTJ element FJAb (the wiring FCB) is Via; thus, the dielectric with ferroelectricity included in the FTJ element FJAb is polarized in a direction from the output terminal (the wiring FCB) to the input terminal (the negative direction). On the other hand, when the potential of the input terminal of the FTJ element FJAb is $V_1$, the potential of the output terminal of the FTJ element FJAb (the wiring FCB) is $V_{OA}$; thus, the dielectric with ferroelectricity included in the FTJ element FJAb is polarized in a direction from the input terminal to the output terminal (the wiring FCB) (the positive direction).

In other words, the direction of polarization in each of the FTJ element FJAa and the FTJ element FJAb is determined in accordance with the data ($V_0$ or $V_1$) written to the memory cell MC in the period from Time T15 to Time T16, as shown in the following table.

TABLE 2

| Potential written from wiring WRDL | Direction of polarization in FTJ element FJAa | Direction of polarization in FTJ element FJAb |
| --- | --- | --- |
| V0 | Direction from input terminal (wiring FCA) to output terminal | Direction from output terminal (wiring FCB) to input terminal |

TABLE 2-continued

| Potential written from wiring WRDL | Direction of polarization in FTJ element FJAa | Direction of polarization in FTJ element FJAb |
|---|---|---|
| V1 | (Positive direction) Direction from output terminal to input terminal (wiring FCA) (Negative direction) | (Negative direction) Direction from input terminal to output terminal (wiring FCB) (Positive direction) |

Note that after Time T16, the potentials supplied from the wiring FCA and the wiring FCB are $V_{OA}$. That is, the potentials supplied from the wiring FCA and the wiring FCB after Time T16 are the same as the potentials supplied from the wiring FCA and the wiring FCB before Time T15.

[From Time T16 to Time T17]

In the period from Time T16 to Time T17, transmission of data to be written to the memory cell MC to the wiring WRDL from the internal circuit in the circuit WDD is finished. Specifically, for example, an initialization potential is supplied to the wiring WRDL from the internal circuit in the circuit WDD. Note that in this operation example, $V_0$ is supplied as the initialization potential.

The transistor M1 is in the on state since before Time T16; thus, the initialization potential from the wiring WRDL is supplied to the output terminal of the FTJ element FJAa and the input terminal of the FTJ element FJAb. Accordingly, in this operation example, the potentials of the output terminal of the FTJ element FJAa and the input terminal of the FTJ element FJAb become $V_0$. Note that even when the potentials of the output terminal of the FTJ element FJAa and the input terminal of the FTJ element FJAb become the initialization potential, the direction of polarization written to each of the FTJ element FJAa and the FTJ element FJAb in the period from Time T15 to Time T16 does not change. That is, the data retained in the memory cell MC is kept without destruction.

[From Time T17 to Time T18]

In the period from Time T17 to Time T18, the potential of the wiring WRWL changes from a high-level potential to a low-level potential. Thus, the low-level potential is input to the gates of the transistor M1a and the transistor M1b, so that the transistor M1a and the transistor M1b are turned off.

[From Time T18 to Time T19]

In the period from Time T18 to Time T19, the potential of the wiring SL1 changes from a high-level potential to a low-level potential. Thus, the low-level potential is input to the control terminal of the switch SW1, so that the switch SW1 is turned off.

Accordingly, in the period from Time T18 to Time T19, electrical continuity between the wiring WRDL and the internal circuit in the circuit WDD broken, so that a potential is not supplied to the wiring WRDL from the internal circuit in the circuit WDD.

By the operation in the period from Time T11 to Time T19, data can be written to the memory cell MC in FIG. 2.

Operation Example of Data Writing

Figure 4:
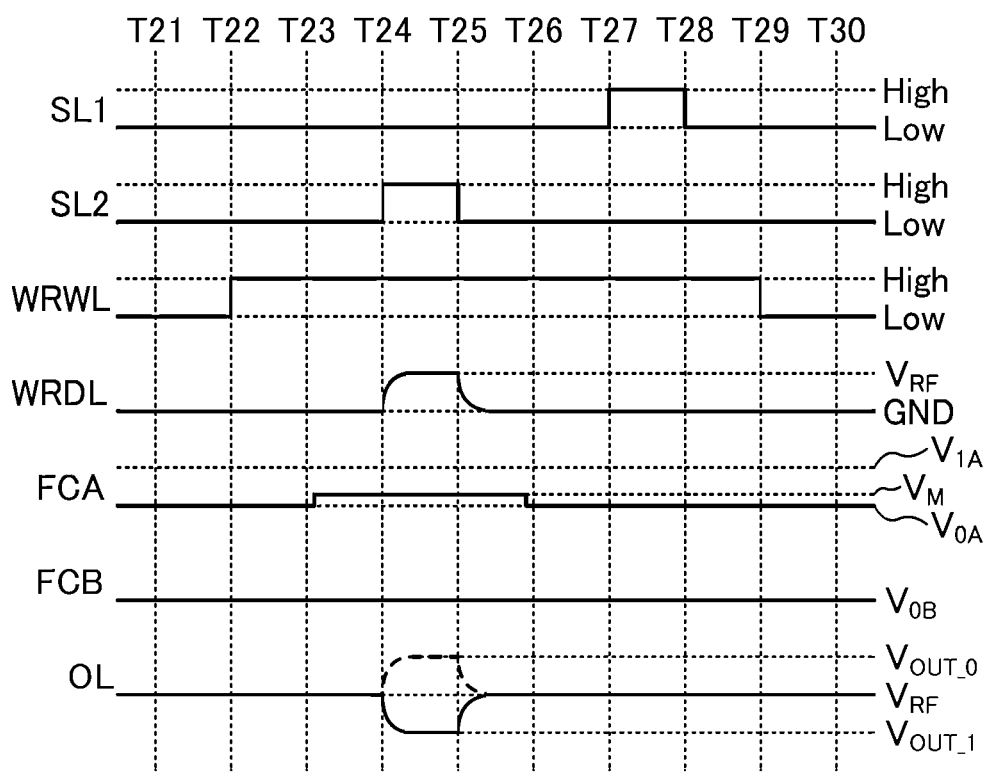
FIG. 4 is a timing chart showing an operation example of a memory cell of a semiconductor device.

FIG. 4 is a timing chart showing an example of the operation of reading data from the memory cell MC in the circuit configuration in FIG. 2. The timing chart in FIG. 4 shows changes in the potentials of the wiring SL1, the wiring SL2, the wiring WRWL, the wiring WRDL, the wiring FCA, the wiring FCB, and the wiring OL in a period from Time T21 to Time T30 and around the period.

A potential supplied from the wiring RFL is $V_{RF}$, for example. $V_{RF}$ may be a fixed potential or a variable potential, for example. Note that in this operation example, $V_{RF}$ is $(V_M+V_{OB})/2$, and the potential $V_M$ and the potential $V_{OB}$ will be described later.

The load LE included in the circuit RDD is a resistor, for example.

Changes in the potential of the wiring OL after Time T24 are shown by a solid line and a broken line in the timing chart of FIG. 4. The potential change shown by the solid line represents a voltage change in the case where $V_0$ is written to the memory cell MC in the writing operation in the timing chart of FIG. 3. The potential change shown by the broken line represents a voltage change in the case where $V_1$ is written to the memory cell MC in the writing operation in the timing chart of FIG. 3.

[From Time T21 to Time T22]

In the period from Time T21 to Time T22, the potentials of the wiring SL1 and the wiring SL2 are each a low-level potential (denoted as Low in FIG. 4). Thus, the low-level potential is input to the control terminals of the switch SW1 and the switch SW2, so that the switch SW1 and the switch SW2 are in the off state.

Since the switch SW1 is in the off state, electrical continuity is not established between the wiring WRDL and the internal circuit in the circuit WDD. The potential of the wiring WRDL in the period from Time T21 to Time T22 is, for example, a ground potential (denoted as GND in FIG. 4). Note that the ground potential in this operation example is preferably 0 V.

In the period from Time T21 to Time T22, a low-level potential is input to the wiring WRWL. Thus, the low-level potential is input to the gates of the transistor M1a and the transistor M1b. Accordingly, the transistor M1a and the transistor M1b are in the off state.

In the period from Time T21 to Time T22, a potential supplied from the wiring FCA is $V_{OA}$, which is the same as the potential supplied from the wiring FCA in the period from Time T11 to Time T12. A potential supplied from the wiring FCB is $V_{OB}$. Note that like $V_{OA}$, $V_{OB}$ can be a reference potential or an approximate value of the reference potential. The description of $V_{OA}$ is referred to for the reference potential or an approximate value of the reference potential.

According to the operation in the timing chart in FIG. 3, the potential $V_{RF}$ is output to the wiring OL in the period from Time T21 to Time T22.

[From Time T22 to Time T23]

In the period from Time T22 to Time T23, a potential supplied from the wiring WRWL changes from a low-level potential to a high-level potential (denoted as High in FIG. 4). Thus, the high-level potential is input to the gates of the transistor M1a and the transistor M1b, so that the transistor M1a and the transistor M1b are turned on.

At this time, electrical continuity is established between the wiring WRDL and the output terminal of the FTJ element FJAa and electrical continuity is established between the wiring WRDL and the input terminal of the FTJ element FJAb; hence, the wiring WRDL, the output terminal of the FTJ element FJAa, and the input terminal of the FTJ element FJAb have the same potential. Here, the wiring WRDL, the output terminal of the FTJ element FJAa, and the input terminal of the FTJ element FJAb have a ground potential.

[From Time T23 to Time T24]

In the period from Time T23 to Time T24, the potential $V_M$ is supplied to the wiring FCA, and the potential $V_{OB}$ is supplied to the wiring FCB. $V_M$ is a potential higher than $V_{OA}$ and $V_{OB}$ and lower than Via. Moreover, $V_M$ is set to a potential with which a polarization change does not occur (the direction of polarization does not change) in the FTJ element FJAa when the potential of the output terminal of the FTJ element FJAa is a ground potential.

[From Time T24 to Time T25]

In the period from Time T24 to Time T25, a high-level potential is supplied to the wiring SL2. Thus, the high-level potential is input to the control terminal of the switch SW2, so that the switch SW2 is turned on.

Accordingly, electrical continuity is established between the wiring WRDL and each of the inverting input terminal of the operational amplifier OP and the first terminal of the load LE in the circuit RDD. The load LE is a resistor and the operational amplifier OP has a negative feedback configuration; thus, the load LE and the operational amplifier OP function as a current-voltage converter circuit in which the wiring WRDL serves as an input wiring. Since the operational amplifier OP has the negative feedback configuration, the inverting input terminal and the non-inverting input terminal of the operational amplifier OP are virtually short-circuited and the potential of the wiring WRDL becomes $V_{RF}$.

The transistor M1 is in the on state at this time; thus, the potentials of the output terminal of the FTJ element FJAa and the input terminal of the FTJ element FJAb, each of which has electrical continuity with the wiring WRDL, also become $V_{RF}$.

Accordingly, a voltage applied to the input terminal of the FTJ element FJAa (the wiring FCA) and the output terminal thereof becomes $V_M - V_{RF}$ ($=V_{FJA}$), and a voltage applied to the input terminal of the FTJ element FJAb (the wiring FCB) and the output terminal thereof becomes $V_{RF} - V_{OB}$ ($=V_{FJB}$). Note that when the voltages of the input terminal and the output terminal of the FTJ element FJAa are $V_M - V_{RF}$ ($=V_{FJA}$), a polarization change does not occur (the direction of polarization is not changed) in the FTJ element FJAa. When the voltages of the input terminal and the output terminal of the FTJ element FJAb are $V_{RF} - V_{OB}$ ($=V_{FJB}$), a polarization change does not occur (the direction of polarization is not changed) in the FTJ element FJAb.

When the direction of polarization in the FTJ element FJAa is from the input terminal (the wiring FCA) to the output terminal (the positive direction), the resistance value of the FTJ element FJA becomes higher, whereas when the direction of polarization is from the output terminal to the input terminal (the wiring FCA) (the negative direction), the resistance value of the FTJ element FJAa becomes lower. The voltage $V_{FJA}$ between the input terminal and the output terminal of the FTJ element FJAa is constant; thus, the amount of current flowing from the input terminal to the output terminal of the FTJ element FJAa (defined as $I_A$) is determined when the direction of polarization in the FTJ element FJAa is determined. Specifically, $I_A$ becomes smaller when the direction of polarization in the FTJ element FJAa is from the input terminal (the wiring FCA) to the output terminal (the positive direction), whereas $I_A$ becomes larger when the direction of polarization is from the output terminal to the input terminal (the wiring FCA) (the negative direction).

Similarly, when the direction of polarization in the FTJ element FJAb is from the input terminal to the output terminal (the wiring FCB) (the positive direction), the resistance value of the FTJ element FJAb becomes higher, whereas when the direction of polarization is from the output terminal (the wiring FCB) to the input terminal (the negative direction), the resistance value of the FTJ element FJAb becomes lower. The voltage between the input terminal and the output terminal of the FTJ element FJAb is $V_{FJB}$, which is constant; thus, the amount of current flowing from the input terminal to the output terminal of the FTJ element FJAb (defined as $I_B$) is determined when the direction of polarization in the FTJ element FJAb is determined. Specifically, $I_B$ becomes smaller when the direction of polarization in the FTJ element FJAb is from the input terminal to the output terminal (the wiring FCB) (the positive direction), whereas $I_B$ becomes larger when the direction of polarization is from the output terminal (the wiring FCB) to the input terminal (the negative direction).

Here, for example, given that a potential written to the memory cell MC is $V_0$ in the operation example in the timing chart of FIG. 3, $I_A$ becomes smaller because the direction of polarization in the FTJ element FJAa is from the input terminal (the wiring FCA) to the output terminal (the positive direction), and $I_B$ becomes larger because the direction of polarization in the FTJ element FJAb is from the output terminal (the wiring FCB) to the input terminal (the negative direction). That is, $I_A$ becomes smaller than $I_B$; thus, a differential current $|I_A - I_B|$ flows from the circuit RDD to the wiring WRDL. The differential current flows in the direction from the output terminal of the operational amplifier OP in the circuit RDD to the wiring WRDL through the load LE and the switch SW2; hence, in the current-voltage converter circuit including the operational amplifier OP and the load LE, the potential of the output terminal of the operational amplifier OP becomes a potential higher than the potential $V_{RF}$ (here, $V_{OUT\_0}$). Accordingly, $V_{OUT\_0}$ is output from the wiring OL.

As another example, given that the potential written to the memory cell MC is $V_1$ in the operation example in the timing chart of FIG. 3, $I_A$ becomes larger because the direction of polarization in the FTJ element FJAa is from the output terminal to the input terminal (the wiring FCA) (the negative direction), and $I_B$ becomes smaller because the direction of polarization in the FTJ element FJAb is from the input terminal to the output terminal (the wiring FCB) (the positive direction). That is, $I_A$ becomes larger than $I_B$; thus, the differential current $|I_A - I_B|$ flows from the wiring WRDL to the circuit RDD. The differential current flows from the wiring WRDL to the output terminal of the operational amplifier OP in the circuit RDD through the switch SW2 and the load LE; hence, in the current-voltage converter circuit including the operational amplifier OP and the load LE, the potential of the output terminal of the operational amplifier OP becomes a potential lower than the potential $V_{RF}$ (here, $V_{OUT\_1}$). Accordingly, $V_{OUT\_1}$ is output from the wiring OL.

Thus, the data retained in the memory cell MC can be read by obtaining the potential of the wiring OL.

[From Time T25 to Time T26]

In the period from Time T25 to Time T26, a low-level potential is supplied to the wiring SL2. Thus, the low-level potential is input to the control terminal of the switch SW2, so that the switch SW2 is turned off.

Accordingly, electrical continuity between the wiring WRDL and each of the inverting input terminal of the operational amplifier OP and the first terminal of the load LE in the circuit RDD is broken. Therefore, supply of the potential between the inverting input terminal and the non-inverting input terminal, which are virtually short-circuited, of the operational amplifier OP to the wiring WRDL stops, so that the potential of the wiring WRDL decreases from $V_{RF}$. Note that in this operation example, the potential of the wiring WRDL decreases to a ground potential. Furthermore, in a period from Time T27 to Time T28 described later, an operation is performed in which the potentials of the wiring WRDL, the output terminal of the FTJ element FJAa, and the input terminal of the FTJ element FJAb are set at a ground potential; thus, in the period from Time T25 to Time T26, it is not necessary to wait until the potentials of the wiring WRDL, the output terminal of the FTJ element FJAa, and the input terminal of the FTJ element FJAb decrease to a ground potential.

Since the switch SW2 is in the off state, the operational amplifier OP with the above connection structure functions as a voltage follower. Thus, the potential $V_{RF}$ is output to the output terminal of the operational amplifier OP; as a result, the potential $V_{RF}$ is output from the wiring OL.

[From Time T26 to Time T27]

In the period from Time T26 to Time T27, the potential $V_{OA}$ is supplied to the wiring FCA and the potential $V_{OB}$ is supplied to the wiring FCB. That is, the potentials supplied from the wiring FCA and the wiring FCB after Time T26 are the same as the potentials supplied from the wiring FCA and the wiring FCB before Time T23.

[From Time T27 to Time T28]

In the period from Time T27 to Time T28, a high-level potential is supplied to the wiring SL1. Thus, the high-level potential is input to the control terminal of the switch SW1, so that the switch SW1 is turned on.

In the period from Time T27 to Time T28 in this operation example, data to be written to the memory cell MC is not transmitted to the wiring WRDL from the internal circuit in the circuit WDD. Instead, for example, a ground potential is supplied to the wiring WRDL from the internal circuit in the circuit WDD.

The transistor M1 is in the on state at this time; thus, the potentials of the output terminal of the FTJ element FJAa and the input terminal of the FTJ element FJAb, each of which has electrical continuity with the wiring WRDL, become a ground potential. Since the potential of the wiring FCA is $V_{OA}$ and the potential of the wiring FCB is $V_{OB}$, the direction of polarization written to each of the FTJ element FJAa and the FTJ element FJAb does not change even when the potentials of the output terminal of the FTJ element FJAa and the input terminal of the FTJ element FJAb become a ground potential. That is, the memory cell MC can retain the data without destruction.

[From Time T28 to Time T29]

In the period from Time T28 to Time T29, a low-level potential is supplied to the wiring SL1. Thus, the low-level potential is input to the control terminal of the switch SW1, so that the switch SW1 is turned off.

[From Time T29 to Time T30]

In the period from Time T29 to Time T30, a low-level potential is supplied to the wiring WRWL. Thus, the low-level potential is input to the gates of the transistor M1a and the transistor M1b, so that the transistor M1a and the transistor M1b are turned off.

With the above-described operation example in the period from Time T21 to Time T30, the data written to the memory cell MC in FIG. 2 can be read. The direction of polarization in each of the FTJ element FJAa and the FTJ element FJAb does not change when the data is read from the memory cell MC in FIG. 2; thus, destructive reading is not performed in Operation example of data reading described above. That is, the data can be read from the memory cell MC while the data written to the memory cell MC is retained.

Operation Example 2 of Data Writing

Although the operation of writing binary data (a digital value) to the memory cell MC is described in Operation example 1 of data writing above, a method for writing data to the memory cell MC, which is different from that in the operation example in the timing chart shown in FIG. 3, enables third-level data to be written to the memory cell MC. That is, writing and reading of ternary data can be performed in the memory cell MC.

Figure 5A:
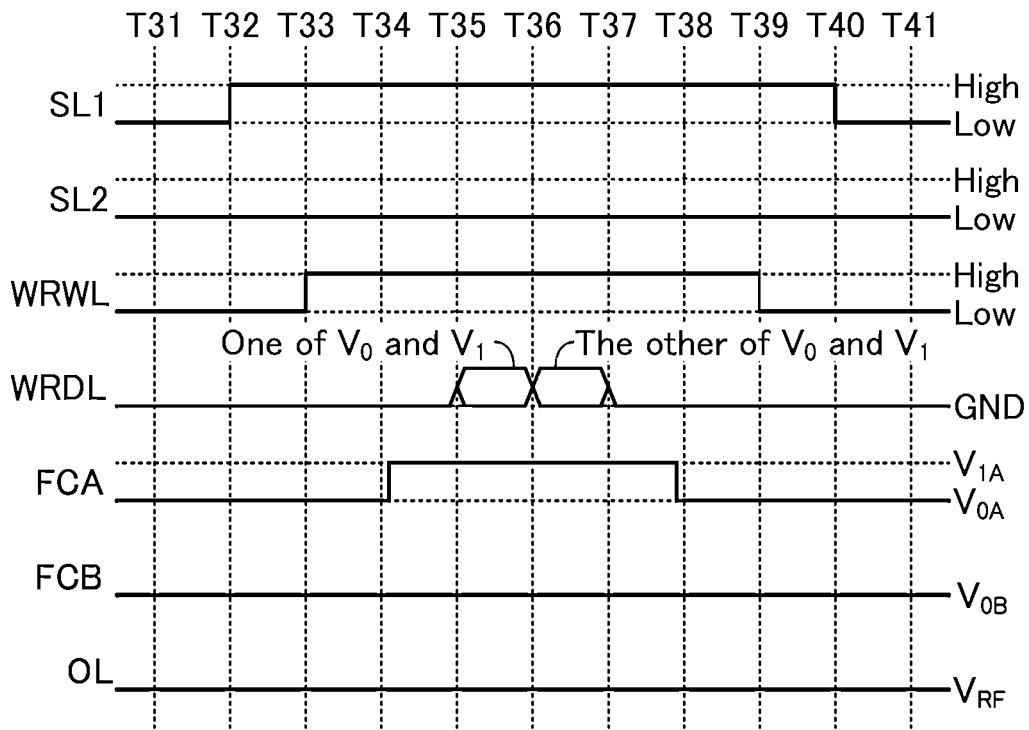
FIG. 5A and FIG. 5B are timing charts showing operation examples of a memory cell of a semiconductor device.

A timing chart shown in FIG. 5A is an example of an operation method for writing third-level data to the memory cell MC, which is different from the operation example in the timing chart shown in FIG. 3. The timing chart in FIG. 5A shows changes in the potentials of the wiring SL1, the wiring SL2, the wiring WRWL, the wiring WRDL, the wiring FCA, the wiring FCB, and the wiring OL in a period from Time T31 to Time T41 and around the period.

A potential supplied from the wiring RFL is $V_{RF}$, for example, as in the operation of the timing chart in FIG. 3. $V_{RF}$ may be a fixed potential or a variable potential, for example. Note that $V_{RF}$ in this operation example is a given fixed potential.

The load LE included in the circuit RDD is a resistor, for example, as in the operation of the timing chart in FIG. 3.

[From Time T31 to Time T34]

An operation in the period from Time T31 to Time T34 is similar to the operation from Time T11 to Time T14 in the timing chart in FIG. 3. Thus, refer to the description of the operation from Time T11 to Time T14 in the timing chart in FIG. 3 for the operation in the period from Time T31 to Time T34 in this operation example.

[From Time T34 to Time T35]

In the period from Time T34 to Time T35, the potential $V_{1A}$ is supplied to the wiring FCA and the potential $V_{0B}$ is supplied to the wiring FCB. $V_{1A}$ is a potential higher than $V_{0A}$, for example, as in the writing operation in the timing chart in FIG. 3.

Note that in this operation example, $V_{1A}$ is preferably equal to $V_1$, for example.

Accordingly, $V_{1A}$ is set to a potential with which polarization occurs in the FTJ element FJAa when the output terminal of the FTJ element FJAa is at $V_0$. In this case, the direction of the polarization is from the input terminal to the output terminal of the FTJ element FJAa (the positive direction).

[From Time T35 to Time T36]

In the period from Time T35 to Time T36, data to be written to the memory cell MC is transmitted to the wiring WRDL from the internal circuit in the circuit WDD. Specifically, for example, as a potential corresponding to the data, one of $V_0$ and $V_1$ is supplied to the wiring WRDL from the internal circuit. The transistor M1a and the transistor M1b are in the on state since before Time T35; thus, the one of $V_0$ and $V_1$ is supplied from the wiring WRDL to the output terminal of the FTJ element FJAa and the input terminal of the FTJ element FJAb. Accordingly, the potentials of the output terminal of the FTJ element FJAa and the input terminal of the FTJ element FJAb become the one of $V_0$ and $V_1$.

Note that $V_0$ and $V_1$ in this operation example are potentials representing two values of ternary data. For example, $V_0$ can be a potential representing one of "−1" and "1", and $V_1$ can be a potential representing the other of "−1" and "1". In the case where data of "−1" or "1" is written to the memory cell MC, the "potential representing '0'" in the description of the timing chart in FIG. 3 is replaced with the "potential representing '−1'" to perform the writing operation. For this reason, refer to the description of the timing chart in FIG. 3 for the values of $V_0$ and $V_1$.

First, attention is focused on the FTJ element FJAa. When the potential of the output terminal of the FTJ element FJAa is $V_0$, since the potential of the wiring FCA is $V_{1A}$, polarization in the dielectric with ferroelectricity included in the FTJ element FJA is changed in the direction from the input terminal to the output terminal (positive direction). On the other hand, when the potential of the output terminal of the FTJ element FJAa is $V_1$, since the potential of the wiring FCA is $V_{1A}$, polarization in the dielectric with ferroelectricity included in the FTJ element FJA is not changed.

Next, attention is focused on the FTJ element FJAb. When the potential of the input terminal of the FTJ element FJAb is $V_0$, since the potential of the wiring FCB is $V_{OB}$, polarization in the dielectric with ferroelectricity included in the FTJ element FJAb is not changed. On the other hand, when the potential of the input terminal of the FTJ element FJAb is $V_1$, since the potential of the wiring FCB is $V_{OB}$, polarization in the dielectric with ferroelectricity included in the FTJ element FJAb is changed in the direction from the input terminal to the output terminal (positive direction).

[From Time T36 to Time T37]

At Time T36, data to be written to the memory cell MC, which is transmitted to the wiring WRDL from the internal circuit in the circuit WDD, changes. Specifically, one of the potentials of $V_0$ and $V_1$ is supplied to the wiring WRDL from the internal circuit in the period from Time T35 to Time T36, whereas the other of the potentials of $V_0$ and $V_1$ is supplied to the wiring WRDL from the internal circuit in the period from Time T36 to Time T37. The transistor M1$a$ and the transistor M1$b$ are in the on state since before Time T36; thus, the other of $V_0$ and $V_1$ is supplied from the wiring WRDL to the output terminal of the FTJ element FJAa and the input terminal of the FTJ element FJAb. Accordingly, the potentials of the output terminal of the FTJ element FJAa and the input terminal of the FTJ element FJAb become the other of $V_0$ and $V_1$.

Changes of the potentials of the output terminal of the FTJ element FJAa and the input terminal of the FTJ element FJAb from one of $V_0$ and $V_1$ to the other of $V_0$ and $V_1$ may change the direction of polarization in the dielectric with ferroelectricity in each of the FTJ element FJAa and the FTJ element FJAb.

Specifically, for example, the case is considered where the potentials of the output terminal of the FTJ element FJAa and the input terminal of the FTJ element FJAb are $V_0$ in the period from Time T35 to Time T36. In this case, the direction of the polarization in the dielectric with ferroelectricity in the FTJ element FJAa is from the input terminal to the output terminal (the positive direction), and the direction of the polarization in the dielectric with ferroelectricity in the FTJ element FJAb is not determined. Here, when the potentials of the output terminal of the FTJ element FJAa and the input terminal of the FTJ element FJAb are changed to $V_1$ in the period from Time T36 to Time T37, the voltage between the input terminal and the output terminal of the FTJ element FJAa becomes $V_{1A}-V_1$ and the voltage between the input terminal and the output terminal of the FTJ element FJAb becomes $V_1-V_{OB}$. n the case where the voltage between the input terminal and the output terminal of the FTJ element FJAa is $V_{1A}-V_1$, the direction of the polarization in the dielectric with ferroelectricity in the FTJ element FJAa does not change and remains in the direction from the input terminal to the output terminal (positive direction). Meanwhile, in the case where the voltage between the input terminal and the output terminal of the FTJ element FJAb is $V_1-V_{OB}$, the direction of the polarization in the dielectric with ferroelectricity in the FTJ element FJAb is determined to be the direction from the input terminal to the output terminal (positive direction).

As another example, the case is considered where the potentials of the output terminal of the FTJ element FJAa and the input terminal of the FTJ element FJAb are $V_1$ in the period from Time T35 to Time T36. In this case, the direction of the polarization in the dielectric with ferroelectricity in the FTJ element FJAa is not determined, and the direction of the polarization in the dielectric with ferroelectricity in the FTJ element FJAb is from the input terminal to the output terminal (the positive direction). Here, when the potentials of the output terminal of the FTJ element FJAa and the input terminal of the FTJ element FJAb are changed to $V_0$ in the period from Time T36 to Time T37, the voltage between the input terminal and the output terminal of the FTJ element FJAa becomes $V_{1A}-V_0$ and the voltage between the input terminal and the output terminal of the FTJ element FJAb becomes $V_0-V_{OB}$. In the case where the voltage between the input terminal and the output terminal of the FTJ element FJAa is $V_{1A}-V_0$, the direction of the polarization in the dielectric with ferroelectricity in the FTJ element FJAa changes to the direction from the input terminal to the output terminal (positive direction). Meanwhile, in the case where the voltage between the input terminal and the output terminal of the FTJ element FJAb is $V_0-V_{OB}$, the direction of the polarization in the dielectric with ferroelectricity in the FTJ element FJAb does not change and remains in the direction from the input terminal to the output terminal (positive direction).

[From Time T37 to Time T38]

In the period from Time T37 to Time T38, transmission of data to be written to the memory cell MC to the wiring WRDL from the internal circuit in the circuit WDD is finished. Specifically, for example, a ground potential is supplied to the wiring WRDL from the internal circuit in the circuit WDD.

The transistor M1$a$ and the transistor M1$b$ are in the on state since before Time T37; thus, a ground potential is supplied from the wiring WRDL to the output terminal of the FTJ element FJAa and the input terminal of the FTJ element FJAb. Accordingly, the potentials of the output terminal of the FTJ element FJAa and the input terminal of the FTJ element FJAb become the ground potential. Note that even when the potentials of the output terminal of the FTJ element FJAa and the input terminal of the FTJ element FJAb become the ground potential, the direction of polarization written to each of the FTJ element FJAa and the FTJ element FJAb in the period from Time T35 to Time T37 does not change. That is, the memory cell MC can retain the data without destruction.

In the period from Time T34 to Time T38, the potential of the wiring FCA is set to $V_{1A}$, the potential of the wiring FCB is set to $V_{OB}$, and one of $V_0$ and $V_1$ is input and then the other of $V_0$ and $V_1$ is input as write data to the memory cell MC from the internal circuit in the circuit WDD through the wiring WRDL, whereby the direction of the polarization in each of the FTJ element FJAa and the FTJ element FJAb is determined as in the following table.

the input terminal and the output terminal of the FTJ element FJAb are substantially equal to each other.

Therefore, the differential current between $I_A$ and $I_B$ is substantially 0, so that no current flows from the memory

TABLE 3

| Order of potentials written to memory cell MC from wiring WRDL | Direction of polarization in FTJ element FJAa | Direction of polarization in FTJ element FJAb |
|---|---|---|
| $V_0$ (from Time T35 to Time T36) ↓ $V_1$ (from Time T36 to Time T37) | Direction from input terminal (wiring FCA) to output terminal (Positive direction) | Direction from input terminal to output terminal (wiring FCB) (Positive direction) |
| $V_1$ (from Time T35 to Time T36) ↓ $V_0$ (from Time T36 to Time T37) | Direction from input terminal (wiring FCA) to output terminal (Positive direction) | Direction from input terminal to output terminal (wiring FCB) (Positive direction) |

[From Time T38 to Time T41]

An operation in the period from Time T38 to Time T41 is similar to the operation from Time T16 to Time T19 in the timing chart in FIG. 3. Thus, refer to the description of the operation from Time T17 to Time T19 in the timing chart in FIG. 3 for the operation in the period from Time T38 to Time T41 in this operation example.

[Case of Reading Data Written to Memory Cell MC]

Here, the case is considered where the data written by the operation in the period from Time T31 to Time T41 is read from the memory cell MC. Note that for the operation of data reading from the memory cell MC, refer to the changes in the potentials of the wiring SL1, the wiring SL2, the wiring WRWL, the wiring WRDL, the wiring FCA, and the wiring FCB in the timing chart in FIG. 4.

In the case of performing the reading operation in the timing chart in FIG. 4, the potential $V_M$ is applied to the wiring FCA and the potential $V_{OB}$ is applied to the wiring FCB in the period from Time T23 to Time T24.

Here, when the operation from Time T24 to Time T25 in the timing chart in FIG. 4 is performed, specifically when the switch SW2 is turned on, the potential of the wiring WRDL becomes $V_{RF}$. At this time, the voltage $V_{FJA}$ (=$V_M$-$V_{RF}$) between the input terminal and the output terminal of the FTJ element FJAa and the voltage $V_{FJB}$ (=$V_{RF}$-$V_{OB}$) between the input terminal and the output terminal of the FTJ element FJAb become approximately ($V_M$-$V_{OB}$)/2.

The direction of the polarization in each of the FTJ element FJAa and the FTJ element FJAb in the memory cell MC to which the data is written by the operation in the timing chart in FIG. 5A is from the input terminal to the output terminal (the positive direction), and the voltages between the input terminals and the output terminals of the FTJ element FJAa and the FTJ element FJAb are equal to each other; thus, in the case where the FTJ element FJAa and the FTJ element FJAb have the same structure, the resistance values between the input terminals and the output terminals of the FTJ element FJAa and the FTJ element FJAb are substantially equal to each other. That is, the current $I_A$ flowing between the input terminal and the output terminal of the FTJ element FJAa and the current $I_B$ flowing between cell MC to the output terminal of the operational amplifier OP through the wiring WRDL, the switch SW2, and the load LE; thus, in the current-voltage converter circuit including the operational amplifier OP and the load LE, the potential of the output terminal of the operational amplifier OP becomes a potential close to the potential $V_{RF}$ (i.e., a potential higher than $V_{OUT\_1}$ and lower than $V_{OUT\_0}$). Accordingly, the potential close to the potential $V_{RF}$ is output from the wiring OL.

As described above, performing the writing operations in the timing charts in FIG. 3 and FIG. 5A enables three pieces of data to be written to the memory cell MC. In addition, performing the reading operation in the timing chart in FIG. 4 enables ternary data retained in the memory cell MC to be read. That is, a memory device including the memory cell MC, the circuit WDD, and the circuit RDD in FIG. 2 can handle ternary data.

Figure 5B:
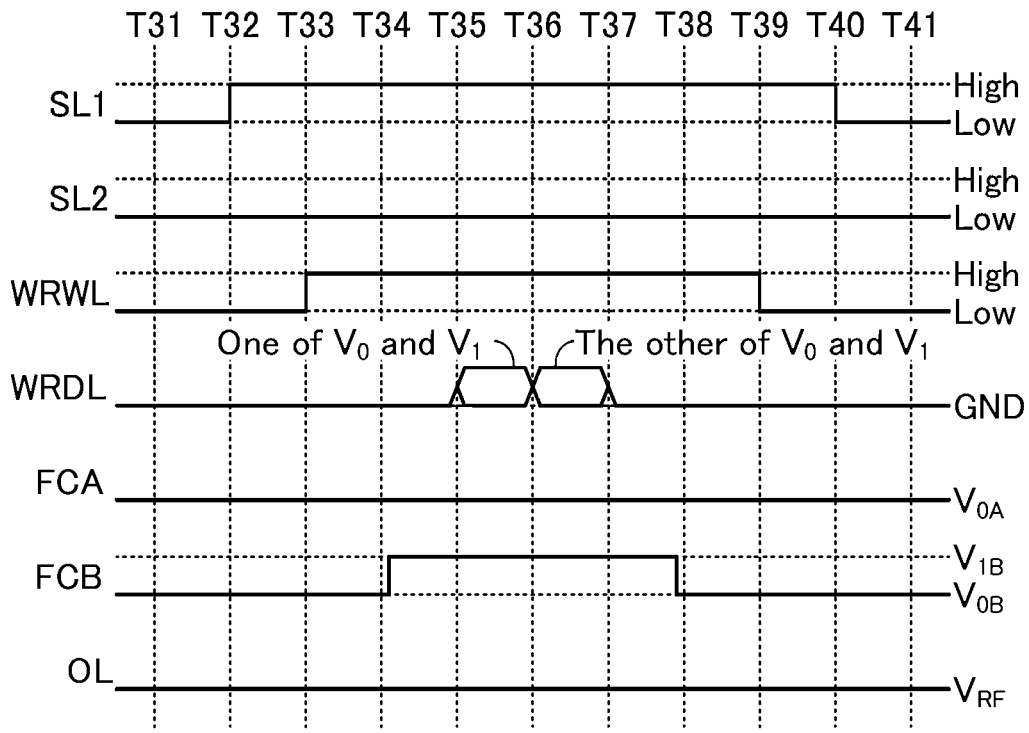

Note that the operations in the timing charts in FIG. 3, FIG. 4, and FIG. 5A described in this embodiment are examples, and the operations can be changed depending on circumstances or conditions. For example, the writing operation in the timing chart in FIG. 5A can be changed into a writing operation in a timing chart in FIG. 5B. The writing operation in the timing chart in FIG. 5B is different from the writing operation in the timing chart in FIG. 5A in that the potential $V_{0A}$ is input to the wiring FCA and a potential $V_{1B}$ is input to the wiring FCB in the period from Time T35 to Time T37. Note that $V_{1B}$ is a potential higher than $V_{0B}$, for example. $V_{1B}$ is set to a potential with which polarization occurs (the direction of polarization changes) in the FTJ element FJAb when the input terminal of the FTJ element FJAb is at $V_0$. In this case, the direction of the polarization is from the output terminal to the input terminal of the FTJ element FJAb (the negative direction). Therefore, $V_{1B}$ is preferably equal to $V_{1A}$. That is, $V_{1B}$ is preferably equal to $V_1$.

By performing the writing operation in the timing chart in FIG. 5B, the direction of the polarization in the FTJ element FJAa and the FTJ element FJAb in the memory cell MC to which the data is written in the period from Time T35 to Time T37 is determined as in the following table.

TABLE 4

| Order of potentials written to memory cell MC from wiring WRDL | Direction of polarization in FTJ element FJAa | Direction of polarization in FTJ element FJAb |
|---|---|---|
| $V_0$ (from Time T35 to Time T36) ↓ | Direction from output terminal to input terminal (wiring FCA) | Direction from output terminal (wiring FCB) to input terminal |

TABLE 4-continued

| Order of potentials written to memory cell MC from wiring WRDL | Direction of polarization in FTJ element FJAa | Direction of polarization in FTJ element FJAb |
|---|---|---|
| $V_1$ (from Time T36 to Time T37) | (Negative direction) | (Negative direction) |
| $V_1$ (from Time T35 to Time T36) ↓ $V_0$ (from Time T36 to Time T37) | Direction from output terminal to input terminal (wiring FCA) (Negative direction) | Direction from output terminal (wiring FCB) to input terminal (Negative direction) |

The direction of the polarization in the FTJ element FJAa and the FTJ element FJAb in the memory cell MC to which the data is written by the writing operation in the timing chart in FIG. 5B is different from the direction of the polarization in the FTJ element FJAa and the FTJ element FJAb in the memory cell MC to which the data is written by the writing operation in the timing chart in FIG. 5A. However, when the data written to the memory cell MC by the writing operation in the timing chart in FIG. 5B is read by the reading operation in the timing chart in FIG. 4, the result of reading from the memory cell MC to which the data is written by the writing operation in the timing chart in FIG. 5B substantially agrees with the result of reading from the memory cell MC to which the data is written by the writing operation in the timing chart in FIG. 5A because the current $I_A$ flowing between the input terminal and the output terminal of the FTJ element FJAa and the current $I_B$ flowing between the input terminal and the output terminal of the FTJ element FJAb in the period from Time T24 to Time T25 are substantially equal to each other.

Configuration Example 2

The circuit configuration of the circuit MCs (the circuit MCa and the circuit MCb) included in the memory device, which is the semiconductor device of one embodiment of the present invention, is not limited to that in FIG. 1A. The circuit configuration of the circuit MCs included in the memory device may be changed depending on circumstances or conditions. In this configuration example, the memory cell MC in which one of the FTJ element FJAa and the FTJ element FJAb provided in the memory cell MC in FIG. 2 is changed into another circuit element is described.

For example, the FTJ element FJA in the circuit MCs in FIG. 1A may be replaced with a ferroelectric capacitor FEA as illustrated in FIG. 6A. Specifically, a first terminal of the ferroelectric capacitor FEA is electrically connected to the wiring FCA, and a second terminal of the ferroelectric capacitor FEA is electrically connected to the second terminal of the transistor M1.

In the case where the circuit MCs in FIG. 6A is used as the circuit MCa and the circuit MCb illustrated in FIG. 2, a capacitor is preferably used as the load LE in FIG. 2. That is, an integrator circuit is preferably constituted by the operational amplifier OP and the load LE. In the case where the circuit MCs in FIG. 6A is used as the circuit MCa and the circuit MCb, the ferroelectric capacitor FEA is positioned as a capacitor between the wiring FCA and the wiring WRDL; thus, the amount of charge corresponding to a constant voltage applied between the first terminal and the second terminal of the ferroelectric capacitor FEA and the electrostatic capacitance value of the ferroelectric capacitor FEA flows between the ferroelectric capacitor FEA and the load LE (capacitor). The amount of charge can be converted into a voltage by the integrator circuit.

As another example, the FTJ element FJA in the circuit MCs in FIG. 1A may be replaced with a circuit element ANA whose resistance values can be changed, as illustrated in FIG. 6B. Specifically, an input terminal of the circuit element ANA is electrically connected to the wiring FCA, and an output terminal of the circuit element ANA is electrically connected to the second terminal of the transistor M1. Examples of the circuit element ANA include a variable resistor used in a ReRAM (Resistive Random Access Memory) or the like, an MTJ (Magnetic Tunnel Junction or Magnetic Transportation Junction) element used in an MRAM (Magnetoresistive Random Access Memory) or the like, and a phase change memory (PCM) element.

Even when the FTJ element FJA in the circuit MCs in FIG. 1A is replaced with the circuit element ANA as in the circuit MCs in FIG. 6B, a resistance value between the wiring FCA and the second terminal of the transistor M1 can be changed as in the circuit MCs in FIG. 1A. Thus, in the circuit MCs in FIG. 6B, the resistance value of the circuit element ANA can be determined in accordance with data written to the circuit MCs in FIG. 6B, as in the circuit MCs in FIG. 1A. Accordingly, the amount of current flowing between the input terminal and the output terminal of the circuit element ANA is determined; hence, in some cases, data can be written to the circuit MCs and the retained data can be read without being destroyed.

By using the memory cell MC in a semiconductor device as described in this embodiment, a semiconductor device that does not need data rewriting (a semiconductor device that performs non-destructive reading) can be configured. Since the semiconductor device including the memory cell MC does not require data rewriting, power consumption for rewriting can be cut off. In addition, the semiconductor device including the memory cell MC does not need to be provided with a circuit that performs data rewriting, thereby reducing the circuit area of the semiconductor device.

Note that this embodiment can be combined with any of the other embodiments in this specification as appropriate.

Embodiment 2

In this embodiment, a memory device that can include the memory cell MC described in the above embodiment will be described.

Configuration Example of Memory Device

Figure 7:
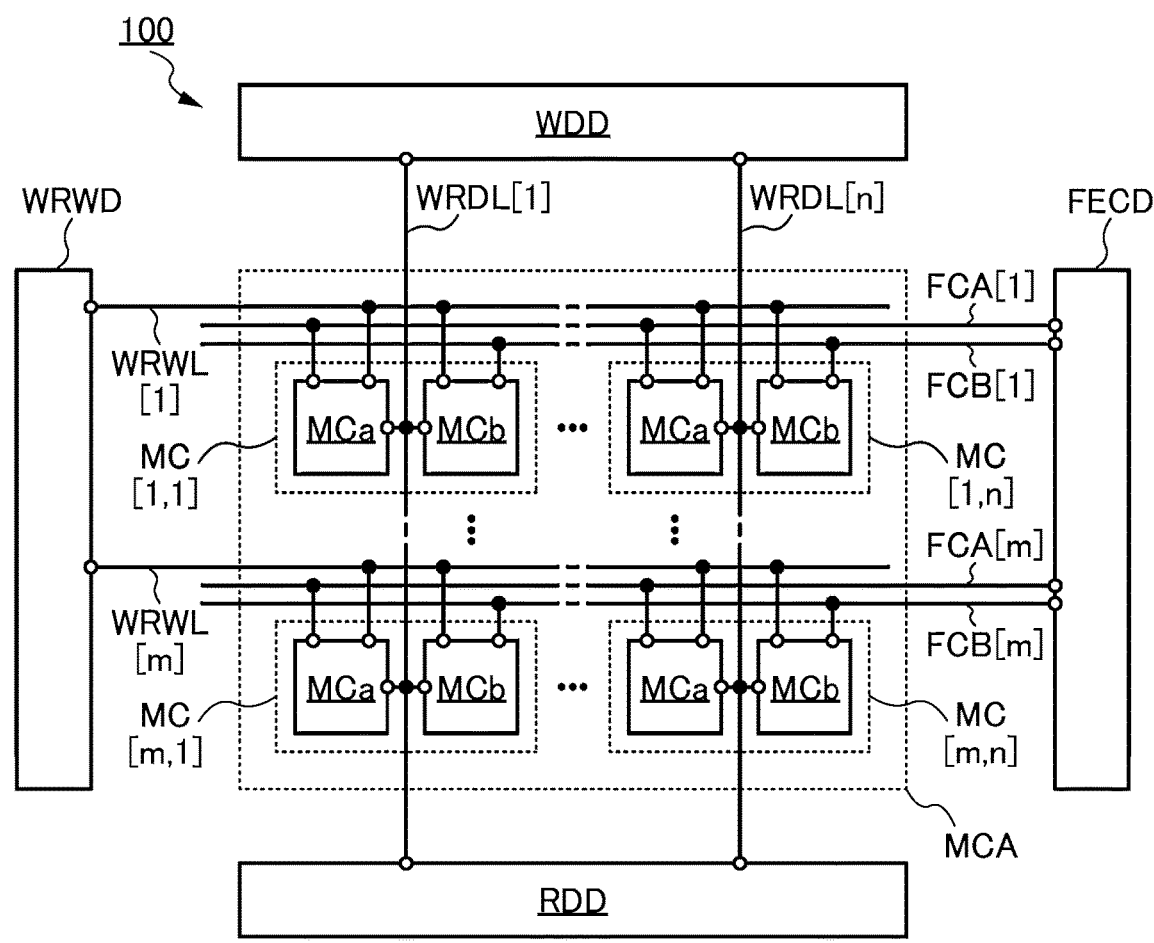
FIG. 7 is a block diagram illustrating a structure example of a memory device.

FIG. 7 shows an example of a circuit configuration of the memory device. A memory device 100 includes a memory cell array MCA, the circuit WDD, the circuit RDD, a circuit WRWD, and a circuit FECD. Note that the memory cell MC that can be used in the memory device 100 in FIG. 7 is the memory cell MC illustrated in FIG. 2 as an example.

The memory cell array MCA includes a plurality of memory cells MC. In the memory cell array MCA, the plurality of memory cells MC are arranged in a matrix of m rows and n columns (m and n are each an integer greater than or equal to 1). Note that in this specification and the like, the memory cell MC that is positioned in an i-th row and a j-th column (i is an integer greater than or equal to 1 and less than or equal to m, and j is an integer greater than or equal to 1 and less than or equal to n) is represented as a memory cell MC[i,j] (not illustrated in FIG. 7).

In the memory cell array MCA of the memory device 100, a wiring WRDL[1] to a wiring WRDL[n] extend in the column direction. Note that [j] added to the wiring WRDL indicates that the wiring is positioned in the j-th column. A wiring WRWL[1] to a wiring WRWL[m], a wiring FCA[1] to a wiring FCA[m], and a wiring FCB[1] to a wiring FCB[m] extend in the row direction. Note that [i] added to the wiring WRWL, the wiring FCA, and the wiring FCB indicates that the wirings are positioned in the i-th row.

The wiring WRDL[1] to the wiring WRDL[n] correspond to the wiring WRDL in the memory cell MC in FIG. 2. The wiring WRWL[1] to the wiring WRWL[m] correspond to the wiring WRWL in the memory cell MC in FIG. 2, the wiring FCA[1] to the wiring FCA[m] correspond to the wiring FCA in the memory cell MC in FIG. 2, and the wiring FCB[1] to the wiring FCB[m] correspond to the wiring FCB in the memory cell MC in FIG. 2.

The circuit WDD is electrically connected to the wiring WRDL[1] to the wiring WRDL[n]. The circuit WRWD is electrically connected to the wiring WRWL[1] to the wiring WRWL[m]. The circuit FECD is electrically connected to the wiring FCA[1] to the wiring FCA[m] and the wiring FCB[1] to the wiring FCB[m]. The circuit RDD is electrically connected to the wiring WRDL[1] to the wiring WRDL[n].

The circuit WRWD functions as, for example, a word line driver circuit at the time of a writing operation and a reading operation. For example, the circuit WRWD transmits a selection signal to one of the wiring WRWL[1] to the wiring WRWL[m] and transmits a non-selection signal to the other wirings, whereby a plurality of memory cells MC that perform a writing operation or a reading operation can be selected in the memory cell array MCA. Specifically, for example, for the memory cell MC in FIG. 2, the selection signal is a high-level potential and the non-selection signal is a low-level potential. In the case where a high-level potential is supplied to the wiring WRWL, the transistor M1*a* and the transistor M1*b* are turned on in the memory cell MC in FIG. 2; thus, data for writing can be transmitted to the memory cell MC from the wiring WRDL or data held in the memory cell MC can be transmitted to the wiring WRDL from the memory cell MC. Meanwhile, in the case where a low-level potential is supplied to the wiring WRWL in the memory cell MC in FIG. 2, the transistor M1*a* and the transistor M1*b* are turned off; thus, even when data to be written to another memory cell MC is transmitted from the wiring WRDL or data read from another memory cell MC is transmitted to the wiring WRDL, the data is not written to the memory cell MC supplied with the low-level potential from the wiring WRWL.

The circuit FECD has a function of supplying a constant potential to the wiring FCA and the wiring FCB, for example. Specifically, for example, the circuit FECD supplies a constant potential to the wiring FCA and the wiring FCB at the time of writing data to the memory cell MC, thereby causing polarization (changing the polarization direction) in the FTJ element FJAa and the FTJ element FJAb included in each of the plurality of memory cells MC. Alternatively, the circuit FECD supplies a constant potential to the wiring FCA and the wiring FCB at the time of reading data from the memory cell MC, whereby a current can flow between the input terminal and the output terminal of the FTJ element FJAa and between the input terminal and the output terminal of the FTJ element FJAb.

The circuit WDD functions as, for example, a write data line driver circuit. For example, the circuit WDD transmits data for writing (e.g., voltage) to the wiring WRDL[1] to the wiring WRDL[n], thereby writing the data for writing to a plurality of memory cells MC positioned in a specified row selected by the circuit WRWD.

The circuit RDD functions as, for example, a read circuit. For example, the circuit RDD can obtain, from the wiring WRDL[1] to the wiring WRDL[n], data (e.g., voltage or current) output from a plurality of memory cells MC positioned in a specified row selected by the circuit WRWD and thus read the data. The circuit RDD includes, for example, one or more selected from a precharge circuit, a sense amplifier circuit, a current-voltage converter circuit, and the like. As a specific example, the circuit configuration included in the circuit RDD illustrated in FIG. 2 may be employed.

Operation Example of Memory Device

Next, operation examples of the memory device 100 are described.

Writing Operation Example 1

Figure 8:
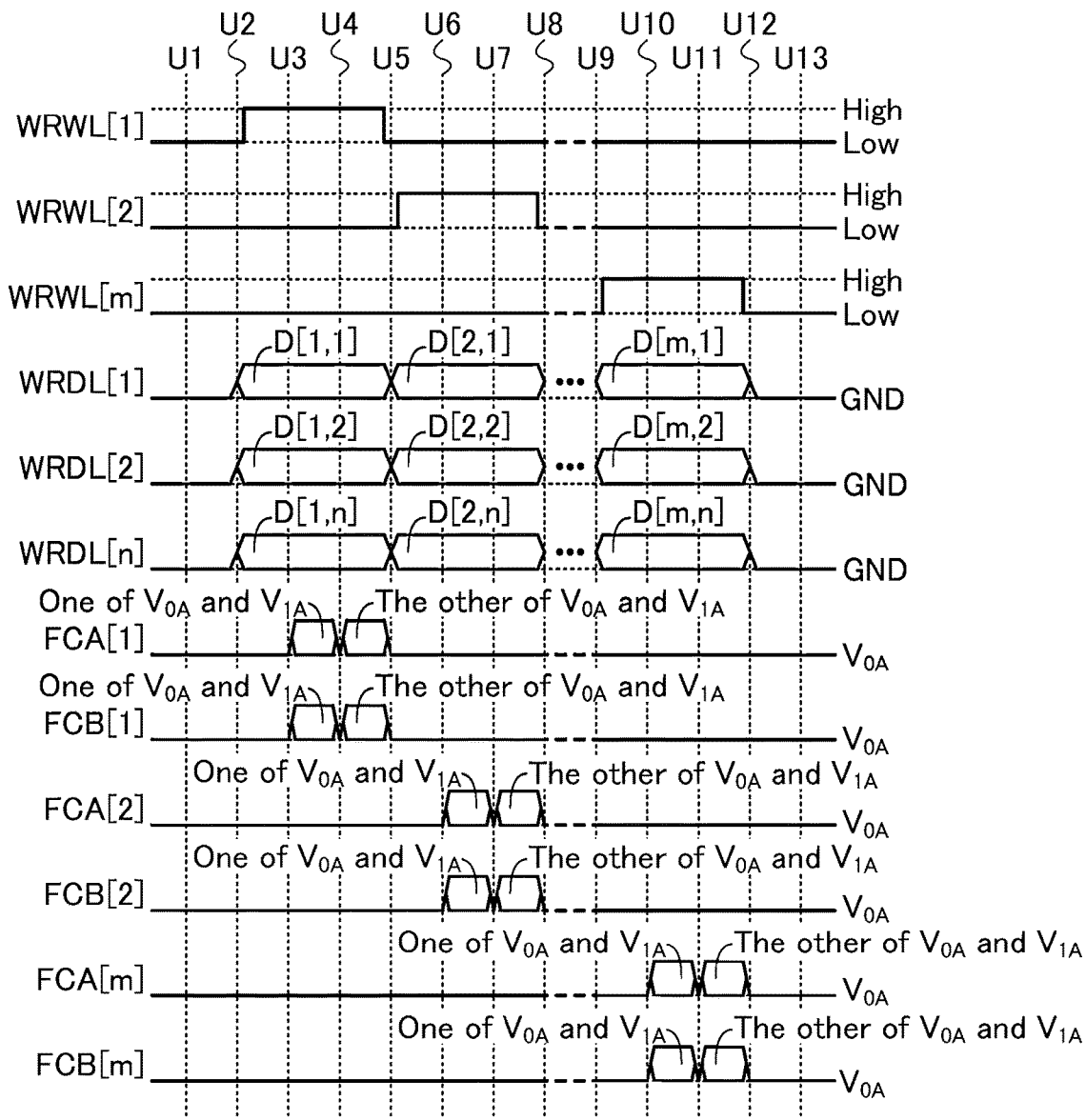
FIG. 8 is a timing chart showing an operation example of a memory device.

FIG. 8 is a timing chart showing an example of the operation of writing data to the memory cells MC of the memory device 100. Note that the timing chart in FIG. 3, which is described in the above embodiment, shows the operation example of one memory cell MC; whereas the timing chart in FIG. 8 shows an example of the operation of writing data to a plurality of memory cells MC included in the memory cell array MCA.

The timing chart in FIG. 8 shows changes in potentials of the wiring WRWL[1], the wiring WRWL[1], the wiring WRWL[m], the wiring WRDL[1], the wiring WRDL[2], the wiring WRDL[n], the wiring FCA[1], the wiring FCB[1], the wiring FCA[1], the wiring FCB[1], the wiring FCA[m], and the wiring FCB[m] in a period from Time U1 to Time U13 and around the period.

In the period from Time U1 to Time U2, for example, the circuit WRWD supplies a low-level potential (denoted as Low in FIG. 8) as an initial potential to the wiring WRWL[1] to the wiring WRWL[m]. Thus, the low-level potential is supplied to the gates of the transistors M1*a* and the transistors M1*b* in all the memory cells MC included in the memory cell array MCA, so that the transistors M1*a* and the transistors M1*b* are turned off.

In the period from Time U1 to Time U2, the circuit WDD does not transmit data for writing to the wiring WRDL[1] to the wiring WRDL[n]. Thus, in the period from Time U1 to Time U2, the circuit WDD supplies a ground potential (denoted as GND in FIG. 8), for example, to the wiring WRDL[1] to the wiring WRDL[n]. Note that as in the writing operation example in FIG. 3, the potential supplied from the circuit WDD to the wiring WRDL[1] to the wiring WRDL[n] may be $V_0$ instead of a ground potential.

In the period from Time U1 to Time U2, the circuit FECD supplies the potential $V_{04}$ to the wiring FCA[1] to the wiring FCA[m] and the wiring FCB[1] to the wiring FCB[m]. Note that the description of the timing chart in FIG. 3 is referred to for the potential $V_{04}$.

In the period from Time U2 to Time U5, the circuit WRWD supplies a high-level potential (denoted as High in FIG. 8) to the wiring WRWL[1] and supplies a low-level potential to the wiring WRWL[1] to the wiring WRWL[m]. Accordingly, in the memory cell array MCA, the high-level potential is supplied to the gates of the transistors M1a and the transistors M1b included in the memory cell MC[1,1] to the memory cell MC[1,n] positioned in the first row; hence, the transistors M1a and the transistors M1b included in the memory cell MC[1,1] to the memory cell MC[1,n] are turned on. Moreover, in the memory cell array MCA, the low-level potential is supplied to the gates of the transistors M1a and the transistors M1b included in the memory cell MC[2,1] to the memory cell MC[m,n] positioned in the second row to the m-th row; thus, the transistors M1a and the transistors M1b included in the memory cell MC[2,1] to the memory cell MC[m,n] are turned off. That is, the circuit WRWD can select the memory cells MC positioned in the first row of the memory cell array MCA as writing targets by supplying a high-level potential to the wiring WRWL[1] and supplying a low-level potential to the wiring WRWL[1] to the wiring WRWL[m].

In the period from Time U2 to Time U5, the circuit WDD supplies D[1,1] to D[1,n], for example, as data for writing to the wiring WRDL[1] to the wiring WRDL[n], respectively. Since the memory cells MC positioned in the first row of the memory cell array MCA have been selected as the writing targets by the circuit WRWD, potentials corresponding to D[1,1] to D[1,n] are supplied to the output terminals of the FTJ elements FJAa and the input terminals of the FTJ elements FJAb in the memory cell MC[1,1] to the memory cell MC[1,n].

In the period from Time U3 to Time U4, the circuit FECD supplies one of $V_{0A}$ and $V_{1A}$ to the wiring FCA[1] and the wiring FCB[1]. Note that the circuit FECD supplies the potential $V_{0A}$ to the wiring FCA[1] to the wiring FCA[m] and supplies the potential $V_{0A}$ to the wiring FCB[1] to the wiring FCB[m].

In the period from Time U4 to Time U5, the circuit FECD supplies the other of $V_{0A}$ and $V_{1A}$ to the wiring FCA[1] and the wiring FCB[1]. Note that the circuit FECD continuously supplies the potential $V_{0A}$ to the wiring FCA[1] to the wiring FCA[m] and continuously supplies the potential $V_{0A}$ to the wiring FCB[1] to the wiring FCB[m].

Note that the description of the timing chart in FIG. 3 is referred to for the potential $V_{0A}$ and the potential $V_{1A}$.

By the operation in the period from Time U2 to Time U5, the direction of polarization generated in the FTJ element FJAa and the FTJ element FJAb included in each of the memory cell MC[1,1] to the memory cell MC[1,n] in the first row of the memory cell array MCA is determined in accordance with D[1,1] to D[1,n] transmitted from the wiring WRDL[1] to the wiring WRDL [n] That is, with the operation from Time U2 to Time U5, D[1,1] to D[1,n] are written to the memory cell MC[1,1] to the memory cell MC[1,n], respectively.

In the period from Time U5 to Time U8, the circuit WRWD supplies a high-level potential to the wiring WRWL [1] and supplies a low-level potential to the wiring WRWL [1] and the wiring WRWL[1] to the wiring WRWL[m]. Accordingly, in the memory cell array MCA, the high-level potential is supplied to the gates of the transistors M1a and the transistors M1b included in the memory cell MC[2,1] to the memory cell MC[2,n] positioned in the second row; hence, the transistors M1a and the transistors M1b included in the memory cell MC[2,1] to the memory cell MC[2,n] are turned on. Moreover, in the memory cell array MCA, the low-level potential is supplied to the gates of the transistors M1a and the transistors M1b included in the memory cell MC[1,1] to the memory cell MC[1,n] and the memory cell MC[3,1] to the memory cell MC[m,n] positioned in the first row and the third row to the m-th row; thus, the transistors M1a and the transistors M1b included in the memory cell MC[1,1] to the memory cell MC[1,n] and the memory cell MC[3,1] to the memory cell MC[m,n] are turned off. That is, the circuit WRWD can select the memory cells MC positioned in the second row of the memory cell array MCA as writing targets by supplying a high-level potential to the wiring WRWL[1] and supplying a low-level potential to the wiring WRWL[1] and the wiring WRWL[1] to the wiring WRWL[m].

In the period from Time U5 to Time U8, the circuit WDD supplies D[2,1] to D[2,n], for example, as data for writing to the wiring WRDL[1] to the wiring WRDL[n], respectively. Since the memory cells MC positioned in the second row of the memory cell array MCA have been selected as the writing targets by the circuit WRWD, potentials corresponding to D[2,1] to D[2,n] are supplied to the output terminals of the FTJ elements FJAa and the input terminals of the FTJ elements FJAb in the memory cell MC[2,1] to the memory cell MC[2,n].

In the period from Time U6 to Time U7, the circuit FECD supplies one of $V_{0A}$ and $V_{1A}$ to the wiring FCA[1] and the wiring FCB[2]. Note that the circuit FECD supplies the potential $V_{0A}$ to the wiring FCA[1] and the wiring FCA[1] to the wiring FCA[m] and supplies the potential $V_{0A}$ to the wiring FCB[1] and the wiring FCB[3] to the wiring FCB[m].

In the period from Time U7 to Time U8, the circuit FECD supplies the other of $V_{0A}$ and $V_{1A}$ to the wiring FCA[1] and the wiring FCB[2]. Note that the circuit FECD continuously supplies the potential $V_{0A}$ to the wiring FCA[1] and the wiring FCA[1] to the wiring FCA[m] and continuously supplies the potential $V_{0A}$ to the wiring FCB[1] and the wiring FCB[3] to the wiring FCB[m].

By the operation in the period from Time U5 to Time U8, the direction of polarization generated in the FTJ element FJAa and the FTJ element FJAb included in each of the memory cell MC[2,1] to the memory cell MC[2,n] in the second row of the memory cell array MCA is determined in accordance with D[2,1] to D[2,n] transmitted from the wiring WRDL[1] to the wiring WRDL[n]. That is, with the operation from Time U5 to Time U8, D[2,1] to D[2,n] are written to the memory cell MC[2,1] to the memory cell MC[2,n], respectively.

In the period from Time U8 to Time U9, the operation of writing data to the memory cells MC positioned in the third row to the (m−1)th row of the memory cell array MCA is performed in a manner similar to that of the operation of writing data to the memory cells MC positioned in the first row of the memory cell array MCA in the period from Time U2 to Time U5, and the operation of writing data to the memory cells MC positioned in the second row of the memory cell array MCA in the period from Time U5 to Time U8.

In the period from Time U9 to Time U12, the circuit WRWD supplies a high-level potential to the wiring WRWL [m] and supplies a low-level potential to the wiring WRWL [1] to the wiring WRWL[m−1]. Accordingly, in the memory cell array MCA, the high-level potential is supplied to the gates of the transistors M1a and the transistors M1b included in the memory cell MC[m,1] to the memory cell MC[m,n] positioned in the m-th row; hence, the transistors M1a and the transistors M1b included in the memory cell MC[m,1] to the memory cell MC[m,n] are turned on.

Moreover, in the memory cell array MCA, the low-level potential is supplied to the gates of the transistors M1a and the transistors M1b included in the memory cell MC[1,1] to the memory cell MC[m−1,n] positioned in the first row to the (m−1)th row; thus, the transistors M1a and the transistors M1b included in the memory cell MC[1,1] to the memory cell MC[m−1,n] are turned off. That is, the circuit WRWD can select the memory cells MC positioned in the m-th row of the memory cell array MCA as writing targets by supplying a high-level potential to the wiring WRWL[m] and supplying a low-level potential to the wiring WRWL[1] to the wiring WRWL[m−1].

In the period from Time U9 to Time U12, the circuit WDD supplies D[m,1] to D[m,n], for example, as data for writing to the wiring WRDL[1] to the wiring WRDL[n], respectively. Since the memory cells MC positioned in the m-th row of the memory cell array MCA have been selected as the writing targets by the circuit WRWD, potentials corresponding to D[m,1] to D[m,n] are supplied to the output terminals of the FTJ elements FJAa and the input terminals of the FTJ elements FJAb in the memory cell MC[m,1] to the memory cell MC[m,n].

In the period from Time U10 to Time U11, the circuit FECD supplies one of $V_{OA}$ and $V_{1A}$ to the wiring FCA[m] and the wiring FCB[m]. Note that the circuit FECD supplies the potential $V_{OA}$ to the wiring FCA[1] to the wiring FCA[m−1] and supplies the potential $V_{OA}$ to the wiring FCB[1] to the wiring FCB[m−1].

In the period from Time U11 to Time U12, the circuit FECD supplies the other of $V_{OA}$ and $V_{1A}$ to the wiring FCA[m] and the wiring FCB[m]. Note that the circuit FECD continuously supplies the potential $V_{OA}$ to the wiring FCA[1] to the wiring FCA[m−1] and continuously supplies the potential $V_{OA}$ to the wiring FCB[1] to the wiring FCB[m−1].

By the operation in the period from Time U9 to Time U12, the direction of polarization generated in the FTJ element FJAa and the FTJ element FJAb included in each of the memory cell MC[m,1] to the memory cell MC[m,n] in the m-th row of the memory cell array MCA is determined in accordance with D[m,1] to D[m,n] transmitted from the wiring WRDL[1] to the wiring WRDL[n]. That is, with the operation from Time U9 to Time U12, D[m,1] to D[m,n] are written to the memory cell MC[m,1] to the memory cell MC[m,n], respectively.

By the operation from Time U1 to Time U12, D[1,1] to D[m,n] can be respectively written to the memory cell MC[1,1] to the memory cell MC[m,n] included in the memory cell array MCA.

Note that in the timing chart of FIG. 8, as the operation after the operation of writing data to the memory cell MC[1,1] to the memory cell MC[m,n] ends (operation in the period from Time U12 to Time U13), the circuit WRWD supplies a low-level potential to the wiring WRWL[1] to the wiring WRWL[m], for example. The circuit WDD supplies a ground potential to the wiring WRDL[1] to the wiring WRDL[n], for example. The circuit FECD supplies the potential $V_{OA}$ to the wiring FCA[1] to the wiring FCA[m] and the wiring FCB[1] to the wiring FCB[m], for example.

Since the operation in the timing chart of FIG. 8 is an example, the operation may be changed depending on the situation or the case. For example, in the operation in the period from Time U2 to Time U5 in the timing chart of FIG. 8, a high-level potential is supplied to the wiring WRWL[1] and D[1,1] to D[1,n] are supplied to the wiring WRDL[1] to the wiring WRDL[n]; alternatively, D[1,1] to D[1,n] may be supplied to the wiring WRDL[1] to the wiring WRDL[n] in a period during which a high-level potential is supplied to the wiring WRWL[1], or a high-level potential may be supplied to the wiring WRWL[1] in a period during which D[1,1] to D[1,n] are supplied to the wiring WRDL[1] to the wiring WRDL[n]. The period during which the potential $V_{1A}$ is supplied to the wiring FCA[1] and the wiring FCB[1] and the period during which the potential $V_{OA}$ is supplied to the wiring FCA[1] and the wiring FCB[1] can be any time within a period during which a high-level potential is supplied to the wiring WRWL[1] and D[1,1] to D[1,n] are supplied to the wiring WRDL[1] to the wiring WRDL[n].

Writing Operation Example 2

Next, an example of the operation of writing data to the memory cells MC of the memory device 100, which is different from that in the timing chart in FIG. 8, is described.

Figure 9:
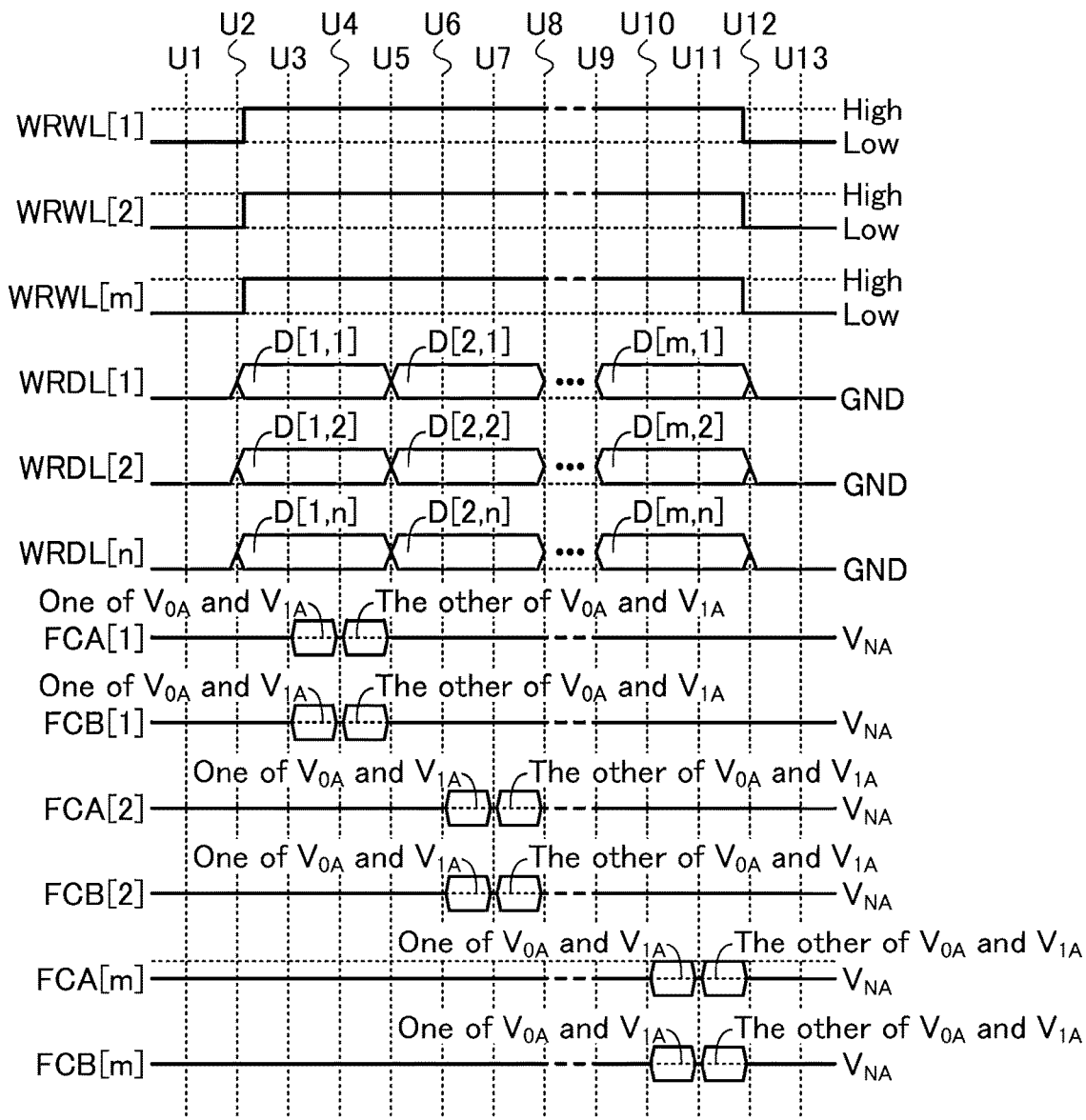
FIG. 9 is a timing chart showing an operation example of a memory device.

A timing chart in FIG. 9 shows a writing operation example different from the writing operation example in the timing chart in FIG. 8. Like the timing chart in FIG. 8, the timing chart in FIG. 9 shows changes in the potentials of the wiring WRWL[1], the wiring WRWL[1], the wiring WRWL[m], the wiring WRDL[1], the wiring WRDL[2], the wiring WRDL[n], the wiring FCA[1], the wiring FCB[1], the wiring FCA[1], the wiring FCB[1], the wiring FCA[m], and the wiring FCB[m] in the period from Time U1 to Time U13 and around the period.

The writing operation in the timing chart of FIG. 9 differs from the writing operation in the timing chart of FIG. 8 in that a high-level potential (denoted as High in FIG. 9) is input to the wiring WRWL[1] to the wiring WRWL[m] in the period from Time U2 to Time U12, and in potential changes of the wiring FCA[1] to the wiring FCA[m] and the wiring FCB[1] to the wiring FCB[m] in the period from Time U1 to Time U13.

Since a high-level potential is input to the wiring WRWL[1] to the wiring WRWL[m] in the period from Time U2 to Time U12 in the timing chart of FIG. 9, the high-level potential is input to the gates of the transistors M1a and the transistors M1b in the memory cell MC[1,1] to the memory cell MC[m,n] included in the memory cell array MCA in the period from Time U2 to Time U12; thus, the transistors M1a and the transistors M1b in the memory cell MC[1,1] to the memory cell MC[n,m] are turned on. That is, when attention is focused on the j-th column, electrical continuity is established between the wiring WRDL[1] and each of the output terminals of the FTJ elements FJAa and the input terminals of the FTJ elements FJAb in the memory cell MC[11] to the memory cell MC[m,j].

In the period from Time U1 to Time U2 in the timing chart of FIG. 9, a potential $V_{NA}$ is supplied to the wiring FCA[1] to the wiring FCA[m] and the wiring FCB[1] to the wiring FCB[m].

$V_{NA}$ can be, for example, a potential higher than $V_{OA}$ and lower than $V_{1A}$. That is, $V_{NA}$ can be a potential with which polarization is not caused (not changed) in the FTJ element FJAa even when a potential input to the output terminal of the FTJ element FJAa from the wiring WRDL is $V_0$ or $V_1$. Similarly, $V_{NA}$ can be a potential with which polarization is not caused (not changed) in the FTJ element FJAb even when a potential input to the input terminal of the FTJ element FJAb from the wiring WRDL is $V_0$ or $V_1$.

In the period from Time U3 to Time U4 in the timing chart of FIG. 9, one of $V_{OA}$ and $V_{1A}$ is supplied to the wiring FCA[1] and the wiring FCB[1]. Note that the potential $V_{NA}$ is continuously supplied to the wiring FCA[1] to the wiring FCA[m] and the wiring FCB[1] to the wiring FCB[m].

In the period from Time U4 to Time U5 in the timing chart of FIG. 9, the other of $V_{OA}$ and $V_{1A}$ is supplied to the wiring FCA[1] and the wiring FCB[1]. Note that the potential $V_{NA}$ is continuously supplied to the wiring FCA[1] to the wiring FCA[m] and the wiring FCB[1] to the wiring FCB[m].

By the operation in the period from Time U2 to Time U5 in the timing chart of FIG. 9, the direction of polarization generated in the FTJ element FJAa and the FTJ element FJAb included in each of the memory cell MC[1,1] to the memory cell MC[1,n] in the first row of the memory cell array MCA is determined in accordance with D[1,1] to D[1,n] transmitted from the wiring WRDL[1] to the wiring WRDL[n]. Meanwhile, since the potential $V_{NA}$ is supplied to the wiring FCA[1] to the wiring FCA[m] and the wiring FCB[1] to the wiring FCB[m] in the period from Time U2 to Time U5, D[1,1] to D[1,n] are not written to the memory cells MC in each column even when the transistors M1a and the transistors M1b in the memory cell MC[2,1] to the memory cell MC[m,n] are turned on.

That is, in the operation in the timing chart of FIG. 9, the wiring FCA[1] to the wiring FCA[m] and the wiring FCB[1] to the wiring FCB[m] can function not only as wirings for controlling polarization in the FTJ element FJAa and the FTJ element FJAb but also as selection signal lines for data writing.

After Time U5 in the timing chart of FIG. 9, the memory cells MC are selected row by row from the second row to the m-th row of the memory cell array MCA by using the wiring FCA[1] to the wiring FCA[m] and the wiring FCB[1] to the wiring FCB[m] in accordance with data transmitted from the wiring WRDL[1] to the wiring WRDL[n]; hence, as in the operation example in the timing chart of FIG. 8, D[2,1] to D[m,n] can be written to the memory cell MC[2,1] to the memory cell MC[m,n] included in the memory cell array MCA.

Reading Operation Example 1

Figure 10:
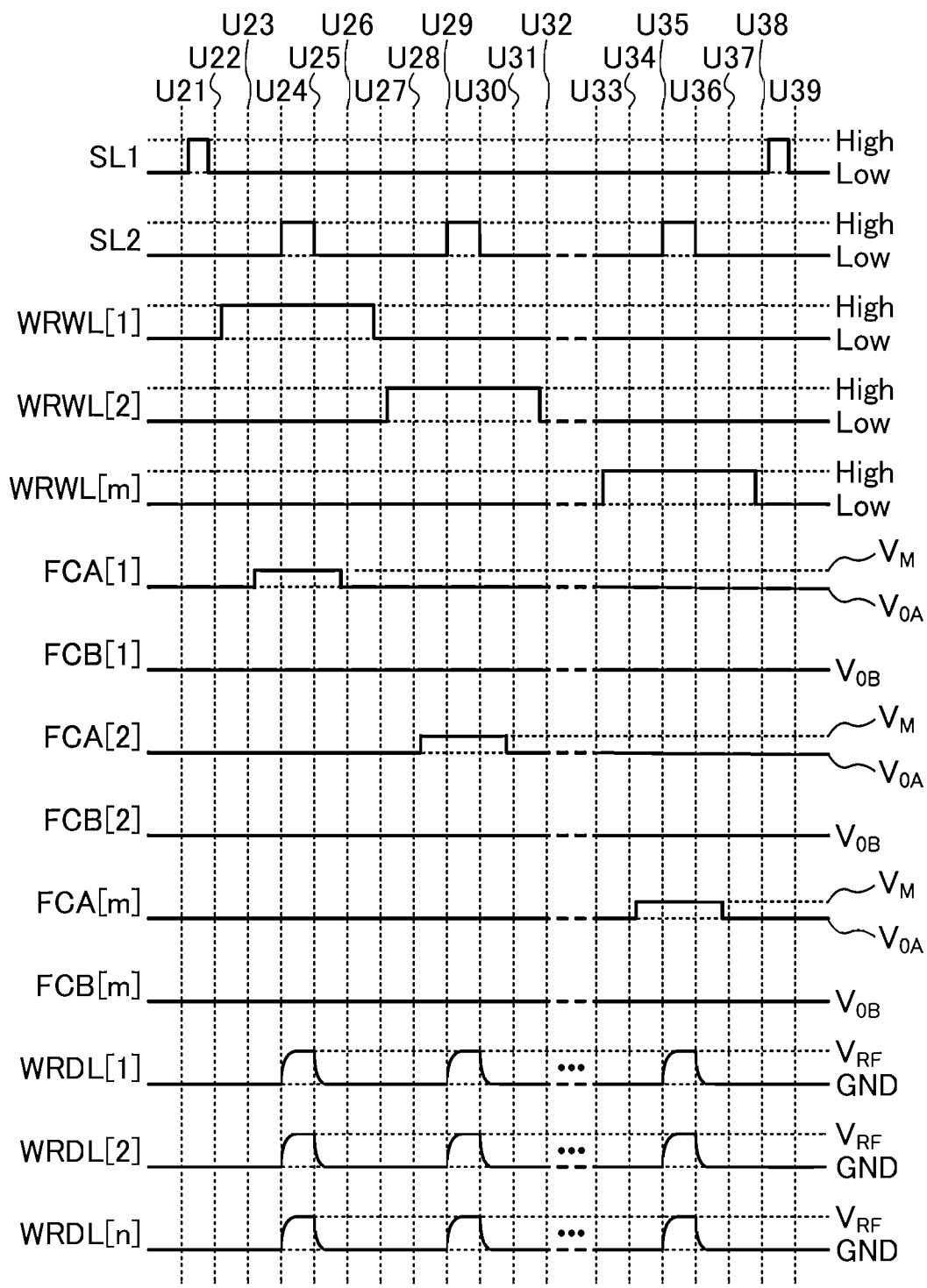
FIG. 10 is a timing chart showing an operation example of a memory device.

FIG. 10 is a timing chart showing an example of the operation of reading data from the memory cells MC of the memory device 100. Note that the timing chart in FIG. 4, which is described in the above embodiment, shows the operation example of one memory cell MC; whereas the timing chart in FIG. 10 shows an example of the operation of reading data from a plurality of memory cells MC included in the memory cell array MCA.

The timing chart in FIG. 10 shows changes in the potentials of the wiring SL1, the wiring SL2, the wiring WRWL[1], the wiring WRWL[1], the wiring WRWL[m], the wiring FCA[1], the wiring FCB[1], the wiring FCA[1], the wiring FCB[1], the wiring FCA[m], the wiring FCB[m], the wiring WRDL[1], the wiring WRDL[2], and the wiring WRDL[n] in a period from Time U21 to Time U39 and around the period.

The circuit WDD included in the memory device 100 has a configuration including the switch SW1, like the circuit WDD illustrated in FIG. 2. Thus, the timing chart in FIG. 10 also shows a change in the potential of the wiring SL1.

The configuration of the circuit RDD illustrated in FIG. 2 is referred to for the configuration of the circuit RDD included in the memory device 100. Therefore, the description of the above embodiment is referred to for the operation and the like of the circuit RDD. Thus, the timing chart in FIG. 10 also shows a change in the potential of the wiring SL2.

In the period from Time U21 to Time U22, for example, the circuit WRWD supplies a low-level potential (denoted as Low in FIG. 10) as an initial potential to the wiring WRWL[1] to the wiring WRWL[m]. Thus, the low-level potential is supplied to the gates of the transistors M1a and the transistors M1b in all the memory cells MC included in the memory cell array MCA, so that the transistors M1a and the transistors M1b are turned off.

In the period from Time U21 to Time U22, the circuit FECD supplies the potential $V_{OA}$ to the wiring FCA[1] to the wiring FCA[m] and supplies the potential $V_{OB}$ to the wiring FCB[1] to the wiring FCB[m]. Note that the description of the timing charts in FIG. 3, FIG. 4, and the like is referred to for the potential $V_{OA}$ and the potential $V_{OB}$.

In the period from Time U21 to Time U22, for example, a ground potential is supplied as an initial potential to the wiring WRDL[1] to the wiring WRDL[n]. Specifically, for example, a high-level potential (denoted as High in FIG. 10) is supplied to the wiring SL1 to turn on the switch SW1, and the circuit WDD supplies a ground potential to the wiring WRDL[1] to the wiring WRDL[n]. In this operation example, after a ground potential is supplied to the wiring WRDL[1] to the wiring WRDL[n], a low-level potential is supplied to the wiring SL1 to turn off the switch SW1, thereby breaking electrical continuity between the circuit WDD and the wiring WRDL[1] to the wiring WRDL[n].

In the period from Time U21 to Time U22, a low-level potential is supplied to the wiring SL2 to turn off the switch SW2, thereby breaking electrical continuity between the circuit RDD and the wiring WRDL[1] to the wiring WRDL[n].

In the period from Time U22 to Time U27, the circuit WRWD supplies a high-level potential to the wiring WRWL[1]. In addition, the circuit WRWD supplies a low-level potential to the wiring WRWL[1] to the wiring WRWL[m]. Accordingly, in the memory cell array MCA, the high-level potential is supplied to the gates of the transistors M1a and the transistors M1b included in the memory cell MC[1,1] to the memory cell MC[1,n] positioned in the first row; hence, the transistors M1a and the transistors M1b included in the memory cell MC[1,1] to the memory cell MC[1,n] are turned on. Moreover, in the memory cell array MCA, the low-level potential is supplied to the gates of the transistors M1a and the transistors M1b included in the memory cell MC[2,1] to the memory cell MC[m,n] positioned in the second row to the m-th row; thus, the transistors M1a and the transistors M1b included in the memory cell MC[2,1] to the memory cell MC[m,n] are turned off.

In the period from Time U23 to Time U26, the circuit FECD supplies the potential $V_M$ to the wiring FCA[1] and supplies the potential $V_{OB}$ to the wiring FCB[1]. Moreover, the circuit FECD supplies the potential $V_{OA}$ to the wiring FCA[1] to the wiring FCA[m] and supplies the potential $V_{OB}$ to the wiring FCB[1] to the wiring FCB[m].

Note that the description of the timing charts in FIG. 4 and the like is referred to for the potential $V_M$.

In the period from Time U24 to Time U25, a high-level potential is supplied to the wiring SL2. Thus, the switch SW2 is turned on, and electrical continuity is established between the circuit RDD and the wiring WRDL[1] to the wiring WRDL[n]. As has been described with the timing chart in FIG. 4, the inverting input terminal and the non-inverting input terminal of the operational amplifier OP are virtually short-circuited; hence, the potentials of the wiring WRDL[1] to the wiring WRDL[n] become $V_{RF}$.

Note that the description of the timing charts in FIG. 4 and the like is referred to for the potential $V_{RF}$.

At this time, the transistors M1a and the transistors M1b in the memory cell MC[1,1] to the memory cell MC[1,n] in the first row of the memory cell array MCA are turned on, so that the potential $V_{RF}$ is supplied to the output terminal of the FTJ element FJAa and the input terminal of the FTJ element FJAb in each of the memory cell MC[1,1] to the memory cell MC[1,n]. Thus, a voltage $V_M$-$V_{RF}$ is applied between the input terminal and the output terminal of the FTJ element FJAa, and a voltage $V_{RF}$-$V_{OB}$ is applied between the input terminal and the output terminal of the FTJ element FJAb. According to the timing chart in FIG. 4, the potential $V_{RF}$ is $(V_M+V_{OB})/2$; therefore, the voltage between the input terminal and the output terminal of each of the FTJ element FJAa and the FTJ element FJAb becomes $(V_M-V_{OB})/2$.

According to the operation in the timing chart in FIG. 4, the amount of current flowing between the input terminal and the output terminal of each of the FTJ element FJAa and the FTJ element FJAb depends on the polarization direction in a dielectric with ferroelectricity included in the FTJ element FJAa and the FTJ element FJAb. The polarization direction in the dielectric is determined in accordance with data written to the memory cell MC; thus, the data can be read from a difference in the amount of currents flowing between the input terminals and the output terminals of the FTJ element FJAa and the FTJ element FJAb. The difference in the amount of currents can be obtained by conversion into a voltage value by a current-voltage circuit including the operational amplifier OP and the load LE of the circuit RDD.

Accordingly, while the circuit FECD supplies the potential $V_M$ to the wiring FCA[1] and supplies the potential $V_{OB}$ to the wiring FCB[1], the switch SW2 is turned on in the circuit RDD and a difference between the currents flowing between the input terminals and the output terminals of the FTJ element FJAa and the FTJ element FJAb is converted into a voltage value by using the current-voltage converter circuit included in the circuit RDD; thus, the data D[1,1] to the data D[1,n] respectively held in the memory cell MC[1, 1] to the memory cell MC[1,n] in the first row of the memory cell array MCA can be read as the voltage values.

In the period from Time U25 to Time U26, a low-level potential is supplied to the wiring SL2. Thus, the switch SW2 is turned off, and electrical continuity between the circuit RDD and the wiring WRDL[1] to the wiring WRDL[n] is broken. At this time, the potentials of the wiring WRDL[1] to the wiring WRDL[n] decrease from $V_{RF}$ and become a ground potential.

In the period from Time U27 to Time U32, the circuit WRWD supplies a high-level potential to the wiring WRWL[2]. In addition, the circuit WRWD supplies a low-level potential to the wiring WRWL[1] and the wiring WRWL[1] to the wiring WRWL[m]. Accordingly, in the memory cell array MCA, the high-level potential is supplied to the gates of the transistors M1a and the transistors M1b included in the memory cell MC[2,1] to the memory cell MC[2,n] positioned in the second row; hence, the transistors M1a and the transistors M1b included in the memory cell MC[2,1] to the memory cell MC[2,n] are turned on. Moreover, in the memory cell array MCA, the low-level potential is supplied to the gates of the transistors M1a and the transistors M1b included in the memory cell MC[1,1] to the memory cell MC[1,n] and the memory cell MC[3,1] to the memory cell MC[m,n] positioned in the first row and the third row to the m-th row; thus, the transistors M1a and the transistors M1b included in the memory cell MC[1,1] to the memory cell MC[1,n] and the memory cell MC[3,1] to the memory cell MC[m,n] are turned off.

In the period from Time U28 to Time U31, the circuit FECD supplies the potential $V_M$ to the wiring FCA[1] and supplies the potential $V_{OB}$ to the wiring FCB[1]. Moreover, the circuit FECD supplies the potential $V_{OA}$ to the wiring FCA[1] and the wiring FCA[1] to the wiring FCA[m] and supplies the potential $V_{OB}$ to the wiring FCB[1] and the wiring FCB[1] to the wiring FCB[m].

In the period from Time U29 to Time U30, a high-level potential is supplied to the wiring SL2. Thus, the switch SW2 is turned on, and electrical continuity is established between the circuit RDD and the wiring WRDL[1] to the wiring WRDL[n]. The inverting input terminal and the non-inverting input terminal of the operational amplifier OP are virtually short-circuited as in the operation in the period from Time U24 to Time U25; hence, the potentials of the wiring WRDL[1] to the wiring WRDL[n] become $V_{RF}$.

At this time, the transistors M1 in the memory cell MC[2,1] to the memory cell MC[2,n] in the second row of the memory cell array MCA are turned on, so that the potential $V_{RF}=(V_M+V_{OB})/2$ is supplied to the output terminal of the FTJ element FJAa and the input terminal of the FTJ element FJAb in each of the memory cell MC[2,1] to the memory cell MC[2,n]. Thus, a voltage $V_M$-$V_{RF}$=$(V_M-V_{OB})/2$ is applied between the input terminal and the output terminal of the FTJ element FJAa, and a voltage $V_{RF}$-$V_{OB}$=$(V_M-V_{OB})/2$ is applied between the input terminal and the output terminal of the FTJ element FJAb.

Then, as in the operation in the period from Time U24 to Time U25, a difference in the amount of currents flowing between the input terminals and the output terminals of the FTJ element FJAa and the FTJ element FJAb is converted into a voltage value by the current-voltage circuit including the operational amplifier OP and the load LE of the circuit RDD; hence, the data D[2,1] to the data D[2,n] held in the memory cell MC[2,1] to the memory cell MC[2,n] in the second row of the memory cell array MCA can be read as the voltage values.

In the period from Time U30 to Time U31, a low-level potential is supplied to the wiring SL2. Thus, the switch SW2 is turned off, and electrical continuity between the circuit RDD and the wiring WRDL[1] to the wiring WRDL[n] is broken. At this time, the potentials of the wiring WRDL[1] to the wiring WRDL[n] decrease from $V_{RF}$ and become a ground potential.

In the period from Time U32 to Time U33, the operation of reading data from the memory cells MC positioned in the third row to the (m−1)th row of the memory cell array MCA is performed in a manner similar to that of the operation of reading data from the memory cells MC positioned in the first row of the memory cell array MCA in the period from Time U22 to Time U27, and the operation of reading data from the memory cells MC positioned in the second row of the memory cell array MCA in the period from Time U27 to Time U32.

In the period from Time U33 to Time U38, the circuit WRWD supplies a high-level potential to the wiring WRWL[m]. In addition, the circuit WRWD supplies a low-level potential to the wiring WRWL[1] to the wiring WRWL[m−1]. Accordingly, in the memory cell array MCA, the high-level potential is supplied to the gates of the transistors M1a and the transistors M1b included in the memory cell MC[m, 1] to the memory cell MC[m,n] positioned in the m-th row; hence, the transistors M1a and the transistors M1b included in the memory cell MC[m,1] to the memory cell MC[m,n] are turned on. Moreover, in the memory cell array MCA, the low-level potential is supplied to the gates of the transistors M1a and the transistors M1b included in the memory cell MC[1,1] to the memory cell MC[m−1,n] positioned in the first row to the (m−1)th row; thus, the transistors M1a and the transistors M1*b* included in the memory cell MC[1,1] to the memory cell MC[m–1,n] are turned off.

In the period from Time U34 to Time U37, the circuit FECD supplies the potential $V_M$ to the wiring FCA[m] and supplies the potential $V_{OB}$ to the wiring FCB[m]. Moreover, the circuit FECD supplies the potential $V_{OA}$ to the wiring FCA[1] to the wiring FCA[m–1] and supplies the potential $V_{OB}$ to the wiring FCB[1] to the wiring FCB[m–1].

In the period from Time U35 to Time U36, a high-level potential is supplied to the wiring SL2. Thus, the switch SW2 is turned on, and electrical continuity is established between the circuit RDD and the wiring WRDL[1] to the wiring WRDL[n]. The inverting input terminal and the non-inverting input terminal of the operational amplifier OP are virtually short-circuited as in the operation in the period from Time U24 to Time U25; hence, the potentials of the wiring WRDL[1] to the wiring WRDL[n] become $V_{RF}$.

At this time, the transistors M1*a* and the transistors M1*b* in the memory cell MC[m,1] to the memory cell MC[m,n] in the m-th row of the memory cell array MCA are turned on, so that the potential $V_{RF}=(V_M+V_{OB})/2$ is supplied to the output terminal of the FTJ element FJAa and the input terminal of the FTJ element FJAb in each of the memory cell MC[m,1] to the memory cell MC[m,n]. Thus, a voltage $V_M-V_{RF}=(V_M-V_{OB})/2$ is applied between the input terminal and the output terminal of the FTJ element FJAa, and a voltage $V_{RF}-V_{OB}=(V_M-V_{OB})/2$ is applied between the input terminal and the output terminal of the FTJ element FJAb.

Then, as in the operation in the period from Time U24 to Time U25, a difference in the amount of currents flowing between the input terminals and the output terminals of the FTJ element FJAa and the FTJ element FJAb is converted into a voltage value by the current-voltage circuit including the operational amplifier OP and the load LE of the circuit RDD; hence, the data D[m,1] to the data D[m,n] held in the memory cell MC[m,1] to the memory cell MC[m,n] in the m-th row of the memory cell array MCA can be read as the voltage values.

Note that in the timing chart of FIG. 10, as the operation after the operation of reading data from the memory cell MC[1,1] to the memory cell MC[m,n] ends (operation from Time U38 to Time U39), for example, a high-level potential is supplied to the wiring SL1 so that the switch SW1 is turned on, and the circuit WDD supplies a ground potential as an initialization potential to the wiring WRDL [1] to the wiring WRDL[n] through the switch SW1. As an example, the circuit FECD supplies the potential $V_{OA}$ to the wiring FCA[1] to the wiring FCA[m] and supplies the potential $V_{OB}$ to the wiring FCB[1] to the wiring FCB[m].

Reading Operation Example 2

Next, an example of the operation of reading data from the memory cells MC of the memory device 100, which is different from that in the timing chart in FIG. 10, is described.

Figure 11:
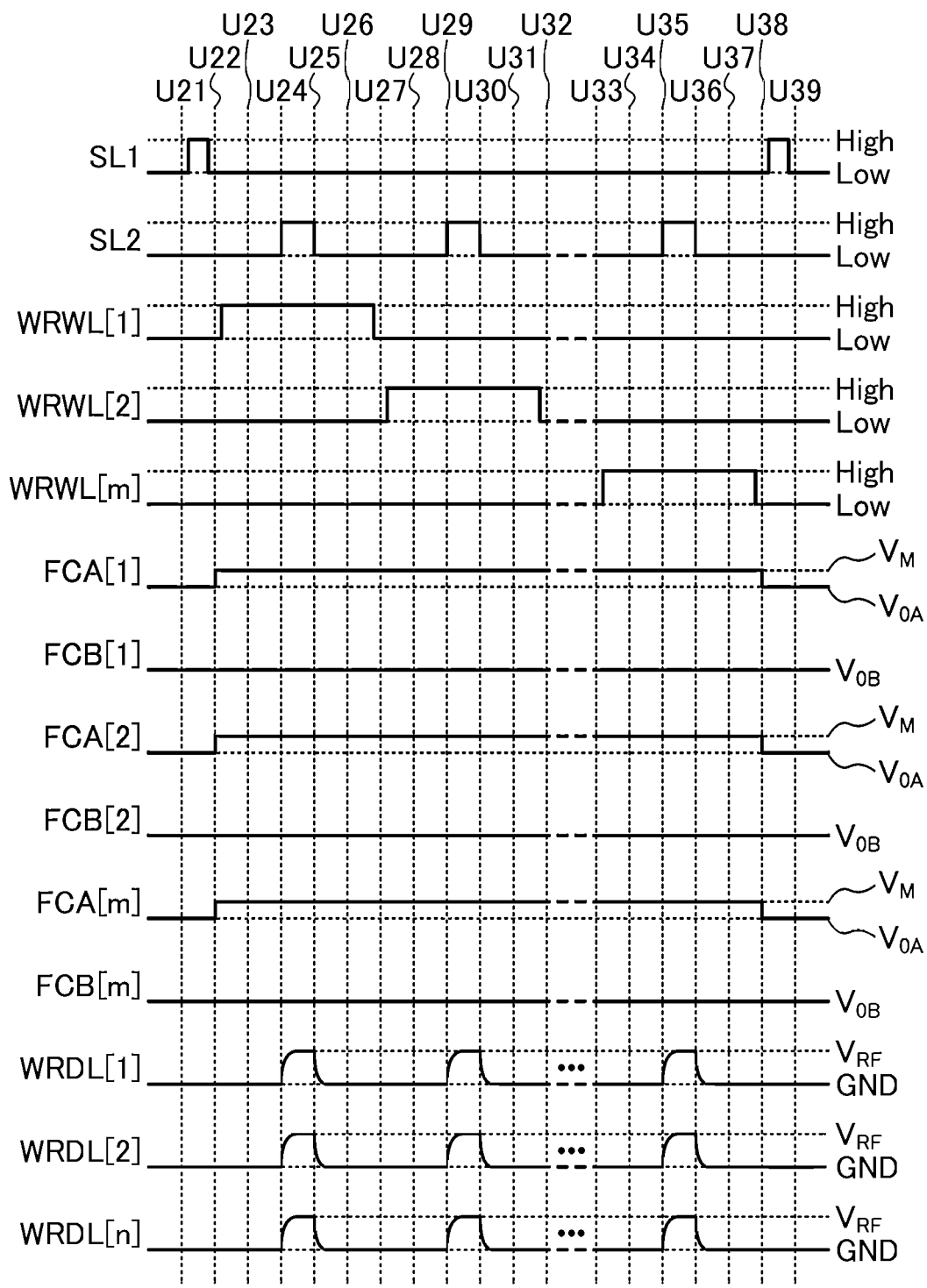
FIG. 11 is a timing chart showing an operation example of a memory device.

A timing chart in FIG. 11 shows a reading operation example different from the reading operation example in the timing chart in FIG. 10. Like the timing chart in FIG. 10, the timing chart in FIG. 11 shows changes in the potentials of the wiring SL1, the wiring SL2, the wiring WRWL[1], the wiring WRWL[1], the wiring WRWL[m], the wiring FCA [1], the wiring FCB[1], the wiring FCA[1], the wiring FCB[1], the wiring FCA[m], the wiring FCB[m], the wiring WRDL[1], the wiring WRDL[2], and the wiring WRDL[n] in the period from Time U21 to Time U39 and around the period.

The reading operation in the timing chart of FIG. 11 differs from the reading operation in the timing chart of FIG. 10 in that the wiring FCA[1] to the wiring FCA[m] have the potential $V_M$ in the period from Time U22 to Time U38.

In the period from Time U22 to Time U38 in the timing chart of FIG. 11, $V_M$ is input to the wiring FCA[1] to the wiring FCA[m] and $V_{OB}$ is input to the wiring FCB[1] to the wiring FCB[m]; thus, in the period from Time U22 to Time U38, $V_M$ is input to the input terminals of the FTJ elements FJAa included in the memory cell MC[1,1] to the memory cell MC[m,n], and $V_{OB}$ is input to the output terminals of the FTJ elements FJAb included in the memory cell MC[1,1] to the memory cell MC[m,n].

In this operation example, the memory cell MC from which data is read can be selected from the memory cell array MCA by inputting a high-level potential (denoted as High in FIG. 11) to any one of the wiring WRWL[1] to the wiring WRWL[m] from the circuit WRWD and inputting a low-level potential (denoted as Low in FIG. 11) to the other wirings. For example, in the timing chart of FIG. 11, by supplying a high-level potential to the wiring WRWL[1] and supplying a low-level potential to the wiring WRWL[1] to the wiring WRWL[m] as in the period from Time U22 to Time U27, the memory cell MC[1,1] to the memory cell MC[1,*n*] positioned in the first row of the memory cell array MCA can be selected. Furthermore, in a period during which the memory cells MC in the first row of the memory cell array MCA are selected, by supplying a high-level potential to the wiring SL2 as in the period from Time U24 to Time U25, the voltage $V_M-V_{RF}$ is applied between the input terminal and the output terminal of the FTJ element FJAa and the voltage $V_{RF}-V_{OB}$ is applied between the input terminal and the output terminal of the FTJ element FJAb. Thus, a differential current between a current flowing through the FTJ element FJAa and a current flowing through the FTJ element FJAb flows between the memory cell MC and the wiring WRDL. By converting the differential current into a voltage value by the current-voltage circuit included in the circuit RDD, for example, data held in the memory cells MC positioned in the first row of the memory cell array MCA can be read.

Similarly, by supplying a high-level potential to the wiring WRWL[1] and supplying a low-level potential to the wiring WRWL[1] and the wiring WRWL [1] to the wiring WRWL[m] as in the period from Time U27 to Time U32, the memory cell MC[2,1] to the memory cell MC[2,*n*] positioned in the second row of the memory cell array MCA can be selected. Furthermore, in a period during which the memory cells MC in the second row of the memory cell array MCA are selected, by supplying a high-level potential to the wiring SL2 as in the period from Time U29 to Time U30, the voltage $V_M-V_{RF}$ is applied between the input terminal and the output terminal of the FTJ element FJAa and the voltage $V_{RF}-V_{OB}$ is applied between the input terminal and the output terminal of the FTJ element FJAb. Thus, a differential current between a current flowing through the FTJ element FJAa and a current flowing through the FTJ element FJAb flows between the memory cell MC and the wiring WRDL. By converting the differential current into a voltage value by the current-voltage circuit included in the circuit RDD, for example, data held in the memory cells MC positioned in the second row of the memory cell array MCA can be read.

Similarly, by supplying a high-level potential to the wiring WRWL[m] and supplying a low-level potential to the wiring WRWL[1] to the wiring WRWL[m–1] as in the period from Time U33 to Time U38, the memory cell MC[m,1] to the memory cell MC[m,n] positioned in the m-th row of the memory cell array MCA can be selected. Furthermore, in a period during which the memory cells MC in the m-th row of the memory cell array MCA are selected, by supplying a high-level potential to the wiring SL2 as in the period from Time U35 to Time U36, the voltage $V_M-V_{RF}$ is applied between the input terminal and the output terminal of the FTJ element FJAa and the voltage $V_{RF}-V_{OB}$ is applied between the input terminal and the output terminal of the FTJ element FJAb. Thus, a differential current between a current flowing through the FTJ element FJAa and a current flowing through the FTJ element FJAb flows between the memory cell MC and the wiring WRDL. By converting the differential current into a voltage value by the current-voltage circuit included in the circuit RDD, for example, data held in the memory cells MC positioned in the m-th row of the memory cell array MCA can be read.

That is, potential changes of the wiring WRWL[1] to the wiring WRWL[m] in the operation example of the timing chart in FIG. 11 can be similar to those in the operation example of the timing chart in FIG. 10.

In the operation of the timing chart in FIG. 11, at the time of reading data from the plurality of memory cells MC included in the memory cell array MCA, the potentials of the wiring FCA[1] to the wiring FCA[m] and the wiring FCB[1] to the wiring FCB[m] do not need to be changed in each memory cell MC subjected to reading. That is, employing the operation example of the timing chart in FIG. 11 enables the circuit FECD to have a configuration without a circuit that selects a wiring for transmitting a signal, such as a selector.

Reading Operation Example 3

Next, an example of the operation of reading data from the memory cells MC of the memory device 100, which is different from those in the timing charts in FIG. 10 and FIG. 11, is described.

Figure 12:
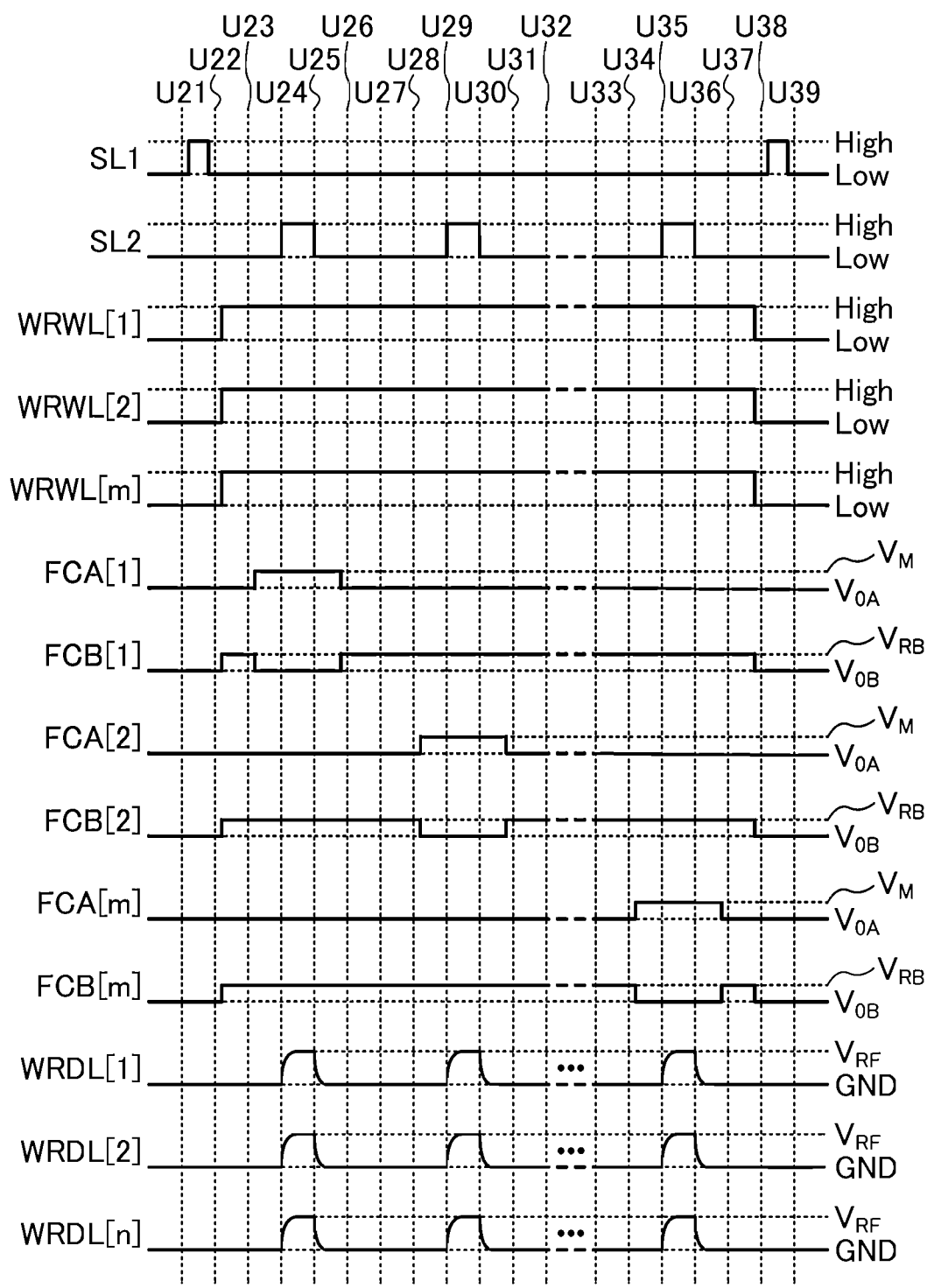
FIG. 12 is a timing chart showing an operation example of a memory device.

A timing chart in FIG. 12 shows a reading operation example different from the reading operation examples in the timing charts in FIG. 10 and FIG. 11. Like the timing charts in FIG. and FIG. 11, the timing chart in FIG. 12 shows changes in the potentials of the wiring SL1, the wiring SL2, the wiring WRWL[1], the wiring WRWL[1], the wiring WRWL[m], the wiring FCA[1], the wiring FCB[1], the wiring FCA[1], the wiring FCB[1], the wiring FCA[m], the wiring FCB[m], the wiring WRDL[1], the wiring WRDL[2], and the wiring WRDL[n] in the period from Time U21 to Time U39 and around the period.

The reading operation in the timing chart of FIG. 12 differs from the reading operation in the timing chart of FIG. 10 in that the wiring WRWL[1] to the wiring WRWL[m] have a high-level potential (denoted as High in FIG. 12) in the period from Time U22 to Time U38, and in potential changes of the wiring FCA[1] to the wiring FCA[m] and the wiring FCB[1] to the wiring FCB[m] in the period from Time U22 to Time U38.

Since a high-level potential is input to the wiring WRWL[1] to the wiring WRWL[m] in the period from Time U22 to Time U38 in the timing chart of FIG. 12, the high-level potential is input to the gates of the transistors M1a and the transistors M1b in the memory cell MC[1,1] to the memory cell MC[m,n] in the period from Time U22 to Time U38. Thus, the transistors M1a and the transistors M1b in the memory cell MC[1,1] to the memory cell MC[m,n] are turned on.

In the period from Time U23 to Time U38 in the timing chart of FIG. 12, the circuit FECD inputs $V_{RB}$, for example, to the wiring FCB[1] to the wiring FCB[m] unless otherwise specified. For example, $V_{RB}$ is a potential which is higher than $V_{RF}$ and lower than $V_{1B}$ and with which polarization is not caused (the polarization direction is not changed) in the FTJ element FJAb when the potential of the input terminal of the FTJ element FJAb is a ground potential or $V_{RF}$. Note that since the FTJ element FJAb has rectifying properties, when the potential of the output terminal of the FTJ element FJAb is $V_{RB}$ and the potential of the input terminal of the FTJ element FJAb is lower than $V_{RB}$, a current does not flow in the direction from the input terminal to the output terminal of the FTJ element.

In the period from Time U23 to Time U26 in the timing chart of FIG. 12, the potential $V_M$ is supplied to the wiring FCA[1] and the potential $V_{OB}$ is supplied to the wiring FCB[1]. The potential $V_{OA}$ is supplied to the wiring FCA[1] to the wiring FCA[m], and the potential $V_{RB}$ is supplied to the wiring FCB[1] to the wiring FCB[m]. At this time, $V_M$ is input to the input terminals of the FTJ elements FJAa included in the memory cell MC[1,1] to the memory cell MC[1,n], and $V_{OB}$ is input to the output terminals of the FTJ elements FJAb included in the memory cell MC[1,1] to the memory cell MC[1,n]. Here, in the case where the potentials of the output terminal of the FTJ element FJAa and the input terminal of the FTJ element FJAb are higher than $V_{OB}$ and lower than $V_M$, a current flows between the input terminal and the output terminal of each of the FTJ element FJAa and the FTJ element FJAb. Meanwhile, in the memory cells MC other than those in the first row of the memory cell array MCA, the potential of the input terminal of the FTJ element FJAa is $V_{OA}$ and the potential of the output terminal of the FTJ element FJAb is $V_{RB}$; hence, in the case where the potentials of the output terminal of the FTJ element FJAa and the input terminal of the FTJ element FJAb are higher than or equal to a ground potential and lower than $V_{RB}$, a current does not flow through the FTJ element FJAa and the FTJ element FJAb.

Then, by supplying a high-level potential to the wiring SL2 in the period from Time U24 to Time U25, the potentials of the output terminals of the FTJ elements FJAa and the input terminals of the FTJ elements FJAb in the memory cell MC[1,1] to the memory cell MC[1,n] positioned in the first row of the memory cell array MCA become $V_{RF}$. At this time, the potential of the input terminal of the FTJ element FJAa is $V_M$, the potentials of the output terminal of the FTJ element FJAa and the input terminal of the FTJ element FJAb are $V_{RF}$, and the potential of the input terminal of the FTJ element FJAa is $V_{OB}$; thus, a current corresponding to the polarization direction flows through each of the FTJ element FJAa and the FTJ element FJAb, and a differential current between the current flowing through the FTJ element FJAa and the current flowing through the FTJ element FJAb flows to the circuit RDD through the wiring WRDL. Meanwhile, in the memory cells MC positioned in the rows other than the first row of the memory cell array MCA, the potential of the input terminal of the FTJ element FJAa is $V_{OA}$, the potentials of the output terminal of the FTJ element FJAa and the input terminal of the FTJ element FJAb are $V_{RF}$, and the potential of the output terminal of the FTJ element FJAb is $V_{RB}$; thus, a current does not flow through the FTJ element FJAa and the FTJ element FJAb, and the amount of current flowing between the circuit RDD and the memory cells MC positioned in the rows other than the first row of the memory cell array MCA can be regarded as zero. Consequently, the differential currents of the memory cell MC[1,1] to the memory cell MC[1,n] positioned in the first row of the memory cell array MCA are input to the circuit RDD, whereby the circuit RDD can read data held in the memory cell MC[1,1] to the memory cell MC[1,n].

Similarly, in the period from Time U28 to Time U31, the potential $V_M$ is supplied to the wiring FCA[1] and the potential $V_{OB}$ is supplied to the wiring FCB[1]. The potential $V_{OA}$ is supplied to the wiring FCA[1] and the wiring FCA[1] to the wiring FCA[m], and the potential $V_{RB}$ is supplied to the wiring FCB[1] and the wiring FCB[1] to the wiring FCB[m]. At this time, $V_M$ is input to the input terminals of the FTJ elements FJAa included in the memory cell MC[2,1] to the memory cell MC[2,n], and $V_{OB}$ is input to the output terminals of the FTJ elements FJAb included in the memory cell MC[2,1] to the memory cell MC[2,n]. Here, in the case where the potentials of the output terminal of the FTJ element FJAa and the input terminal of the FTJ element FJAb are higher than $V_{OB}$ and lower than $V_M$, a current flows between the input terminal and the output terminal of each of the FTJ element FJAa and the FTJ element FJAb. Meanwhile, in the memory cells MC other than those in the second row of the memory cell array MCA, the potential of the input terminal of the FTJ element FJAa is $V_{OA}$ and the potential of the output terminal of the FTJ element FJAb is $V_{RB}$; hence, in the case where the potentials of the output terminal of the FTJ element FJAa and the input terminal of the FTJ element FJAb are higher than or equal to a ground potential and lower than $V_{RB}$, a current does not flow through the FTJ element FJAa and the FTJ element FJAb.

Then, by supplying a high-level potential to the wiring SL2 in the period from Time U29 to Time U30, the potentials of the output terminals of the FTJ elements FJAa and the input terminals of the FTJ elements FJAb in the memory cell MC[2,1] to the memory cell MC[2,n] positioned in the second row of the memory cell array MCA become $V_{RF}$. At this time, the potential of the input terminal of the FTJ element FJAa is $V_M$, the potentials of the output terminal of the FTJ element FJAa and the input terminal of the FTJ element FJAb are $V_{RF}$, and the potential of the input terminal of the FTJ element FJAa is $V_{OB}$; thus, a current corresponding to the polarization direction flows through each of the FTJ element FJAa and the FTJ element FJAb, and a differential current between the current flowing through the FTJ element FJAa and the current flowing through the FTJ element FJAb flows to the circuit RDD through the wiring WRDL. Meanwhile, in the memory cells MC positioned in the rows other than the second row of the memory cell array MCA, the potential of the input terminal of the FTJ element FJAa is $V_{OA}$, the potentials of the output terminal of the FTJ element FJAa and the input terminal of the FTJ element FJAb are $V_{RF}$, and the potential of the output terminal of the FTJ element FJAb is $V_{RB}$; thus, a current does not flow through the FTJ element FJAa and the FTJ element FJAb, and the amount of current flowing between the circuit RDD and the memory cells MC positioned in the rows other than the second row of the memory cell array MCA can be regarded as zero. Consequently, the differential currents of the memory cell MC[2,1] to the memory cell MC[2,n] positioned in the second row of the memory cell array MCA are input to the circuit RDD, whereby the circuit RDD can read data held in the memory cell MC[2,1] to the memory cell MC[2,n].

Similarly, in the period from Time U34 to Time U37, the potential $V_M$ is supplied to the wiring FCA[m] and the potential $V_{OB}$ is supplied to the wiring FCB[m]. The potential $V_{OA}$ is supplied to the wiring FCA[1] to the wiring FCA[m-1], and the potential $V_{RB}$ is supplied to the wiring FCB[1] to the wiring FCB[m-1]. $V_M$ is input to the input terminals of the FTJ elements FJAa included in the memory cell MC[m,1] to the memory cell MC[m,n], and $V_{OB}$ is input to the output terminals of the FTJ elements FJAb included in the memory cell MC[m,1] to the memory cell MC[m,n]. Here, in the case where the potentials of the output terminal of the FTJ element FJAa and the input terminal of the FTJ element FJAb are higher than $V_{OB}$ and lower than $V_M$, a current flows between the input terminal and the output terminal of each of the FTJ element FJAa and the FTJ element FJAb. Meanwhile, in the memory cells MC other than those in the m-th row of the memory cell array MCA, the potential of the input terminal of the FTJ element FJAa is $V_{OA}$ and the potential of the output terminal of the FTJ element FJAb is $V_{RB}$; hence, in the case where the potentials of the output terminal of the FTJ element FJAa and the input terminal of the FTJ element FJAb are higher than or equal to a ground potential and lower than $V_{RB}$, a current does not flow through the FTJ element FJAa and the FTJ element FJAb.

Then, by supplying a high-level potential to the wiring SL2 in the period from Time U35 to Time U36, the potentials of the output terminals of the FTJ elements FJAa and the input terminals of the FTJ elements FJAb in the memory cell MC[m,1] to the memory cell MC[m,n] positioned in the m-th row of the memory cell array MCA become $V_{RF}$. At this time, the potential of the input terminal of the FTJ element FJAa is $V_M$, the potentials of the output terminal of the FTJ element FJAa and the input terminal of the FTJ element FJAb are $V_{RF}$, and the potential of the input terminal of the FTJ element FJAa is $V_{OB}$; thus, a current corresponding to the polarization direction flows through each of the FTJ element FJAa and the FTJ element FJAb, and a differential current between the current flowing through the FTJ element FJAa and the current flowing through the FTJ element FJAb flows to the circuit RDD through the wiring WRDL. Meanwhile, in the memory cells MC positioned in the rows other than the m-th row of the memory cell array MCA, the potential of the input terminal of the FTJ element FJAa is $V_{OA}$, the potentials of the output terminal of the FTJ element FJAa and the input terminal of the FTJ element FJAb are $V_{RF}$, and the potential of the output terminal of the FTJ element FJAb is $V_{RB}$; thus, a current does not flow through the FTJ element FJAa and the FTJ element FJAb, and the amount of current flowing between the circuit RDD and the memory cells MC positioned in the rows other than the m-th row of the memory cell array MCA can be regarded as zero. Consequently, the differential currents of the memory cell MC[m,1] to the memory cell MC[m,n] positioned in the m-th row of the memory cell array MCA are input to the circuit RDD, whereby the circuit RDD can read data held in the memory cell MC[m,1] to the memory cell MC[m,n].

That is, in the operation example of the timing chart in FIG. 12, the wiring FCA[1] to the wiring FCA[m] function as selection signal lines for selecting, from the memory cell array MCA, the memory cells MC subjected to reading. Therefore, in the operation example of the timing chart in FIG. 12, the potentials of the wiring WRWL[1] to the wiring WRWL[m] do not need to be changed in each memory cell MC subjected to reading. Thus, employing the operation example of the timing chart in FIG. 12 enables the circuit RDD to have a configuration without a circuit that selects a wiring for transmitting a signal, such as a selector.

Note that this embodiment can be combined with any of the other embodiments in this specification as appropriate.

Embodiment 3

This embodiment describes structure examples of the semiconductor device described in the above embodiments and structure examples of transistors that can be used in the semiconductor device described in the above embodiments.

Structure Example 1 of Semiconductor Device

Figure 13:
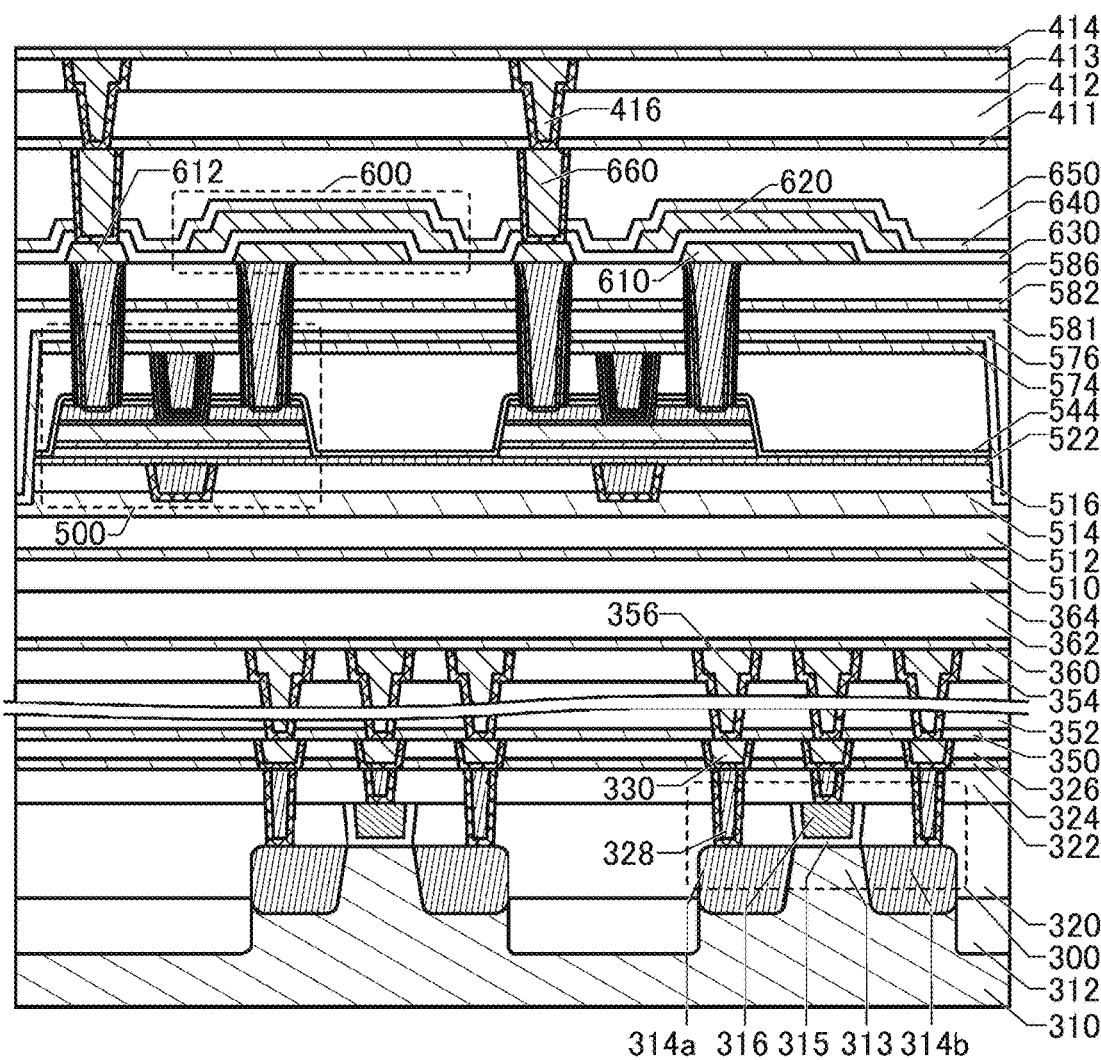
FIG. 13 is a schematic cross-sectional view illustrating a structure example of a semiconductor device.
Figure 14A:
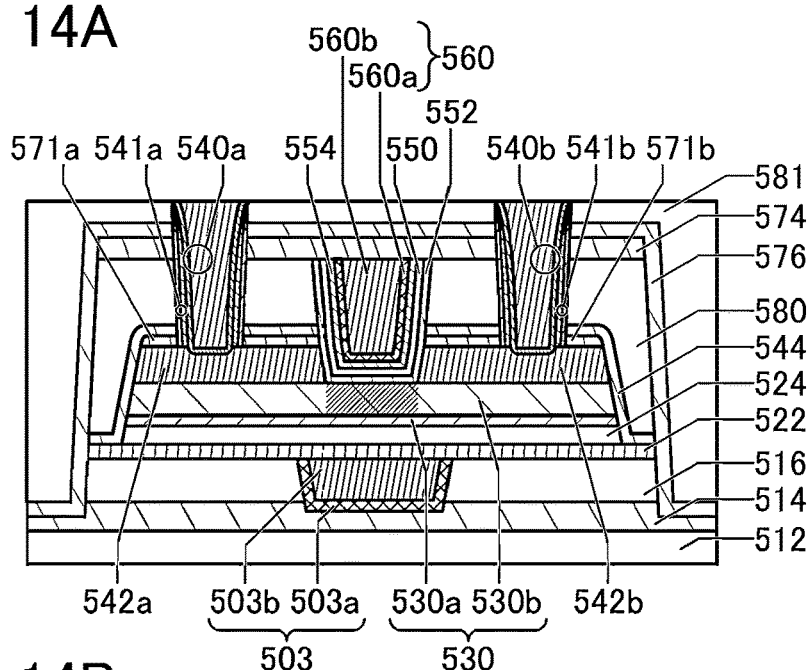
FIG. 14A to FIG. 14C are schematic cross-sectional views illustrating structure examples of transistors.
Figure 14B:
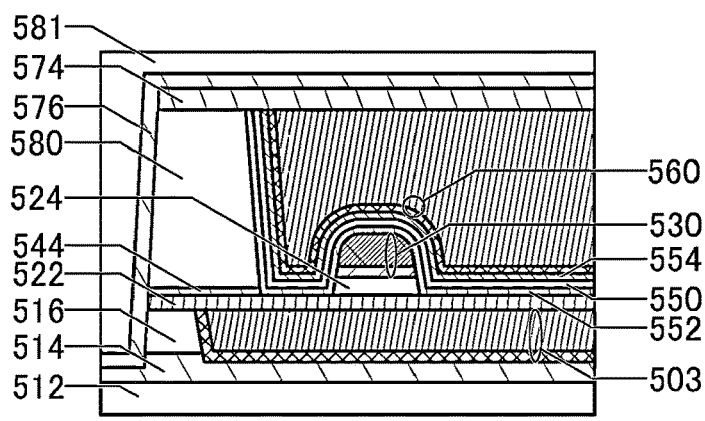
Figure 14C:
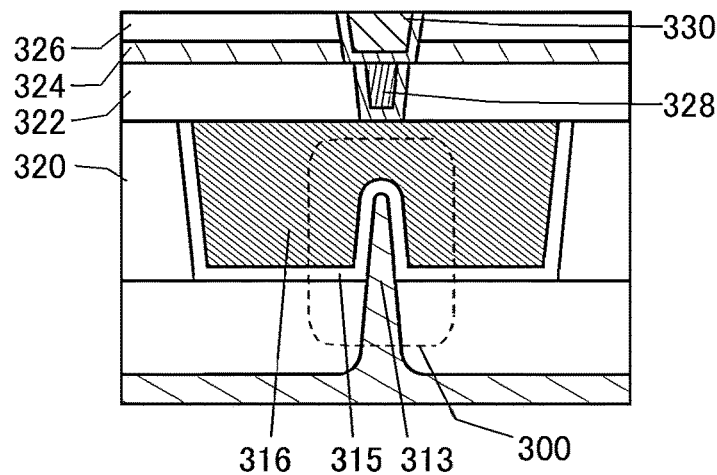

FIG. 13 shows a semiconductor device including a memory cell including a capacitor, and the semiconductor device includes a transistor 300, a transistor 500, and a capacitor 600. FIG. 14A is a cross-sectional view of the transistor 500 in the channel length direction, FIG. 14B is a cross-sectional view of the transistor 500 in the channel width direction, and FIG. 14C is a cross-sectional view of the transistor 300 in the channel width direction.

The transistor 500 is a transistor containing a metal oxide in a channel formation region (an OS transistor). The transistor 500 has features that the off-state current is low and that the field-effect mobility hardly changes even at high temperatures. When the transistor 500 is used in a semiconductor device, for example, used as the transistor M1 or the like included in the memory cell MC described in the above embodiments, a semiconductor device whose operating capability is less likely to deteriorate even at high temperatures can be obtained. In particular, when the transistor 500 is used as the transistor M1, for example, utilizing the feature of low off-state current enables long-term retention of a potential written to the capacitor in the memory cell MC.

The transistor 500 is provided above the transistor 300, for example, and the capacitor 600 is provided above the transistor 300 and the transistor 500, for example. Note that the capacitor 600 can be a capacitor that retains a potential corresponding to data written to a memory cell, for example. Note that depending on a circuit configuration, the capacitor 600 illustrated in FIG. 13 is not necessarily provided.

The transistor 300 is provided on a substrate 310 and includes an element isolation layer 312, a conductor 316, an insulator 315, a semiconductor region 313 that is part of the substrate 310, and a low-resistance region 314a and a low-resistance region 314b functioning as a source region and a drain region. Note that the transistor 300 can be used, for example, as the transistors included in the circuit WDD, the circuit RDD, the circuit WRWD, the circuit FECD, and the like described in the above embodiments. Note that depending on the structure of the semiconductor device of one embodiment of the present invention, a gate of the transistor 300 can be electrically connected to one of a source and a drain of the transistor 500; alternatively, one of a source and a drain of the transistor 300 can be electrically connected to one of the source and the drain of the transistor 500; alternatively, one of the source and the drain of the transistor 300 can be electrically connected to a gate of the transistor 500; alternatively, the terminals of the transistor 300 can be electrically connected to neither the terminals of the transistor 500 nor the terminals of the capacitor 600.

A semiconductor substrate (e.g., a single crystal substrate or a silicon substrate) is preferably used as the substrate 310.

As illustrated in FIG. 14C, in the transistor 300, a top surface and a side surface in the channel width direction of the semiconductor region 313 are covered with the conductor 316 with the insulator 315 therebetween. Such a Fin-type transistor 300 can have an increased effective channel width, and thus the transistor 300 can have improved on-state characteristics. In addition, since contribution of an electric field of a gate electrode can be increased, the off-state characteristics of the transistor 300 can be improved.

Note that the transistor 300 may be either a p-channel transistor or an n-channel transistor.

A region of the semiconductor region 313 where a channel is formed, a region in the vicinity thereof, the low-resistance region 314a and the low-resistance region 314b functioning as a source region and a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), GaN (gallium nitride), or the like. A structure may be employed in which silicon whose effective mass is controlled by applying stress to the crystal lattice and changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used in the semiconductor region 313.

For the conductor 316 functioning as a gate electrode, a semiconductor material such as silicon containing an element that imparts n-type conductivity, such as arsenic or phosphorus, or an element that imparts p-type conductivity, such as boron, or a conductive material such as a metal material, an alloy material, or a metal oxide material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

The element isolation layer 312 is provided to separate a plurality of transistors on the substrate 310 from each other. The element isolation layer can be formed by, for example, a LOCOS (Local Oxidation of Silicon) method, an STI (Shallow Trench Isolation) method, a mesa isolation method, or the like.

Figure 15:
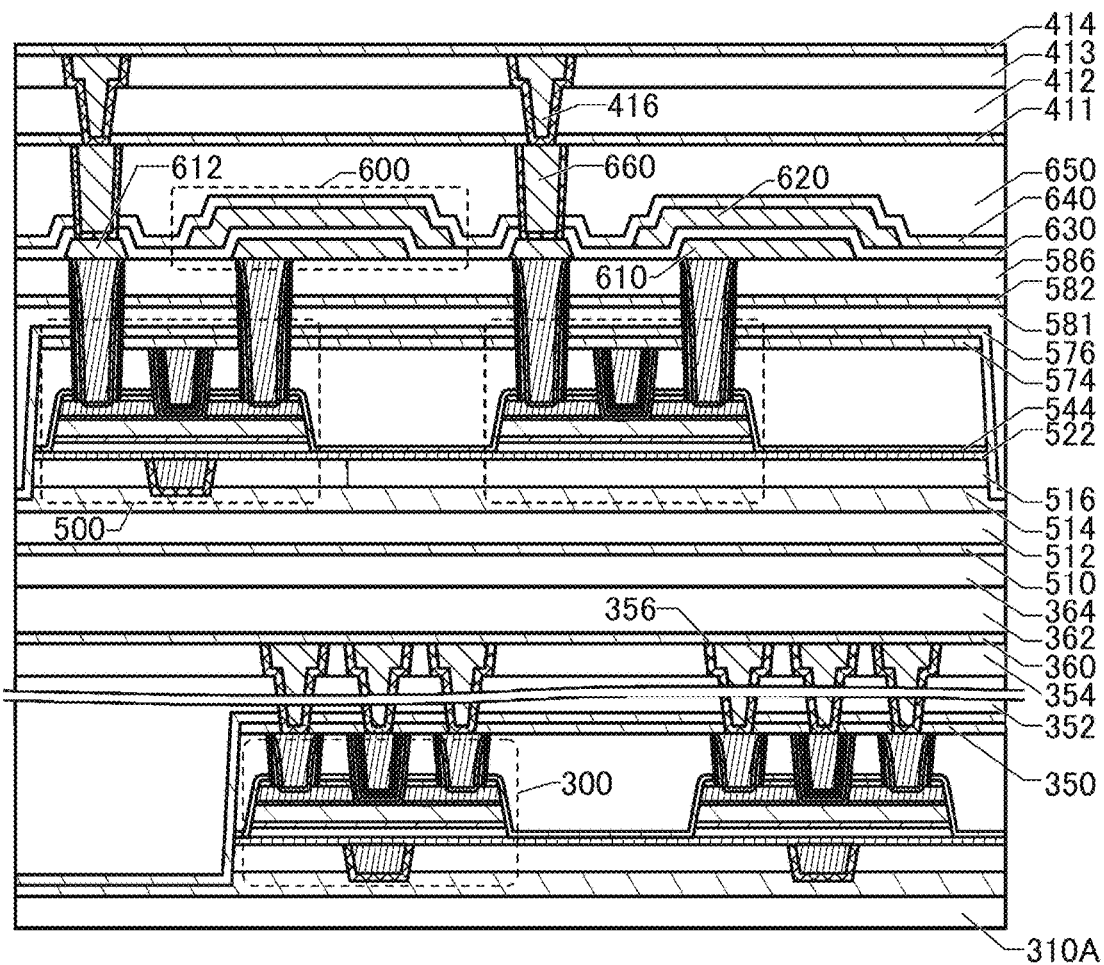
FIG. 15 is a schematic cross-sectional view illustrating a structure example of a semiconductor device.

Note that the transistor 300 illustrated in FIG. 13 is only an example and the structure is not limited thereto; an appropriate transistor can be used in accordance with a circuit configuration, a driving method, or the like. For example, the transistor 300 may have a planar structure instead of a FIN-type structure illustrated in FIG. 14C. For example, when a semiconductor device is configured as a single-polarity circuit using only OS transistors, the transistor 300 can have a structure similar to that of the transistor 500 using an oxide semiconductor, as illustrated in FIG. 15. Note that the details of the transistor 500 will be described later. In this specification and the like, a single-polarity circuit refers to a circuit including only either n-channel transistors or p-channel transistors.

Note that in FIG. 15, the transistor 300 is provided over a substrate 310A; in this case, a semiconductor substrate may be used as the substrate 310A, as in the case of the substrate 310 in the semiconductor device in FIG. 13. As the substrate 310A, for example, an SOI substrate, a glass substrate, a quartz substrate, a plastic substrate, a sapphire glass substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used. Examples of the glass substrate include barium borosilicate glass, aluminoborosilicate glass, and soda lime glass. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Other examples include polyamide, polyimide, aramid, an epoxy resin, an inorganic vapor deposition film, and paper.

In the transistor 300 illustrated in FIG. 13, an insulator 320, an insulator 322, an insulator 324, and an insulator 326 are stacked in this order from the substrate 310 side.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, or aluminum nitride can be used, for example.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for planarizing a level difference caused by the transistor 300 or the like covered with the insulator 320. For example, a top surface of the insulator 322 may be planarized by planarization treatment using a chemical mechanical polishing (CMP) method or the like to improve planarity.

As the insulator 324, it is preferable to use a film having a barrier property that prevents diffusion of hydrogen, impurities, or the like from the substrate 310, the transistor 300, or the like into a region where the transistor 500 is provided.

For the film having a barrier property against hydrogen, silicon nitride deposited by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 326 is preferably lower than that of the insulator 324. For example, the dielectric constant of the insulator 326 is preferably lower than 4, further preferably lower than 3. The dielectric constant of the insulator 326 is, for example, preferably 0.7 times or less, further preferably 0.6 times or less the dielectric constant of the insulator 324. When a material with a low permittivity is used for an interlayer film, parasitic capacitance generated between wirings can be reduced.

A conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. A plurality of conductors having a function of a plug or a wiring are collectively denoted by the same reference numeral in some cases. Moreover, in this specification and the like, a wiring and a plug connected to the wiring may be a single component. That is, in some cases, part of a conductor functions as a wiring or part of a conductor functions as a plug.

As a material of each of plugs and wirings (e.g., the conductor 328 and the conductor 330), a single layer or stacked layers of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 13, an insulator 350, an insulator 352, and an insulator 354 are provided to be stacked in this order above the insulator 326 and the conductor 330. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

For example, like the insulator 324, the insulator 350 is preferably formed using an insulator having a barrier property against impurities such as hydrogen and water. Like the insulator 326, the insulator 352 and the insulator 354 are preferably formed using an insulator having a relatively low dielectric constant to reduce the parasitic capacitance generated between wirings. Furthermore, the conductor 356 preferably contains a conductor having a barrier property against impurities such as hydrogen and water. In particular, the conductor having a barrier property against hydrogen is formed in an opening portion of the insulator 350 having a barrier property against hydrogen. With this structure, the transistor 300 and the transistor 500 can be separated by the barrier layer, so that diffusion of hydrogen from the transistor 300 into the transistor 500 can be inhibited.

Note that for the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is maintained. In that case, a structure is preferable in which a tantalum nitride layer having a barrier property against hydrogen is in contact with the insulator 350 having a barrier property against hydrogen.

An insulator 360, an insulator 362, and an insulator 364 are stacked in this order over the insulator 354 and the conductor 356.

Like the insulator 324 or the like, the insulator 360 is preferably formed using an insulator having a barrier property against impurities such as water and hydrogen. Thus, the insulator 360 can be formed using any of the materials usable for the insulator 324 or the like, for example.

The insulator 362 and the insulator 364 have functions of an interlayer insulating film and a planarization film. For example, like the insulator 324, the insulator 362 and the insulator 364 are preferably formed using an insulator having a barrier property against impurities such as water and hydrogen. Thus, the insulator 362 and/or the insulator 364 can be formed using any of the materials usable for the insulator 324.

An insulator 510, an insulator 512, an insulator 514, and an insulator 516 are stacked in this order and provided over the insulator 364. A substance with a barrier property against oxygen or hydrogen is preferably used for any of the insulator 510, the insulator 512, the insulator 514, and the insulator 516.

For example, as the insulator 510 and the insulator 514, it is preferable to use a film having a barrier property that prevents diffusion of hydrogen or impurities from the substrate 310, a region where the transistor 300 is provided, or the like into the region where the transistor 500 is provided. Thus, a material similar to that for the insulator 324 can be used.

For the film having a barrier property against hydrogen, silicon nitride deposited by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

For the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents passage of oxygen and impurities such as hydrogen and moisture that would cause a change in the electrical characteristics of the transistor. Accordingly, aluminum oxide can prevent entry of impurities such as hydrogen and moisture into the transistor 500 in and after the manufacturing process of the transistor. In addition, release of oxygen from the oxide included in the transistor 500 can be inhibited. Therefore, aluminum oxide is suitably used for a protective film of the transistor 500.

For the insulator 512 and the insulator 516, a material similar to that for the insulator 320 can be used, for example. Furthermore, when a material with a relatively low permittivity is used for these insulators, parasitic capacitance generated between wirings can be reduced. A silicon oxide film, a silicon oxynitride film, or the like can be used for the insulator 512 and the insulator 516, for example.

A conductor included in the transistor 500 (e.g., a conductor 503 illustrated in FIG. 14A and FIG. 14B) and the like are embedded in the insulator 510, the insulator 512, the insulator 514, and the insulator 516.

The transistor 500 is provided above the insulator 516.

As illustrated in FIG. 14A and FIG. 14B, the transistor 500 includes the insulator 516 over the insulator 514, the conductor 503 (a conductor 503a and a conductor 503b) provided to be embedded in the insulator 514 or the insulator 516, an insulator 522 over the insulator 516 and the conductor 503, an insulator 524 over the insulator 522, an oxide 530a over the insulator 524, an oxide 530b over the oxide 530a, a conductor 542a over the oxide 530b, an insulator 571a over the conductor 542a, a conductor 542b over the oxide 530b, an insulator 571b over the conductor 542b, an insulator 552 over the oxide 530b, an insulator 550 over the insulator 552, an insulator 554 over the insulator 550, a conductor 560 (a conductor 560a and a conductor 560b) that is positioned over the insulator 554 and overlaps with part of the oxide 530b, and an insulator 544 positioned over the insulator 522, the insulator 524, the oxide 530a, the oxide 530b, the conductor 542a, the conductor 542b, the insulator 571a, and insulator 571b. Here, as illustrated in FIG. 14A and FIG. 14B, the insulator 552 is in contact with a top surface of the insulator 522, a side surface of the insulator 524, a side surface of the oxide 530a, a side surface and a top surface of the oxide 530b, a side surface of the conductor 542, a side surface of the insulator 571, a side surface of the insulator 544, a side surface of an insulator 580, and a bottom surface of the insulator 550. A top surface of the conductor 560 is placed to be substantially level with an upper portion of the insulator 554, an upper portion of the insulator 550, an upper portion of the insulator 552, and a top surface of the insulator 580. An insulator 574 is in contact with part of at least part of the top surface of the conductor 560, the upper portion of the insulator 552, the upper portion of the insulator 550, the upper portion of the insulator 554, and the top surface of the insulator 580.

An opening reaching the oxide 530b is provided in the insulator 580 and the insulator 544. The insulator 552, the insulator 550, the insulator 554, and the conductor 560 are provided in the opening. The conductor 560, the insulator 552, the insulator 550, and the insulator 554 are provided between the conductor 542a and the conductor 542b and between the insulator 571a and the insulator 571b in the channel length direction of the transistor 500. The insulator 554 includes a region in contact with a side surface of the conductor 560 and a region in contact with a bottom surface of the conductor 560.

The oxide 530 preferably includes the oxide 530a placed over the insulator 524 and the oxide 530b placed over the oxide 530a. Including the oxide 530a under the oxide 530b makes it possible to inhibit diffusion of impurities into the oxide 530b from components formed below the oxide 530a.

Although a structure in which two layers, the oxide 530a and the oxide 530b, are stacked as the oxide 530 in the transistor 500 is described, the present invention is not limited thereto. For example, the transistor 500 can include a single-layer structure of the oxide 530b or a stacked-layer structure of three or more layers. Alternatively, the oxide 530a and the oxide 530b can each have a stacked-layer structure.

The conductor 560 functions as a first gate (also referred to as top gate) electrode, and the conductor 503 functions as a second gate (also referred to as back gate) electrode. The insulator 552, the insulator 550, and the insulator 554 function as a first gate insulator, and the insulator 522 and the insulator 524 function as a second gate insulator. Note that the gate insulator is also referred to as a gate insulating layer or a gate insulating film in some cases. The conductor 542a functions as one of a source and a drain, and the conductor 542b functions as the other of the source and the drain. At least part of a region of the oxide 530 that overlaps with the conductor 560 functions as a channel formation region.

Figure 16A:
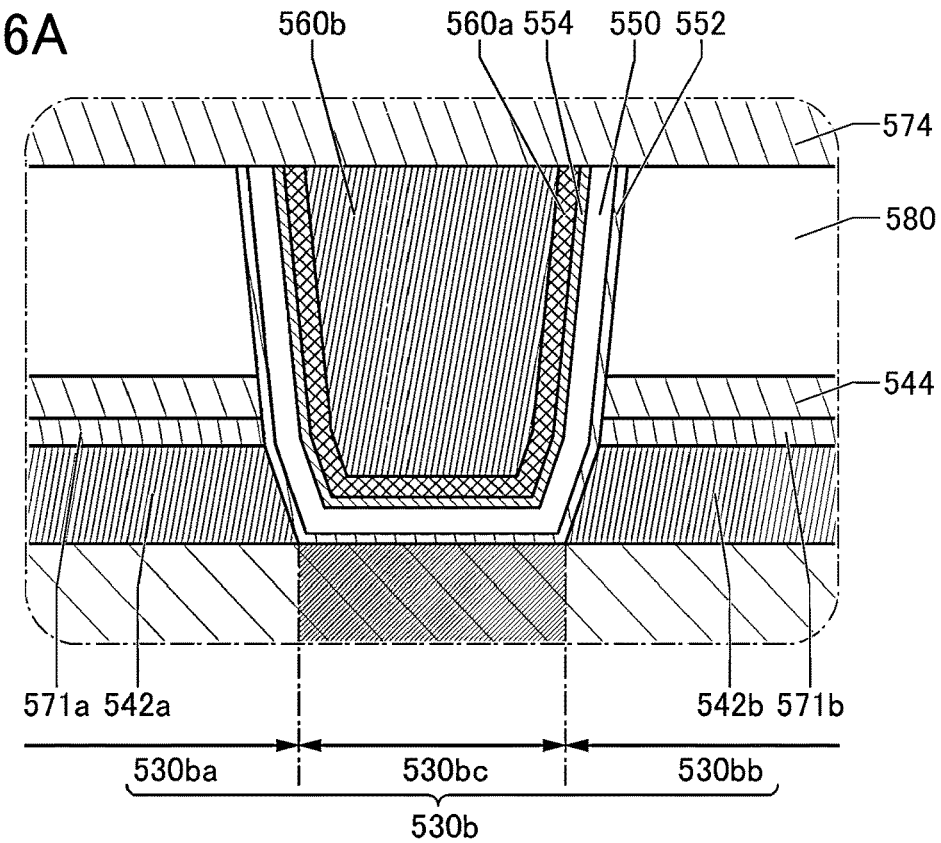
FIG. 16A and FIG. 16B are schematic cross-sectional views illustrating structure examples of a transistor.

Here, FIG. 16A shows an enlarged view of the vicinity of the channel formation region in FIG. 14A. Supply of oxygen to the oxide 530b forms the channel formation region in a region between the conductor 542a and the conductor 542b. Thus, as illustrated in FIG. 16A, the oxide 530b includes a region 530bc functioning as the channel formation region of the transistor 500 and a region 530ba and a region 530bb that are provided to sandwich the region 530bc and function as a source region and a drain region. At least part of the region 530bc overlaps with the conductor 560. In other words, the region 530bc is provided between the conductor 542a and the conductor 542b. The region 530ba is provided to overlap with the conductor 542a, and the region 530bb is provided to overlap with the conductor 542b.

The region 530bc functioning as the channel formation region has a smaller amount of oxygen vacancies (an oxygen vacancy in a metal oxide is sometimes referred to as $V_O$ in this specification and the like) or a lower impurity concentration than the region 530ba and the region 530bb to be a high-resistance region having a low carrier concentration. Thus, the region 530bc can be regarded as being i-type (intrinsic) or substantially i-type.

A transistor using a metal oxide is likely to change its electrical characteristics when impurities or oxygen vacancies ($V_O$) exist in a region of the metal oxide where a channel is formed, which might degrade the reliability. In some cases, hydrogen in the vicinity of an oxygen vacancy ($V_O$) forms a defect that is an oxygen vacancy ($V_O$) into which hydrogen enters (hereinafter sometimes referred to as $V_OH$), which generates an electron serving as a carrier. Therefore, when the region of the oxide semiconductor where a channel is formed includes oxygen vacancies, the transistor tends to have normally-on characteristics (characteristics with which, even when no voltage is applied to the gate electrode, the channel exists and current flows through the transistor). Thus, impurities, oxygen vacancies, and $V_OH$ are preferably reduced as much as possible in the region of the oxide semiconductor where a channel is formed.

The region 530ba and the region 530bb functioning as the source region and the drain region are each a low-resistance region with an increased carrier concentration because it includes a large amount of oxygen vacancies ($V_O$) or has a high concentration of an impurity such as hydrogen, nitrogen, or a metal element. In other words, the region 530ba and the region 530bb are each an n-type region having a higher carrier concentration and a lower resistance than the region 530bc.

The carrier concentration in the region 530bc functioning as the channel formation region is preferably lower than or equal to $1\times10^{18}$ cm$^{-3}$, further preferably lower than $1\times10^{17}$ cm$^{-3}$, still further preferably lower than $1\times10^{16}$ cm$^3$, yet further preferably lower than $1\times10^{13}$ cm$^3$, yet still further preferably lower than $1\times10^{12}$ cm$^{-3}$. Note that the lower limit of the carrier concentration in the region 530bc functioning as the channel formation region is not particularly limited and can be, for example, $1\times10^{-9}$ cm$^{-3}$.

Between the region 530bc and the region 530ba or the region 530bb, a region having a carrier concentration that is lower than or substantially equal to the carrier concentrations in the region 530ba and the region 530bb and higher than or substantially equal to the carrier concentration in the region 530bc may be formed. That is, the region functions as a junction region between the region 530bc and the region 530ba or the region 530bb. The hydrogen concentration in the junction region is lower than or substantially equal to the hydrogen concentrations in the region 530ba and the region 530bb and higher than or substantially equal to the hydrogen concentration in the region 530bc in some cases. The amount of oxygen vacancies in the junction region is smaller than or substantially equal to the amounts of oxygen vacancies in the region 530ba and the region 530bb and larger than or substantially equal to the amount of oxygen vacancies in the region 530bc in some cases.

Although FIG. 16A illustrates an example in which the region 530ba, the region 530bb, and the region 530bc are formed in the oxide 530b, the present invention is not limited thereto. For example, the above regions may be formed not only in the oxide 530b but also in the oxide 530a.

In the oxide 530, the boundaries between the regions are difficult to detect clearly in some cases. The concentration of a metal element and an impurity element such as hydrogen and nitrogen, which is detected in each region, may be gradually changed not only between the regions but also in each region. That is, the region closer to the channel formation region preferably has a lower concentration of a metal element and an impurity element such as hydrogen and nitrogen.

In the transistor 500, a metal oxide functioning as a semiconductor (such a metal oxide is hereinafter also referred to as an oxide semiconductor) is preferably used for the oxide 530 (the oxide 530a and the oxide 530b) including the channel formation region.

The metal oxide functioning as a semiconductor preferably has a band gap of 2 eV or more, further preferably 2.5 eV or more. With the use of such a metal oxide having a large band gap, the off-state current of the transistor can be reduced.

As the oxide 530, it is preferable to use, for example, a metal oxide such as an In-M-Zn oxide containing indium, the element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). Alternatively, an In—Ga oxide, an In—Zn oxide, or an indium oxide may be used as the oxide 530.

Here, the atomic ratio of In to the element M in the metal oxide used as the oxide 530b is preferably greater than the atomic ratio of In to the element M in the metal oxide used as the oxide 530a.

The oxide 530a is provided under the oxide 530b in the above manner, whereby impurities and oxygen can be inhibited from diffusing into the oxide 530b from components formed below the oxide 530a.

When the oxide 530a and the oxide 530b contain a common element (as the main component) besides oxygen, the density of defect states at an interface between the oxide 530a and the oxide 530b can be made low. Since the density of defect states at the interface between the oxide 530a and the oxide 530b can be made low, the influence of interface scattering on carrier conduction is small, and a high on-state current can be obtained.

The oxide 530b preferably has crystallinity. It is particularly preferable to use a CAAC-OS (c-axis aligned crystalline oxide semiconductor) as the oxide 530b.

The CAAC-OS is a metal oxide having a dense structure with high crystallinity and small amounts of impurities and defects (e.g., oxygen vacancies ($V_O$)). In particular, after the formation of a metal oxide, heat treatment is performed at a temperature at which the metal oxide does not become a polycrystal (e.g., higher than or equal to 400° C. and lower than or equal to 600° C.), whereby a CAAC-OS having a dense structure with higher crystallinity can be obtained. When the density of the CAAC-OS is increased in such a manner, diffusion of impurities or oxygen in the CAAC-OS can be further reduced.

On the other hand, a clear crystal grain boundary is difficult to observe in the CAAC-OS; thus, it can be said that a reduction in electron mobility due to the crystal grain boundary is less likely to occur. Hence, a metal oxide including a CAAC-OS is physically stable. Therefore, the metal oxide including a CAAC-OS is resistant to heat and has high reliability.

If impurities and oxygen vacancies exist in a region of an oxide semiconductor where a channel is formed, a transistor using the oxide semiconductor might have variable electrical characteristics and poor reliability. In some cases, hydrogen in the vicinity of an oxygen vacancy forms a defect that is the oxygen vacancy into which hydrogen enters ($V_OH$), which generates an electron serving as a carrier. Therefore, when the region of the oxide semiconductor where a channel is formed includes oxygen vacancies, the transistor tends to have normally-on characteristics (characteristics with which, even when no voltage is applied to the gate electrode, the channel exists and current flows through the transistor). Thus, impurities, oxygen vacancies, and $V_OH$ are preferably reduced as much as possible in the region of the oxide semiconductor where a channel is formed. In other words, it is preferable that the region of the oxide semiconductor where a channel is formed have a reduced carrier concentration and be of i-type (intrinsic) or substantially i-type.

As a countermeasure to the above, an insulator containing oxygen that is released by heating (hereinafter sometimes referred to as excess oxygen) is provided in the vicinity of the oxide semiconductor and heat treatment is performed, so that oxygen can be supplied from the insulator to the oxide semiconductor to reduce oxygen vacancies and $V_OH$. However, supply of an excess amount of oxygen to the source region or the drain region might cause a decrease in the on-state current or field-effect mobility of the transistor 500. Furthermore, a variation in the amount of oxygen supplied to the source region or the drain region in the substrate plane leads to a variation in characteristics of semiconductor devices including the transistors.

Therefore, the region 530*bc* functioning as the channel formation region in the oxide semiconductor is preferably an i-type or substantially i-type region with a reduced carrier concentration, whereas the region 530*ba* and the region 530*bb* functioning as the source region and the drain region are preferably n-type regions with high carrier concentrations. That is, it is preferable that oxygen vacancies and $V_OH$ in the region 530*bc* of the oxide semiconductor be reduced and the region 530*ba* and the region 530*bb* not be supplied with an excess amount of oxygen.

Thus, in this embodiment, microwave treatment is performed in an oxygen-containing atmosphere in a state where the conductor 542*a* and the conductor 542*b* are provided over the oxide 530*b* so that oxygen vacancies and $V_OH$ in the region 530*bc* can be reduced. Here, the microwave treatment refers to, for example, treatment using an apparatus including a power source that generates high-density plasma with the use of a microwave.

The microwave treatment in an oxygen-containing atmosphere converts an oxygen gas into plasma using a high-frequency wave such as a microwave or RF and activates the oxygen plasma. At this time, the region 530*bc* can also be irradiated with the high-frequency wave such as a microwave or RF. By the effect of the plasma, a microwave, or the like, $V_OH$ in the region 530*bc* can be cut; thus, hydrogen H can be removed from the region 530*bc* and an oxygen vacancy $V_O$ can be filled with oxygen. That is, the reaction "$V_OH \rightarrow H+V_O$" occurs in the region 530*bc*, so that the hydrogen concentration in the region 530*bc* can be reduced. As a result, oxygen vacancies and $V_OH$ in the region 530*bc* can be reduced to lower the carrier concentration.

In the microwave treatment in an oxygen-containing atmosphere, the high-frequency wave such as the microwave or RF, the oxygen plasma, or the like is blocked by the conductor 542*a* and the conductor 542*b* and does not affect the region 530*ba* nor the region 530*bb*. In addition, the effect of the oxygen plasma can be reduced by the insulator 571 and the insulator 580 that are provided to cover the oxide 530*b* and the conductor 542. Hence, a reduction in $V_OH$ and supply of an excess amount of oxygen do not occur in the region 530*ba* and the region 530*bb* in the microwave treatment, preventing a decrease in carrier concentration.

Microwave treatment is preferably performed in an oxygen-containing atmosphere after formation of an insulating film to be the insulator 552 or after formation of an insulating film to be the insulator 550. By performing the microwave treatment in an oxygen-containing atmosphere through the insulator 552 or the insulator 550 in such a manner, oxygen can be efficiently supplied into the region 530*bc*. In addition, the insulator 552 is provided to be in contact with the side surface of the conductor 542 and a surface of the region 530*bc*, thereby inhibiting oxygen more than necessary from being injected into the region 530*bc* and preventing the side surface of the conductor 542 from being oxidized. Furthermore, the side surface of the conductor 542 can be inhibited from being oxidized when an insulating film to be the insulator 550 is formed.

The oxygen injected into the region 530*bc* has any of a variety of forms such as an oxygen atom, an oxygen molecule, and an oxygen radical (also referred to as O radical which is an atom, a molecule, or an ion having an unpaired electron). Note that the oxygen injected into the region 530*bc* preferably has any one or more of the above forms, and is particularly preferably an oxygen radical. Furthermore, the film quality of the insulator 552 and the insulator 550 can be improved, leading to higher reliability of the transistor 500.

In the above manner, oxygen vacancies and $V_OH$ can be selectively removed from the region 530*bc* in the oxide semiconductor, whereby the region 530*bc* can be an i-type or substantially i-type region. Furthermore, supply of an excess amount of oxygen to the region 530*ba* and the region 530*bb* functioning as the source region and the drain region can be inhibited, and the conductivity can be maintained. As a result, a change in the electrical characteristics of the transistor 500 can be inhibited, and a variation in the electrical characteristics of the transistors 500 in the substrate plane can be reduced.

With the above structure, a semiconductor device with a small variation in transistor characteristics can be provided. A semiconductor device with favorable reliability can also be provided. A semiconductor device having favorable electrical characteristics can be provided.

As illustrated in FIG. 14B, a curved surface may be provided between a side surface of the oxide 530*b* and a top surface of the oxide 530*b* in a cross-sectional view of the transistor 500 in the channel width direction. In other words, an end portion of the side surface and an end portion of the top surface may be curved (hereinafter referred to as rounded).

The radius of curvature of the curved surface is preferably greater than 0 nm and less than the thickness of the oxide 530*b* in a region overlapping with the conductor 542, or less than half of the length of a region that does not have the curved surface. Specifically, the radius of curvature of the curved surface is greater than 0 nm and less than or equal to 20 nm, preferably greater than or equal to 1 nm and less than or equal to 15 nm, further preferably greater than or equal to 2 nm and less than or equal to 10 nm. Such a shape can improve the coverage of the oxide 530b with the insulator 552, the insulator 550, the insulator 554, and the conductor 560.

The oxide 530 preferably has a stacked-layer structure of a plurality of oxide layers with different chemical compositions. Specifically, the atomic ratio of the element M to a metal element that is a main component of the metal oxide used as the oxide 530a is preferably greater than the atomic ratio of the element M to a metal element that is a main component of the metal oxide used as the oxide 530b. In addition, the atomic ratio of the element M to In in the metal oxide used as the oxide 530a is preferably greater than the atomic ratio of the element M to In in the metal oxide used as the oxide 530b. Furthermore, the atomic ratio of In to the element M in the metal oxide used as the oxide 530b is preferably greater than the atomic ratio of In to the element M in the metal oxide used as the oxide 530a.

The oxide 530b is preferably an oxide having crystallinity, such as a CAAC-OS. An oxide having crystallinity, such as a CAAC-OS, has a dense structure with small amounts of impurities and defects (e.g., oxygen vacancies) and high crystallinity. This can inhibit oxygen extraction from the oxide 530b by the source electrode or the drain electrode. This can reduce oxygen extraction from the oxide 530b even when heat treatment is performed; thus, the transistor 500 is stable with respect to high temperatures in a manufacturing process (what is called thermal budget).

Here, the conduction band minimum gradually changes at a junction portion of the oxide 530a and the oxide 530b. In other words, the conduction band minimum at the junction portion of the oxide 530a and the oxide 530b continuously changes or is continuously connected. To achieve this, the density of defect states in a mixed layer formed at the interface between the oxide 530a and the oxide 530b is preferably made low.

Specifically, when the oxide 530a and the oxide 530b contain a common element as a main component besides oxygen, a mixed layer with a low density of defect states can be formed. For example, in the case where the oxide 530b is an In-M-Zn oxide, an In-M-Zn oxide, an M-Zn oxide, an oxide of the element M, an In—Zn oxide, an indium oxide, or the like may be used as the oxide 530a.

Specifically, as the oxide 530a, a metal oxide with a composition of In:M:Zn=1:3:4 [atomic ratio] or in the neighborhood thereof, or a composition of In:M:Zn=1:1:0.5 [atomic ratio] or in the neighborhood thereof is used. As the oxide 530b, a metal oxide with a composition of In:M:Zn=1:1:1 [atomic ratio] or in the neighborhood thereof, or a composition of In:M:Zn=4:2:3 [atomic ratio] or in the neighborhood thereof is used. Note that a composition in the neighborhood includes the range of ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

As illustrated in FIG. 14A or the like, the insulator 552 formed using aluminum oxide or the like is provided in contact with the top and side surfaces of the oxide 530, whereby indium contained in the oxide 530 is unevenly distributed in some cases at the interface between the oxide 530 and the insulator 552 and in its vicinity. Accordingly, the vicinity of the surface of the oxide 530 comes to have an atomic ratio close to that of an indium oxide or that of an In—Zn oxide. Such an increase in the atomic ratio of indium in the vicinity of the surface of the oxide 530, especially the vicinity of the surface of the oxide 530b, can increase the field-effect mobility of the transistor 500.

When the oxide 530a and the oxide 530b have the above structure, the density of defect states at the interface between the oxide 530a and the oxide 530b can be made low. Thus, the influence of interface scattering on carrier conduction is small, and the transistor 500 can have a high on-state current and excellent frequency characteristics.

At least one of the insulator 512, the insulator 514, the insulator 544, the insulator 571, the insulator 574, an insulator 576, and an insulator 581 preferably functions as a barrier insulating fil that inhibits diffusion of impurities such as water and hydrogen from the substrate side or above the transistor 500 into the transistor 500. Thus, for at least one of the insulator 512, the insulator 514, the insulator 544, the insulator 571, the insulator 574, the insulator 576, and the insulator 581, it is preferable to use an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (an insulating material through which the impurities are less likely to pass). Alternatively, it is preferable to use an insulating material having a function of inhibiting diffusion of oxygen (e.g., at least one of oxygen atoms, oxygen molecules, and the like) (an insulating material through which the oxygen is less likely to pass).

Note that in this specification, a barrier insulating film refers to an insulating film having a barrier property. A barrier property in this specification means a function of inhibiting diffusion of a targeted substance (also referred to as less easily transmitting the substance). In addition, a barrier property in this specification means a function of capturing and fixing (also referred to as gettering) a targeted substance.

An insulator having a function of inhibiting diffusion of oxygen and impurities such as water and hydrogen is preferably used for the insulator 512, the insulator 514, the insulator 544, the insulator 571, the insulator 574, the insulator 576, and the insulator 581; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 512, the insulator 544, and the insulator 576. For example, aluminum oxide or magnesium oxide, which has a function of capturing or fixing hydrogen well, is preferably used for the insulator 514, the insulator 571, the insulator 574, and the insulator 581. In such a case, impurities such as water and hydrogen can be inhibited from diffusing to the transistor 500 side from the substrate side through the insulator 512 and the insulator 514. Alternatively, impurities such as water and hydrogen can be inhibited from diffusing to the transistor 500 side from an interlayer insulating film and the like that are positioned on the outer side compared to the insulator 581. Alternatively, oxygen contained in the insulator 524 and the like can be inhibited from diffusing to the substrate side through the insulator 512 and the insulator 514. Alternatively, oxygen contained in the insulator 580 and the like can be inhibited from diffusing to above the transistor 500 through the insulator 574 and the like. In this manner, it is preferable that the transistor 500 be surrounded by the insulator 512, the insulator 514, the insulator 571, the insulator 544, the insulator 574, the insulator 576, and the insulator 581, which have a function of inhibiting diffusion of oxygen and impurities such as water and hydrogen.

Here, an oxide having an amorphous structure is preferably used for the insulator 512, the insulator 514, the insulator 544, the insulator 571, the insulator 574, the insulator 576, and the insulator 581. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 500 or provided around the transistor 500, hydrogen contained in the transistor 500 or hydrogen present around the transistor 500 can be captured or fixed. In particular, hydrogen contained in the channel formation region of the transistor 500 is preferably captured or fixed. The metal oxide having an amorphous structure is used as the component of the transistor 500 or provided around the transistor 500, whereby the transistor 500 and a semiconductor device that have favorable characteristics and high reliability can be manufactured.

Although each of the insulator 512, the insulator 514, the insulator 544, the insulator 571, the insulator 574, the insulator 576, and the insulator 581 preferably has an amorphous structure, a region having a polycrystalline structure may be partly formed. Alternatively, each of the insulator 512, the insulator 514, the insulator 544, the insulator 571, the insulator 574, the insulator 576, and the insulator 581 may have a multilayer structure in which a layer having an amorphous structure and a layer having a polycrystalline structure are stacked. For example, a stacked-layer structure in which a layer having a polycrystalline structure is formed over a layer having an amorphous structure may be employed.

The insulator 512, the insulator 514, the insulator 544, the insulator 571, the insulator 574, the insulator 576, and the insulator 581 can be deposited by a sputtering method, for example. Since a sputtering method does not need to use a molecule containing hydrogen as a deposition gas, the hydrogen concentrations in the insulator 512, the insulator 514, the insulator 544, the insulator 571, the insulator 574, the insulator 576, and the insulator 581 can be reduced. Note that the deposition method is not limited to a sputtering method, and a chemical vapor deposition (CVD) method, a molecular beam epitaxy (MBE) method, a pulsed laser deposition (PLD) method, an atomic layer deposition (ALD) method, or the like may be used as appropriate.

The resistivities of the insulator 512, the insulator 544, and the insulator 576 are preferably low in some cases. For example, by setting the resistivities of the insulator 512, the insulator 544, and the insulator 576 to approximately $1 \times 10^{13}$ $\Omega$cm, the insulator 512, the insulator 544, and the insulator 576 can sometimes reduce charge up of the conductor 503, the conductor 542, the conductor 560, or the like in treatment using plasma or the like in the manufacturing process of a semiconductor device. The resistivities of the insulator 512, the insulator 544, and the insulator 576 are preferably higher than or equal to $1 \times 10^{10}$ $\Omega$cm and lower than or equal to $1 \times 10^{15}$ $\Omega$cm.

The insulator 516, the insulator 574, the insulator 580, and the insulator 581 each preferably have a lower permittivity than the insulator 514. When a material with a low permittivity is used for an interlayer film, parasitic capacitance generated between wirings can be reduced. For the insulator 516, the insulator 580, and the insulator 581, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The insulator 581 is preferably an insulator functioning as an interlayer film, a planarization film, or the like, for example.

The conductor 503 is provided to overlap with the oxide 530 and the conductor 560. Here, the conductor 503 is preferably provided to be embedded in an opening formed in the insulator 516. Part of the conductor 503 is embedded in the insulator 514 in some cases.

The conductor 503 includes the conductor 503a and the conductor 503b. The conductor 503a is provided in contact with a bottom surface and a sidewall of the opening. The conductor 503b is provided to be embedded in a recessed portion formed in the conductor 503a. Here, the upper portion of the conductor 503b is substantially level with the upper portion of the conductor 503a and the upper portion of the insulator 516.

Here, for the conductor 503a, it is preferable to use a conductive material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms. Alternatively, it is preferable to use an insulating material having a function of inhibiting diffusion of oxygen (e.g., at least one of oxygen atoms, oxygen molecules, and the like).

When the conductor 503a is formed using a conductive material having a function of inhibiting diffusion of hydrogen, impurities such as hydrogen contained in the conductor 503b can be prevented from diffusing into the oxide 530 through the insulator 524 and the like. When the conductor 503a is formed using a conductive material having a function of inhibiting diffusion of oxygen, the conductivity of the conductor 503b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, the conductor 503a can be a single layer or stacked layers of the above conductive materials. For example, titanium nitride is used for the conductor 503a.

The conductor 503b is preferably formed using a conductive material containing tungsten, copper, or aluminum as its main component. For example, tungsten is used for the conductor 503b.

The conductor 503 sometimes functions as a second gate electrode. In that case, by changing a potential applied to the conductor 503 not in conjunction with but independently of a potential applied to the conductor 560, the threshold voltage (Vth) of the transistor 500 can be controlled. In particular, Vth of the transistor 500 can be higher in the case where a negative potential is applied to the conductor 503, and the off-state current can be reduced. Thus, a drain current at the time when a potential applied to the conductor 560 is 0 V can be lower in the case where a negative potential is applied to the conductor 503 than in the case where a negative potential is not applied to the conductor 503.

The electric resistivity of the conductor 503 is designed in consideration of the potential applied to the conductor 503, and the thickness of the conductor 503 is determined in accordance with the electric resistivity. The thickness of the insulator 516 is substantially equal to that of the conductor 503. The conductor 503 and the insulator 516 are preferably as thin as possible in the allowable range of the design of the conductor 503. When the thickness of the insulator 516 is reduced, the absolute amount of impurities such as hydrogen contained in the insulator 516 can be reduced, reducing the amount of the impurities to be diffused into the oxide 530.

When seen from above, the conductor 503 is preferably provided to be larger than a region of the oxide 530 that does not overlap with the conductor 542a or the conductor 542b. As illustrated in FIG. 14B, it is particularly preferable that the conductor 503 extend to a region beyond end portions of the oxide 530a and the oxide 530b in the channel width direction. That is, the conductor 503 and the conductor 560 preferably overlap with each other with the insulators therebetween on the outer side of the side surface of the oxide 530 in the channel width direction. With this structure, the channel formation region of the oxide 530 can be electrically surrounded by the electric field of the conductor 560 functioning as a first gate electrode and the electric field of the conductor 503 functioning as the second gate electrode. In this specification, a transistor structure in which a channel formation region is electrically surrounded by electric fields of a first gate and a second gate is referred to as a surrounded channel (S-channel) structure.

In this specification and the like, a transistor having the S-channel structure refers to a transistor having a structure in which a channel formation region is electrically surrounded by electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

As illustrated in FIG. 14B, the conductor 503 is extended to function as a wiring as well. However, without limitation to this structure, a structure in which a conductor functioning as a wiring is provided under the conductor 503 may be employed. In addition, the conductor 503 is not necessarily provided in each transistor. For example, the conductor 503 may be shared by a plurality of transistors.

Although the transistor 500 having a structure in which the conductor 503 is a stack of the conductor 503a and the conductor 503b is illustrated, the present invention is not limited thereto. For example, the conductor 503 may be provided to have a single-layer structure or a stacked-layer structure of three or more layers.

The insulator 522 and the insulator 524 function as a gate insulator.

It is preferable that the insulator 522 have a function of inhibiting diffusion of hydrogen (e.g., at least one of a hydrogen atom, a hydrogen molecule, and the like). In addition, it is preferable that the insulator 522 have a function of inhibiting diffusion of oxygen (e.g., at least one of an oxygen atom, an oxygen molecule, and the like). For example, the insulator 522 preferably has a function of inhibiting diffusion of one or both of hydrogen and oxygen more than the insulator 524.

As the insulator 522, an insulator containing an oxide of one or both of aluminum and hafnium, which is an insulating material, is preferably used. As the insulator, aluminum oxide, hafnium oxide, an oxide containing aluminum and hafnium (hafnium aluminate), or the like is preferably used. In the case where the insulator 522 is formed using such a material, the insulator 522 functions as a layer that inhibits release of oxygen from the oxide 530 to the substrate side and diffusion of impurities such as hydrogen from the periphery of the transistor 500 into the oxide 530. Thus, providing the insulator 522 can inhibit diffusion of impurities such as hydrogen into the transistor 500 and inhibit generation of oxygen vacancies in the oxide 530. Furthermore, the conductor 503 can be inhibited from reacting with oxygen contained in the insulator 524 or the oxide 530.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, the insulator may be subjected to nitriding treatment. A stack of silicon oxide, silicon oxynitride, or silicon nitride over these insulators may be used for the insulator 522.

For example, a single layer or stacked layers of an insulator containing what is called a high-k material such as aluminum oxide, hafnium oxide, tantalum oxide, or zirconium oxide may be used for the insulator 522. As miniaturization and high integration of transistors progress, a problem such as a leakage current may arise because of a thinner gate insulator. When a high-k material is used for an insulator functioning as a gate insulator, a gate potential at the time when the transistor operates can be reduced while the physical thickness is maintained. In some cases, a substance with a high permittivity, such as lead zirconate titanate (PZT), strontium titanate ($SrTiO_3$), or $(Ba,Sr)TiO_3$ (BST), can be used for the insulator 522.

Silicon oxide or silicon oxynitride, for example, can be used as appropriate for the insulator 524 that is in contact with the oxide 530.

In a manufacturing process of the transistor 500, heat treatment is preferably performed with the surface of the oxide 530 exposed. For example, the heat treatment is performed at higher than or equal to 100° C. and lower than or equal to 600° C., preferably higher than or equal to 350° C. and lower than or equal to 550° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under reduced pressure. Alternatively, the heat treatment may be performed in an atmosphere containing an oxidizing gas at 10 ppm or more, 1% or more, or 10% or more in order to compensate for released oxygen, after heat treatment in a nitrogen gas or inert gas atmosphere. Alternatively, the heat treatment may be performed in a nitrogen gas or inert gas atmosphere successively after heat treatment is performed in an atmosphere containing an oxidizing gas at 10 ppm or more, 1% or more, or 10% or more.

Note that oxygen adding treatment performed on the oxide 530 can promote a reaction in which oxygen vacancies in the oxide 530 are repaired with supplied oxygen, i.e., a reaction of "$V_O+O \rightarrow null$". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

Note that the insulator 522 and the insulator 524 may each have a stacked-layer structure of two or more layers. In that case, without limitation to a stacked-layer structure formed of the same material, a stacked-layer structure formed of different materials may be employed. The insulator 524 may be formed into an island shape so as to overlap with the oxide 530a. In this case, the insulator 544 is in contact with the side surface of the insulator 524 and the top surface of the insulator 522.

The conductor 542a and the conductor 542b are provided in contact with the top surface of the oxide 530b. The conductor 542a and the conductor 542b function as a source electrode and a drain electrode of the transistor 500.

For the conductor 542 (the conductor 542a and the conductor 542b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are each a conductive material that is not easily oxidized or a material that maintains the conductivity even after absorbing oxygen.

Note that hydrogen contained in the oxide 530b or the like diffuses into the conductor 542a or the conductor 542b in some cases. In particular, when a nitride containing tantalum is used for the conductor 542a and the conductor 542b, hydrogen contained in the oxide 530b or the like is likely to diffuse into the conductor 542a or the conductor 542b, and the diffused hydrogen is bonded to nitrogen contained in the conductor 542a or the conductor 542b in some cases. That is, hydrogen contained in the oxide 530b or the like is absorbed by the conductor 542a or the conductor 542b in some cases.

No curved surface is preferably formed between the side surface of the conductor 542 and a top surface of the conductor 542. When no curved surface is formed in the conductor 542, the conductor 542 can have a large cross-sectional area in the channel width direction. Accordingly, the conductivity of the conductor 542 is increased, so that the on-state current of the transistor 500 can be increased.

The insulator 571a is provided in contact with a top surface of the conductor 542a, and the insulator 571b is provided in contact with a top surface of the conductor 542b. The insulator 571 preferably functions as at least a barrier insulating film against oxygen. Thus, the insulator 571 preferably has a function of inhibiting oxygen diffusion. For example, the insulator 571 preferably has a function of inhibiting diffusion of oxygen more than the insulator 580. For example, a nitride containing silicon, such as silicon nitride, is used for the insulator 571. The insulator 571 preferably has a function of capturing impurities such as hydrogen. In that case, for the insulator 571, a metal oxide having an amorphous structure, for example, an insulator such as aluminum oxide or magnesium oxide, can be used. It is particularly preferable to use aluminum oxide having an amorphous structure or amorphous aluminum oxide for the insulator 571 because hydrogen can be captured or fixed more effectively in some cases. Accordingly, the transistor 500 and a semiconductor device that have favorable characteristics and high reliability can be manufactured.

The insulator 544 is provided to cover the insulator 524, the oxide 530a, the oxide 530b, the conductor 542, and the insulator 571. The insulator 544 preferably has a function of capturing and fixing hydrogen. In that case, the insulator 544 preferably includes silicon nitride or a metal oxide having an amorphous structure, for example, an insulator such as aluminum oxide or magnesium oxide. Alternatively, for example, a stacked-layer film of aluminum oxide and silicon nitride over the aluminum oxide may be used as the insulator 544.

When the above insulator 571 and insulator 544 are provided, the conductor 542 can be surrounded by the insulators having a barrier property against oxygen. That is, oxygen contained in the insulator 524 and the insulator 580 can be prevented from diffusing into the conductor 542. As a result, the conductor 542 can be inhibited from being directly oxidized by oxygen contained in the insulator 524 and the insulator 580, so that an increase in resistivity and a reduction in on-state current can be inhibited.

The insulator 552 functions as part of the gate insulator. As the insulator 552, a barrier insulating film against oxygen is preferably used. As the insulator 552, an insulator that can be used as the insulator 574 described above is used. An insulator containing an oxide of one or both of aluminum and hafnium is preferably used as the insulator 552. As the insulator, aluminum oxide, hafnium oxide, an oxide containing aluminum and hafnium (hafnium aluminate), an oxide containing hafnium and silicon (hafnium silicate), or the like can be used. In this embodiment, aluminum oxide is used for the insulator 552. In this case, the insulator 552 is an insulator containing at least oxygen and aluminum.

As illustrated in FIG. 14B, the insulator 552 is provided in contact with the top surface and the side surface of the oxide 530b, the side surface of the oxide 530a, the side surface of the insulator 524, and the top surface of the insulator 522. That is, the regions of the oxide 530a, the oxide 530b, and the insulator 524 that overlap with the conductor 560 are covered with the insulator 552 in the cross section in the channel width direction. With this structure, the insulator 552 having a barrier property against oxygen can prevent release of oxygen from the oxide 530a and the oxide 530b at the time of heat treatment or the like. This can inhibit formation of oxygen vacancies ($V_O$) in the oxide 530a and the oxide 530b. Therefore, oxygen vacancies ($V_O$) and $V_OH$ formed in the region 530bc can be reduced. Thus, the transistor 500 can have favorable electrical characteristics and higher reliability.

Even when an excess amount of oxygen is contained in the insulator 580, the insulator 550, and the like, oxygen can be inhibited from being excessively supplied to the oxide 530a and the oxide 530b. Thus, the region 530ba and the region 530bb are prevented from being excessively oxidized by oxygen through the region 530bc; a reduction in on-state current or field-effect mobility of the transistor 500 can be inhibited.

As illustrated in FIG. 14A, the insulator 552 is provided in contact with the side surfaces of the conductor 542, the insulator 544, the insulator 571, and the insulator 580. This can inhibit formation of an oxide film on the side surface of the conductor 542 by oxidation of the side surface. Accordingly, a reduction in on-state current or field-effect mobility of the transistor 500 can be inhibited.

The insulator 552 needs to be provided in an opening formed in the insulator 580 and the like, together with the insulator 554, the insulator 550, and the conductor 560. The thickness of the insulator 552 is preferably small for miniaturization of the transistor 500. The thickness of the insulator 552 is preferably greater than or equal to 0.1 nm, greater than or equal to 0.5 nm, or greater than or equal to 1.0 nm, and less than or equal to 1.0 nm, less than or equal to 3.0 nm, or less than or equal to 5.0 nm. Note that the above-described lower limits and upper limits can be combined with each other. In that case, at least part of the insulator 552 includes a region having the above-described thickness. The thickness of the insulator 552 is preferably smaller than that of the insulator 550. In that case, at least part of the insulator 552 includes a region having a thickness smaller than that of the insulator 550.

To form the insulator 552 having a small thickness as described above, an ALD method is preferably used for deposition. An ALD method is a method for performing deposition by introducing a first source gas (also referred to as a precursor or a metal precursor) and a second source gas (also referred to as a reactant, an oxidizer, or a nonmetallic precursor) for reaction alternately into a chamber, and repeating the introduction of these source gases. Examples of an ALD method include a thermal ALD method, in which a precursor and a reactant react with each other only by a thermal energy, and a PEALD (Plasma Enhanced ALD) method, in which a reactant excited by plasma is used. The use of plasma in a PEALD method is sometimes preferable because deposition at a lower temperature is possible.

An ALD method, which enables an atomic layer to be deposited one by one using self-limiting characteristics by atoms, has advantages such as deposition of an extremely thin film, deposition on a component with a high aspect ratio, deposition of a film with a small number of defects such as pinholes, deposition with excellent coverage, and low-temperature deposition.

Therefore, the insulator 552 can be formed on the side surface of the opening formed in the insulator 580 and the like to have a small thickness as described above and to have favorable coverage.

Note that some of precursors usable in an ALD method contain carbon or the like. Thus, in some cases, a film provided by an ALD method contains impurities such as carbon in a larger amount than a film provided by another deposition method. Note that impurities can be quantified by secondary ion mass spectrometry (SIMS) or X-ray photoelectron spectroscopy (XPS).

The insulator 550 functions as part of the gate insulator. The insulator 550 is preferably provided in contact with a top surface of the insulator 552. The insulator 550 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. The insulator 550 in this case is an insulator containing at least oxygen and silicon.

As in the insulator 524, the concentration of impurities such as water and hydrogen in the insulator 550 is preferably reduced. The thickness of the insulator 550 is preferably greater than or equal to 1 nm or greater than or equal to 0.5 nm and less than or equal to 15 nm or less than or equal to 20 nm. Note that the above-described lower limits and upper limits can be combined with each other. In that case, at least part of the insulator 550 includes a region having the above-described thickness.

Although FIG. 14A, FIG. 14B, and the like illustrate a single-layer structure of the insulator 550, the present invention is not limited to this structure, and a stacked-layer structure of two or more layers may be employed. For example, as illustrated in FIG. 16B, the insulator 550 may have a stacked-layer structure including two layers of an insulator 550a and an insulator 550b over the insulator 550a.

Figure 16B:
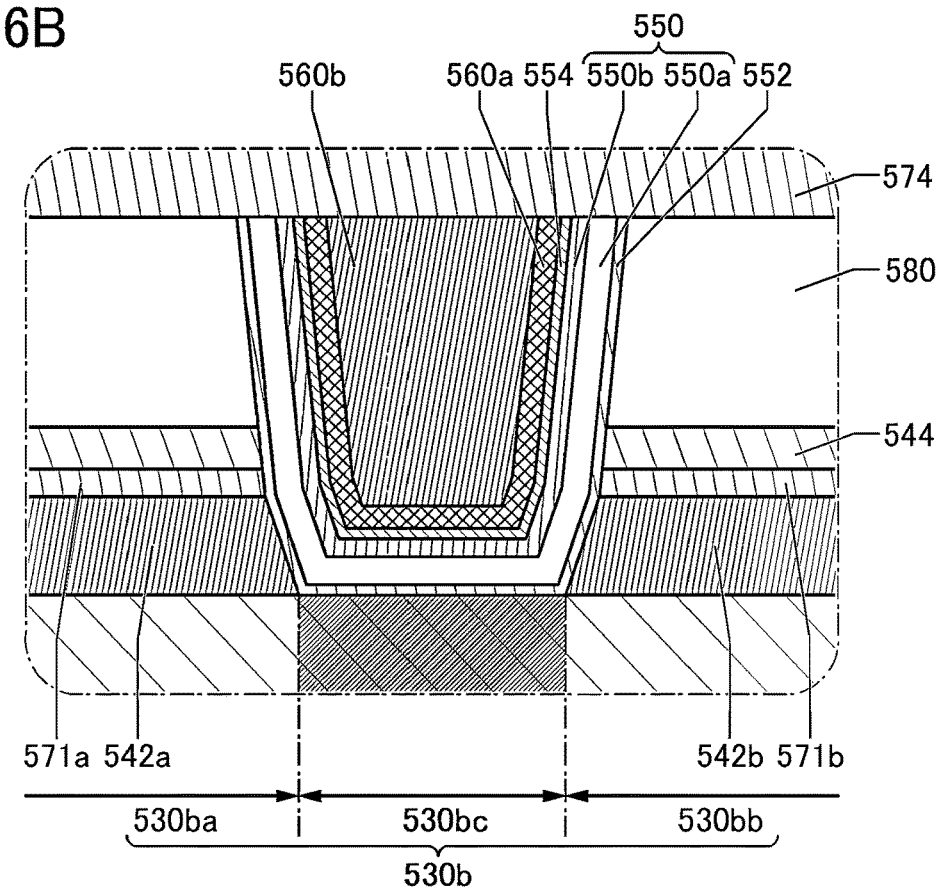

In the case where the insulator 550 has a stacked-layer structure of two layers as illustrated in FIG. 16B, it is preferable that the insulator 550a in the lower layer be formed using an insulator that is likely to transmit oxygen and the insulator 550b in the upper layer be formed using an insulator having a function of inhibiting oxygen diffusion.

With such a structure, oxygen contained in the insulator 550a can be inhibited from diffusing into the conductor 560. That is, a reduction in the amount of oxygen supplied to the oxide 530 can be inhibited. In addition, oxidation of the conductor 560 due to oxygen contained in the insulator 550a can be inhibited. For example, it is preferable that the insulator 550a be provided using any of the above-described materials that can be used for the insulator 550 and the insulator 550b be provided using an insulator containing an oxide of one or both of aluminum and hafnium. As the insulator, aluminum oxide, hafnium oxide, an oxide containing aluminum and hafnium (hafnium aluminate), an oxide containing hafnium and silicon (hafnium silicate), or the like can be used. In this embodiment, hafnium oxide is used as the insulator 550b. In this case, the insulator 550b is an insulator containing at least oxygen and hafnium. The thickness of the insulator 550b is preferably greater than or equal to 0.5 nm or greater than or equal to 1.0 nm, and less than or equal to 3.0 nm or less than or equal to 5.0 nm. Note that the above-described lower limits and upper limits can be combined with each other. In that case, at least part of the insulator 550b includes a region having the above-described thickness.

In the case where silicon oxide, silicon oxynitride, or the like is used for the insulator 550a, the insulator 550b may be formed using an insulating material that is a high-k material having a high dielectric constant. The gate insulator having a stacked-layer structure of the insulator 550a and the insulator 550b can be thermally stable and can have a high dielectric constant. Thus, a gate potential that is applied during operation of the transistor can be reduced while the physical thickness of the gate insulator is maintained. In addition, the equivalent oxide thickness (EOT) of the insulator functioning as the gate insulator can be reduced. Therefore, the withstand voltage of the insulator 550 can be increased.

The insulator 554 functions as part of the gate insulator. As the insulator 554, a barrier insulating film against hydrogen is preferably used. This can prevent diffusion of impurities such as hydrogen contained in the conductor 560 into the insulator 550 and the oxide 530b. As the insulator 554, an insulator that can be used as the insulator 576 described above is used. For example, silicon nitride deposited by a PEALD method is used as the insulator 554. In this case, the insulator 554 is an insulator containing at least nitrogen and silicon.

Furthermore, the insulator 554 may have a barrier property against oxygen. Thus, diffusion of oxygen contained in the insulator 550 into the conductor 560 can be inhibited.

The insulator 554 needs to be provided in an opening formed in the insulator 580 and the like, together with the insulator 552, the insulator 550, and the conductor 560. The thickness of the insulator 554 is preferably small for miniaturization of the transistor 500. The thickness of the insulator 554 is preferably greater than or equal to 0.1 nm, greater than or equal to 0.5 nm, or greater than or equal to 1.0 nm, and less than or equal to 3.0 nm or less than or equal to 5.0 nm. Note that the above-described lower limits and upper limits can be combined with each other. In that case, at least part of the insulator 554 includes a region having the above-described thickness. The thickness of the insulator 554 is preferably smaller than that of the insulator 550. In that case, at least part of the insulator 554 includes a region having a thickness smaller than that of the insulator 550.

The conductor 560 functions as the first gate electrode of the transistor 500. The conductor 560 preferably includes the conductor 560a and the conductor 560b provided over the conductor 560a. For example, the conductor 560a is preferably provided to cover a bottom surface and a side surface of the conductor 560b. As illustrated in FIG. 14A and FIG. 14B, the upper portion of the conductor 560 is substantially level with the upper portion of the insulator 550. Note that although the conductor 560 has a two-layer structure of the conductor 560a and the conductor 560b in FIG. 14A and FIG. 14B, the conductor 560 can have, besides the two-layer structure, a single-layer structure or a stacked-layer structure of three or more layers.

For the conductor 560a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

When the conductor 560a has a function of inhibiting diffusion of oxygen, the conductivity of the conductor 560b can be inhibited from being lowered because of oxidation due to oxygen contained in the insulator 550. As the conductive material having a function of inhibiting diffusion of oxygen, for example, titanium, titanium nitride, tantalum, tantalum nitride, ruthenium, or ruthenium oxide is preferably used.

The conductor 560 also functions as a wiring and thus is preferably a conductor having high conductivity. For example, a conductive material containing tungsten, copper, or aluminum as its main component can be used for the conductor 560b. The conductor 560b can have a stacked-layer structure. Specifically, for example, the conductor 560b can have a stacked-layer structure of titanium or titanium nitride and the above conductive material.

In the transistor 500, the conductor 560 is formed in a self-aligned manner to fill the opening formed in the insulator 580 and the like. The formation of the conductor 560 in this manner allows the conductor 560 to be placed properly in a region between the conductor 542a and the conductor 542b without alignment.

As illustrated in FIG. 14B, in the channel width direction of the transistor 500, with reference to a bottom surface of the insulator 522, the level of the bottom surface of the conductor 560 in a region where the conductor 560 and the oxide 530b do not overlap with each other is preferably lower than the level of a bottom surface of the oxide 530b. When the conductor 560 functioning as the gate electrode covers the side surface and the top surface of the channel formation region of the oxide 530b with the insulator 550 and the like therebetween, the electric field of the conductor 560 can easily act on the entire channel formation region of the oxide 530b. Thus, the on-state current of the transistor 500 can be increased and the frequency characteristics of the transistor 500 can be improved. The difference between the level of the bottom surface of the conductor 560 in a region where the oxide 530a and the oxide 530b do not overlap with the conductor 560 and the level of the bottom surface of the oxide 530b, with reference to the bottom surface of the insulator 522, is preferably greater than or equal to 0 nm, greater than or equal to 3 nm, or greater than or equal to 5 nm, and less than or equal to 20 nm, less than or equal to 50 nm, or less than or equal to 100 nm. Note that the above-described lower limits and upper limits can be combined with each other.

The insulator 580 is provided over the insulator 544, and the opening is formed in a region where the insulator 550 and the conductor 560 are to be provided. In addition, the top surface of the insulator 580 may be planarized.

The insulator 580 functioning as an interlayer film preferably has a low permittivity. When a material with a low permittivity is used for the interlayer film, parasitic capacitance generated between wirings can be reduced. The insulator 580 is preferably provided using a material similar to that for the insulator 516, for example. In particular, silicon oxide and silicon oxynitride, which have thermal stability, are preferable. Materials such as silicon oxide, silicon oxynitride, and porous silicon oxide are particularly preferable because a region containing oxygen to be released by heating can be easily formed.

The concentration of impurities such as water and hydrogen in the insulator 580 is preferably reduced. An oxide containing silicon, such as silicon oxide or silicon oxynitride, is used as appropriate for the insulator 580, for example.

The insulator 574 preferably functions as a barrier insulating film that inhibits impurities such as water and hydrogen from diffusing into the insulator 580 from above and preferably has a function of capturing impurities such as hydrogen. The insulator 574 preferably functions as a barrier insulating film that inhibits passage of oxygen. For the insulator 574, a metal oxide having an amorphous structure, for example, an insulator such as aluminum oxide, can be used. In this case, the insulator 574 is an insulator containing at least oxygen and aluminum. The insulator 574, which has a function of capturing impurities such as hydrogen, is provided in contact with the insulator 580 in a region sandwiched between the insulator 512 and the insulator 581, whereby impurities such as hydrogen contained in the insulator 580 and the like can be captured and the amount of hydrogen in the region can be constant. It is particularly preferable to use aluminum oxide having an amorphous structure for the insulator 574, in which case hydrogen can sometimes be captured or fixed more effectively. Accordingly, the transistor 500 and a semiconductor device that have favorable characteristics and high reliability can be manufactured.

The insulator 576 functions as a barrier insulating film that inhibits impurities such as water and hydrogen from diffusing into the insulator 580 from above. The insulator 576 is provided over the insulator 574. The insulator 576 is preferably formed using a nitride containing silicon, such as silicon nitride or silicon nitride oxide. For example, silicon nitride deposited by a sputtering method is used for the insulator 576. When the insulator 576 is deposited by a sputtering method, a high-density silicon nitride film can be formed. To obtain the insulator 576, silicon nitride deposited by a PEALD method or a CVD method may be stacked over silicon nitride deposited by a sputtering method.

One of a first terminal and a second terminal of the transistor 500 is electrically connected to a conductor 540a serving as a plug, and the other of the first terminal and the second terminal of the transistor 500 is electrically connected to a conductor 540b. Note that in this specification and the like, the conductor 540a and the conductor 540b are collectively referred to as a conductor 540.

The conductor 540a is provided in a region overlapping with the conductor 542a, for example. Specifically, an opening portion is formed in the insulator 571a, the insulator 544, the insulator 580, the insulator 574, the insulator 576, and the insulator 581 illustrated in FIG. 14A and in an insulator 582 and an insulator 586 illustrated in FIG. 13 in the region overlapping with the conductor 542a, and the conductor 540a is provided inside the opening portion. The conductor 540*b* is provided in a region overlapping with the conductor 542*b*, for example. Specifically, an opening portion is formed in the insulator 571*b*, the insulator 544, the insulator 580, the insulator 574, the insulator 576, and the insulator 581 illustrated in FIG. 14A and in the insulator 582 and the insulator 586 illustrated in FIG. 13 in the region overlapping with the conductor 542*b*, and the conductor 540*b* is provided inside the opening portion. Note that the insulator 582 and the insulator 586 will be described later.

As illustrated in FIG. 14A, an insulator 541*a* as an insulator having an impurity barrier property may be provided between the conductor 540*a* and the side surface of the opening portion in the region overlapping with the conductor 542*a*. Similarly, an insulator 541*b* as an insulator having an impurity barrier property may be provided between the conductor 540*b* and the side surface of the opening portion in the region overlapping with the conductor 542*b*. Note that in this specification and the like, the insulator 541*a* and the insulator 541*b* are collectively referred to as an insulator 541.

For the conductor 540*a* and the conductor 540*b*, a conductive material containing tungsten, copper, or aluminum as its main component is preferably used. The conductor 540*a* and the conductor 540*b* may each have a stacked-layer structure.

In the case where the conductor 540 has a stacked-layer structure, a conductive material having a function of inhibiting passage of impurities such as water and hydrogen is preferably used for a first conductor provided in the vicinity of the insulator 574, the insulator 576, the insulator 581, the insulator 580, the insulator 544, and the insulator 571. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 576 can be inhibited from entering the oxide 530 through the conductor 540*a* and the conductor 540*b*.

For the insulator 541*a* and the insulator 541*b*, a barrier insulating film that can be used for the insulator 544 or the like can be used. For the insulator 541*a* and the insulator 541*b*, for example, an insulator such as silicon nitride, aluminum oxide, or silicon nitride oxide can be used. Since the insulator 541*a* and the insulator 541*b* are provided in contact with the insulator 574, the insulator 576, and the insulator 571, impurities such as water and hydrogen contained in the insulator 580 or the like can be inhibited from entering the oxide 530 through the conductor 540*a* and the conductor 540*b*. In particular, silicon nitride is suitable because of its high blocking property against hydrogen. Furthermore, oxygen contained in the insulator 580 can be prevented from being absorbed by the conductor 540*a* and the conductor 540*b*.

When the insulator 541*a* and the insulator 541*b* each have a stacked-layer structure as illustrated in FIG. 14A, a first insulator in contact with an inner wall of the opening in the insulator 580 and the like and a second insulator on the inner side of the first insulator are preferably formed using a combination of a barrier insulating film against oxygen and a barrier insulating film against hydrogen.

For example, aluminum oxide deposited by an ALD method can be used as the first insulator and silicon nitride deposited by a PEALD method can be used as the second insulator. Such a structure can inhibit oxidation of the conductor 540 and reduce entry of hydrogen into the conductor 540.

Although the first insulator of the insulator 541 and the second insulator of the insulator 541 are stacked in the transistor 500, the present invention is not limited thereto. For example, the insulator 541 may have a single-layer structure or a stacked-layer structure of three or more layers. Although the first conductor of the conductor 540 and the second conductor of the conductor 540 are stacked in the transistor 500, the present invention is not limited thereto. For example, the conductor 540 may have a single-layer structure or a stacked-layer structure of three or more layers.

As illustrated in FIG. 13, a conductor 610, a conductor 612, and the like functioning as wirings may be provided in contact with an upper portion of the conductor 540*a* and an upper portion of the conductor 540*b*. For the conductor 610 and the conductor 612, a conductive material containing tungsten, copper, or aluminum as its main component is preferably used. The conductors can each have a stacked-layer structure. Specifically, the conductors may each be a stack of titanium or a titanium nitride and any of the above conductive materials, for example. Note that the conductors may be formed to be embedded in an opening provided in an insulator.

The structure of the transistor included in the semiconductor device of one embodiment of the present invention is not limited to that of the transistor 500 illustrated in FIG. 13, FIG. 14A, FIG. 14B, and FIG. 15. The structure of the transistor included in the semiconductor device of one embodiment of the present invention may be changed in accordance with circumstances.

Figure 17:
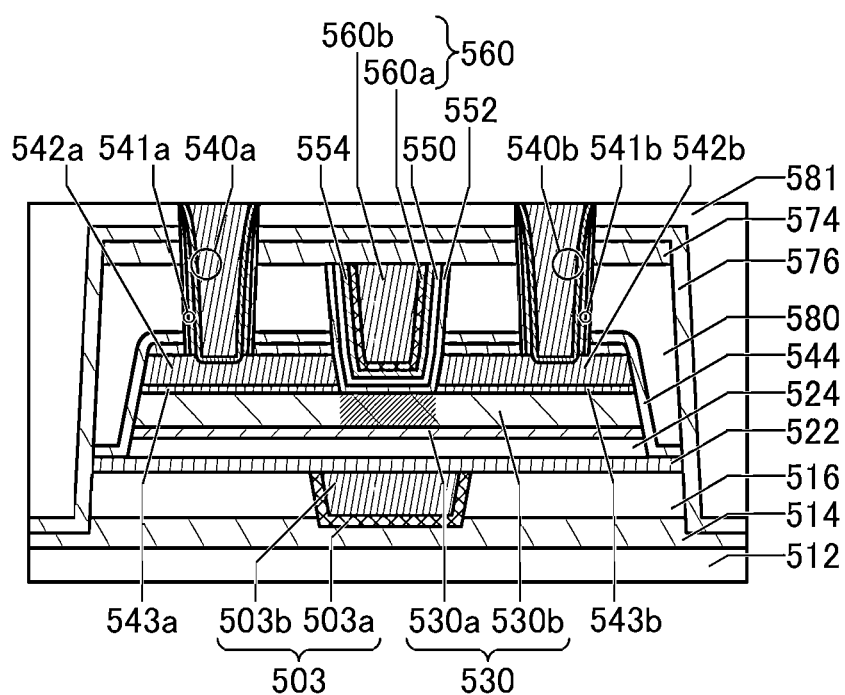
FIG. 17 is a schematic cross-sectional view illustrating a structure example of a transistor.

For example, the transistor 500 illustrated in FIG. 13, FIG. 14A, FIG. 14B, and FIG. 15 may have a structure illustrated in FIG. 17. The transistor in FIG. 17 is different from the transistor 500 illustrated in FIG. 13, FIG. 14A, FIG. 14B, and FIG. 15 in including an oxide 543*a* and an oxide 543*b*. Note that in this specification and the like, the oxide 543*a* and the oxide 543*b* are collectively referred to as an oxide 543. The cross-sectional structure in the channel width direction of the transistor in FIG. 17 can be similar to the cross-sectional structure of the transistor 500 illustrated in FIG. 14B.

The oxide 543*a* is provided between the oxide 530*b* and the conductor 542*a*, and the oxide 543*b* is provided between the oxide 530*b* and the conductor 542*b*. Here, the oxide 543*a* is preferably in contact with the top surface of the oxide 530*b* and a bottom surface of the conductor 542*a*. The oxide 543*b* is preferably in contact with the top surface of the oxide 530*b* and a bottom surface of the conductor 542*b*.

The oxide 543 preferably has a function of inhibiting passage of oxygen. The oxide 543 having a function of inhibiting passage of oxygen is preferably placed between the oxide 530*b* and the conductor 542 functioning as the source electrode or the drain electrode, in which case the electric resistance between the conductor 542 and the oxide 530*b* can be reduced. Such a structure can improve the electrical characteristics, the field-effect mobility, and the reliability of the transistor 500 in some cases.

A metal oxide containing the element M may be used as the oxide 543. In particular, aluminum, gallium, yttrium, or tin is preferably used as the element M. The concentration of the element M in the oxide 543 is preferably higher than that in the oxide 530*b*. Furthermore, gallium oxide may be used as the oxide 543. A metal oxide such as an In-M-Zn oxide may be used as the oxide 543. Specifically, the atomic ratio of the element M to In in the metal oxide used as the oxide is preferably greater than the atomic ratio of the element M to In in the metal oxide used as the oxide 530b. The thickness of the oxide 543 is preferably greater than or equal to 0.5 nm or greater than or equal to 1 nm, and less than or equal to 2 nm, less than or equal to 3 nm, or less than or equal to 5 nm. Note that the above-described lower limits and upper limits can be combined with each other. The oxide 543 preferably has crystallinity. In the case where the oxide 543 has crystallinity, release of oxygen from the oxide 530 can be suitably inhibited. When the oxide 543 has a hexagonal crystal structure, for example, release of oxygen from the oxide 530 can sometimes be inhibited.

The insulator 582 is provided over the insulator 581, and the insulator 586 is provided over the insulator 582.

A substance having a barrier property against oxygen and hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

For the insulator 586, a material similar to that for the insulator 320 can be used. Furthermore, when a material with a relatively low permittivity is used for these insulators, parasitic capacitance generated between wirings can be reduced. A silicon oxide film, a silicon oxynitride film, or the like can be used for the insulator 586, for example.

Next, the capacitor 600 and peripheral wirings or plugs included in the semiconductor device illustrated in FIG. 13 and FIG. 15 are described. Note that the capacitor 600 and wirings and/or plugs are provided above the transistor 500 illustrated in FIG. 13 and FIG. 15.

The capacitor 600 includes the conductor 610, a conductor 620, and an insulator 630, for example.

The conductor 610 is provided over one of the conductor 540a and the conductor 540b and the insulator 586. The conductor 610 has a function of one of a pair of electrodes of the capacitor 600.

The conductor 612 is provided over the other of the conductor 540a and the conductor 540b and the insulator 586. The conductor 612 has a function of a plug, a wiring, a terminal, or the like that electrically connects the transistor 500 to a circuit element, a wiring, or the like provided above the transistor 500.

Note that the conductor 612 and the conductor 610 may be formed at the same time.

For the conductor 612 and the conductor 610, it is possible to use a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in FIG. 13, they are not limited to having the structures shown therein and may have a stacked-layer structure of two or more layers. For example, between a conductor having a barrier property and a conductor having high conductivity, a conductor that is highly adhesive to the conductor having a barrier property and the conductor having high conductivity may be formed.

The insulator 630 is provided over the insulator 586 and the conductor 610. The insulator 630 functions as a dielectric sandwiched between the pair of electrodes of the capacitor 600.

As the insulator 630, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or zirconium oxide can be used. The insulator 630 can be provided to have a stacked-layer structure or a single-layer structure using any of the above materials.

As another example, the insulator 630 may have a stacked-layer structure using a material with high dielectric strength, such as silicon oxynitride, and a high-permittivity (high-k) material. In the capacitor 600 having such a structure, a sufficient capacitance can be ensured owing to the high-permittivity (high-k) insulator, and the dielectric strength can be increased owing to the insulator with high dielectric strength; hence, the electrostatic breakdown of the capacitor 600 can be inhibited.

Examples of an insulator that is the high permittivity (high-k) material (a material having a high dielectric constant) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Alternatively, for example, a single layer or stacked layers of an insulator containing a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST) may be used as the insulator 630. For the insulator 630, a compound containing hafnium and zirconium may be used, for example. As miniaturization and high integration of a semiconductor device progress, a problem such as leakage current from a transistor, a capacitor, and the like may arise because of a thinner gate insulator and a thinner dielectric used for a capacitor. When a high-k material is used for an insulator functioning as the gate insulator and the dielectric used in the capacitor, a gate potential during the operation of the transistor can be lowered and the capacitance of the capacitor can be ensured while the physical thicknesses of the gate insulator and the dielectric are maintained.

In particular, by using a material that can have ferroelectricity for the insulator 630, for example, the capacitor 600 can be used as a ferroelectric capacitor.

The conductor 620 is provided to overlap with the conductor 610 with the insulator 630 therebetween. The conductor 610 has a function of one of the pair of electrodes of the capacitor 600, and the conductor 620 has a function of the other of the pair of electrodes of the capacitor 600.

For the conductor 620, a conductive material such as a metal material, an alloy material, or a metal oxide material can be used. It is preferable to use a high-melting-point material that has both heat resistance and conductivity, such as tungsten or molybdenum, and it is particularly preferable to use tungsten. In the case where the conductor 620 is formed concurrently with another component such as a conductor, Cu (copper), Al (aluminum), or the like, which is a low-resistance metal material, is used. As another example, the conductor 620 can be formed using any of the materials usable for the conductor 610. The conductor 620 may have a stacked-layer structure of two or more layers instead of a single-layer structure.

An insulator 640 is provided over the conductor 620 and the insulator 630. The insulator 640 is preferably formed using a film having a barrier property that prevents hydrogen, impurities, or the like from diffusing into the region where the transistor 500 is provided, for example. Thus, a material similar to that for the insulator 324 can be used.

An insulator 650 is provided over the insulator 640. The insulator 650 can be provided using a material similar to that for the insulator 320. The insulator 650 may function as a planarization film that covers an uneven shape thereunder. Thus, the insulator 650 can be formed using any of the materials usable for the insulator 324, for example.

Although the capacitor 600 illustrated in FIG. 13 and FIG. 15 is a planar capacitor, the shape of the capacitor is not limited thereto. For example, the capacitor 600 may be a cylindrical capacitor instead of a planar capacitor.

A wiring layer may be provided above the capacitor 600. For example, in FIG. 13, an insulator 411, an insulator 412, an insulator 413, and an insulator 414 are provided in this order above the insulator 650. In addition, a conductor 416 functioning as a plug or a wiring is provided in the insulator 411, the insulator 412, and the insulator 413. The conductor 416 can be provided, for example, in a region overlapping with an after-mentioned conductor 660.

In the insulator 630, the insulator 640, and the insulator 650, an opening portion is provided in a region overlapping with the conductor 612, and the conductor 660 is provided to fill the opening portion. The conductor 660 functions as a plug or a wiring that is electrically connected to the conductor 416 included in the above-described wiring layer.

For example, like the insulator 324 or the like, the insulator 411 and the insulator 414 are each preferably formed using an insulator having a barrier property against impurities such as water and hydrogen. Thus, the insulator 411 and the insulator 414 can be formed using any of the materials usable for the insulator 324 or the like, for example.

Like the insulator 326, the insulator 412 and the insulator 413 are each preferably formed using, for example, an insulator having a relatively low dielectric constant to reduce the parasitic capacitance generated between wirings.

The conductor 612 and the conductor 416 can be provided using materials similar to those for the conductor 328 and the conductor 330, for example.

Structure Example 2 of Semiconductor Device

Next, a structure example of the above-described semiconductor device including an FTJ element is described.

Figure 18:
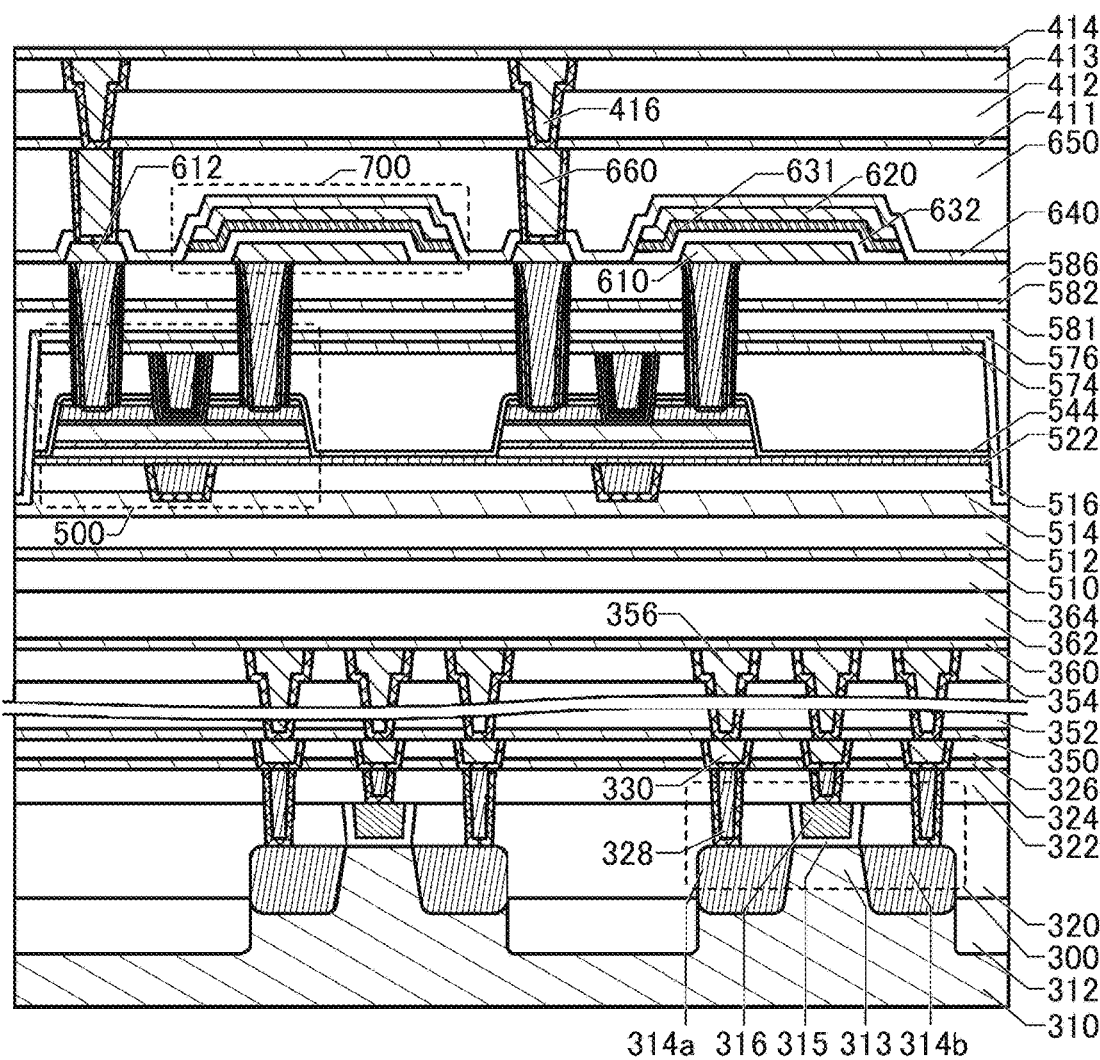
FIG. 18 is a schematic cross-sectional view illustrating a structure example of a semiconductor device.

FIG. 18 illustrates an example in which the capacitor 600 positioned on the top surface of the insulator 582 in the semiconductor device illustrated in FIG. 13 is changed into an FTJ element 700.

Specifically, the FTJ element 700 includes the conductor 610 functioning as a lower electrode, the conductor 620 functioning as an upper electrode, an insulator 632, and an insulator 631, for example. In particular, a material that can have ferroelectricity can be used for the insulator 631.

Examples of a material that can have ferroelectricity include hafnium oxide, zirconium oxide, zirconium hafnium oxide, a material obtained by adding an element J1 (here, the element J1 is, for example, zirconium (Zr), silicon, (Si), aluminum (Al), gadolinium (Gd), yttrium (Y), lanthanum (La), or strontium (Sr)) to hafnium oxide, and a material obtained by adding an element J2 (here, the element J2 is, for example, hafnium (Hf), silicon, (Si), aluminum (Al), gadolinium (Gd), yttrium (Y), lanthanum (La), or strontium (Sr)) to zirconium oxide. As a material that can have ferroelectricity, a piezoelectric ceramic having a perovskite structure, such as lead titanate, barium strontium titanate (BST), strontium titanate, lead zirconate titanate (PZT), strontium bismuth tantalate (SBT), bismuth ferrite (BFO), or barium titanate, may be used. Other examples of a material that can have ferroelectricity include a mixture and a compound containing a material selected from the above-listed materials. Alternatively, a material that can have ferroelectricity can have a stacked-layer structure including a plurality of materials selected from the above-listed materials. Note that crystal structures (characteristics) of hafnium oxide, zirconium oxide, zirconium hafnium oxide, a material obtained by adding the element J1 to hafnium oxide, and the like might be changed by various kinds of processes or the like as well as deposition conditions; therefore, in this specification and the like, the above materials are referred to not only as ferroelectrics but also as materials that can have ferroelectricity.

Among materials that can have ferroelectricity, a material containing hafnium oxide and a material containing hafnium oxide and zirconium oxide are preferable because they can have ferroelectricity even when processed into a thin film of several nanometers. Here, the thickness of the insulator 631 can be less than or equal to 100 nm, preferably less than or equal to 50 nm, further preferably less than or equal to 20 nm, still further preferably less than or equal to 10 nm. The use of a thinned ferroelectric layer enables a ferroelectric capacitor to form a semiconductor device in combination with the miniaturized transistor 500.

In FIG. 18, the conductor 610 and the conductor 612 can be formed using materials similar to those for the conductor 610 and the conductor 612 in FIG. 13. In FIG. 18, the conductor 610 and the conductor 612 can be formed by methods similar to those for the conductor 610 and the conductor 612 in FIG. 13.

In FIG. 18, the insulator 632 is provided on a top surface of the conductor 610 and a top surface of part of a region of the insulator 586. The insulator 631 is provided on a top surface of the insulator 632, and the conductor 620 is provided on a top surface of the insulator 631.

The insulator 632 functions as a tunnel insulating film in the FTJ element 700. For the insulator 632, silicon oxide, silicon nitride, or a stack of silicon oxide and silicon nitride can be used, for example.

In FIG. 18, the insulator 640 is provided on top surfaces of a region of the insulator 632 including an end portion, a region of the insulator 631 including an end portion, the conductor 620, and part of a region of the insulator 586.

For the insulator 640, any of the materials usable for the insulator 640 in FIG. 13 can be used, for example.

By employing the structure of the FTJ element 700 as shown in FIG. 18, the FTJ element can be provided in the semiconductor device illustrated in FIG. 13.

The FTJ element 700 illustrated in FIG. 18 can be, for example, the FTJ element FJAb described in the above embodiments. Note that the FTJ element 700 can be the FTJ element FJAa by changing the stacking order of the insulator 632 functioning as a tunnel insulating film and the insulator 631 containing a material that can have ferroelectricity.

Figure 19:
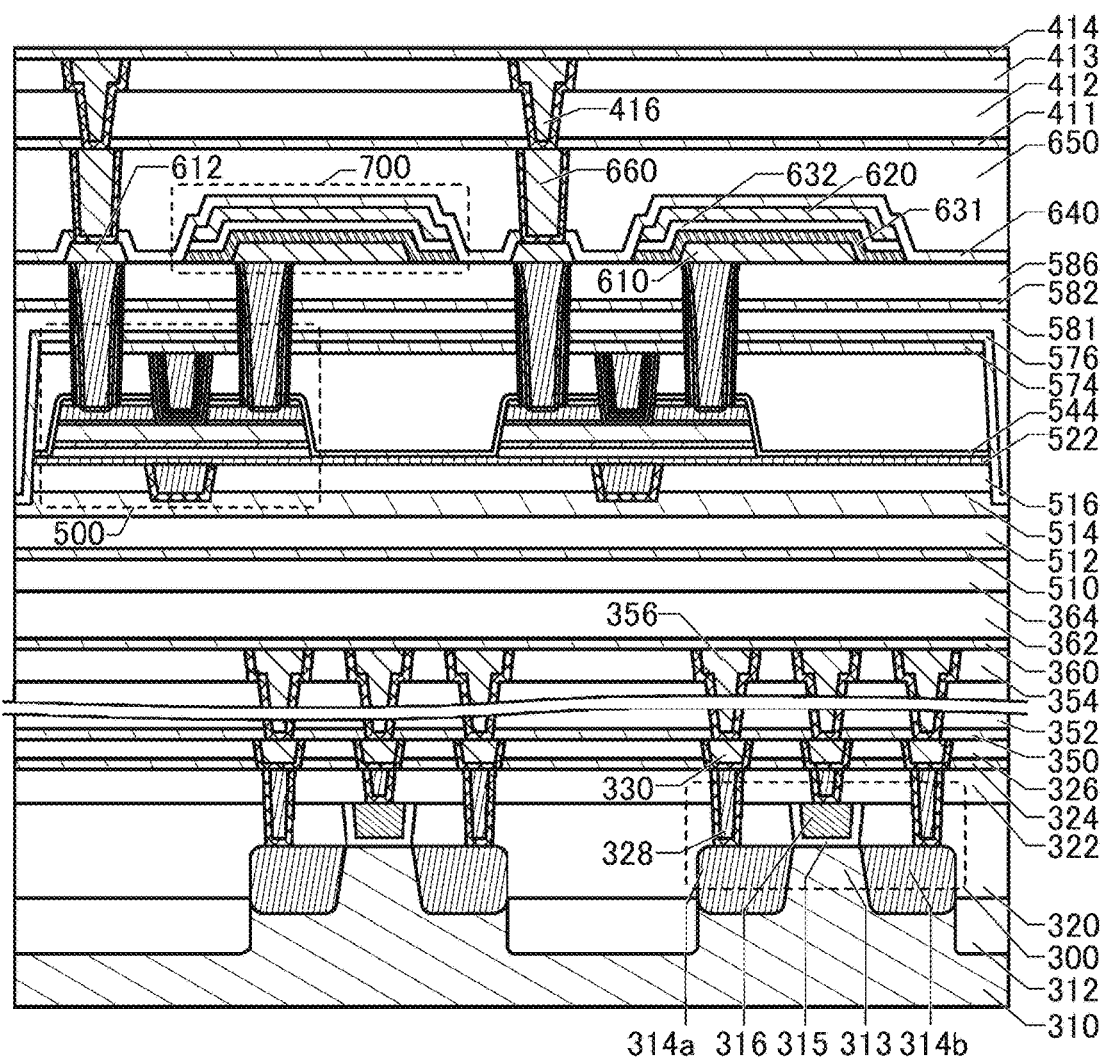
FIG. 19 is a schematic cross-sectional view illustrating a structure example of a semiconductor device.

As an example, FIG. 19 illustrates a structure where the stacking order of the insulator 632 functioning as a tunnel insulating film and the insulator 631 containing a material that can have ferroelectricity, which are illustrated in FIG. 18, is reversed. The FTJ element 700 illustrated in FIG. 19 can be, for example, the FTJ element FJAa described in the above embodiments.

Next, a structure example of a semiconductor device including a ferroelectric capacitor different from that in FIG. 18 is described.

Figure 20:
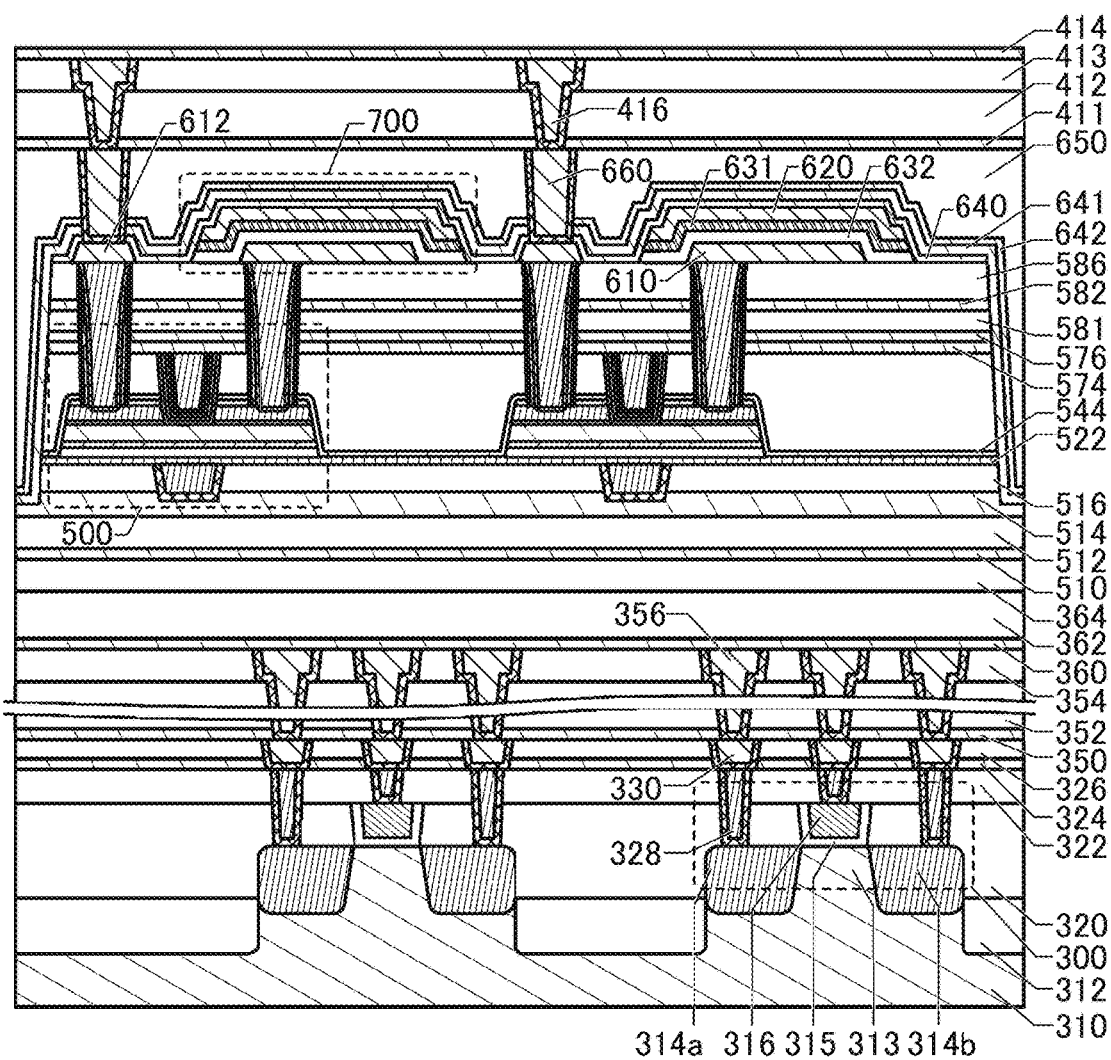
FIG. 20 is a schematic cross-sectional view illustrating a structure example of a semiconductor device.

A semiconductor device illustrated in FIG. 20 is a variation example of the semiconductor device in FIG. 18 and has a structure where the transistor 500 and the FTJ element 700 are surrounded by the insulator 571, the insulator 544, the insulator 574, the insulator 576, the insulator 581, an insulator 641, an insulator 642, and the like.

In the semiconductor devices in FIG. 13 and FIG. 18, an opening portion reaching the insulator 514 is formed after the components from the substrate 310 to the insulator 574 are sequentially provided; whereas in the semiconductor device in FIG. 20, an opening portion reaching the insulator 514 is formed after the components from the substrate 310 to the insulator 640 are sequentially provided.

In the semiconductor device in FIG. 20, the insulator 641, the insulator 642, and the insulator 650 are provided in this order on a bottom portion of the opening portion and a top surface of the insulator 640.

The insulator 641 and the insulator 642 preferably function as barrier insulating films that inhibit diffusion of impurities such as water and hydrogen into the transistor 500 and the FTJ element 700 from above the transistor 500 and the FTJ element 700, for example.

As a method for forming the insulator 641, for example, a sputtering method can be used. For example, silicon nitride deposited by a sputtering method can be used as the insulator 641. Since a sputtering method does not need to use a molecule containing hydrogen as a deposition gas, the hydrogen concentration in the insulator 641 can be reduced. The hydrogen concentration in the insulator 641, which is in contact with the conductor 610, the conductor 612, and the insulator 586, is reduced in the above manner; hence, diffusion of hydrogen into the conductor 610, the conductor 612, and the insulator 586 from the insulator 641 can be suppressed.

The insulator 642 is preferably formed by, for example, an ALD method, particularly a PEALD method. For example, silicon nitride deposited by a PEALD method can be used as the insulator 642. Accordingly, the insulator 642 can be formed with good coverage; thus, even when a pinhole, disconnection, or the like is caused in the insulator 641 because of unevenness of a base, covering such a defect with the insulator 642 can inhibit diffusion of hydrogen into the conductor 610, the conductor 612, and the insulator 586.

Employing the structure illustrated in FIG. 20 can prevent impurities such as water and hydrogen from diffusing to the transistor 500 side and the FTJ element 700 side through the insulator 512, the insulator 514, the insulator 641, the insulator 642, and the like. Moreover, oxygen contained in the insulator 580 and the like can be prevented from diffusing to the outside through the insulator 574, the insulator 641, the insulator 642, and the like.

When a semiconductor device using a transistor including an oxide semiconductor has the structure described in this embodiment, a change in electrical characteristics of the transistor can be inhibited and the reliability can be improved.

Furthermore, in the semiconductor device using the transistor including the oxide semiconductor, employing a stacked-layer structure and achieving miniaturization and high integration, for example, can reduce the area of circuits constituting the semiconductor device. In particular, stacking the transistor and the FTJ element in the semiconductor device makes it possible to increase the circuit scale while the increase in the circuit area in the semiconductor device is suppressed.

Note that this embodiment can be combined with any of the other embodiments in this specification as appropriate.

Embodiment 4

Described in this embodiment is a metal oxide (hereinafter also referred to as an oxide semiconductor) that can be used in an OS transistor described in the above embodiment.

The metal oxide preferably contains at least indium or zinc. In particular, indium and zinc are preferably contained. In addition to them, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of crystal structures of an oxide semiconductor is described with reference to FIG. 21A. FIG. 21A is a diagram showing the classification of crystal structures of an oxide semiconductor, typically IGZO (a metal oxide containing In, Ga, and Zn).

As shown in FIG. 21A, an oxide semiconductor is roughly classified into "Amorphous", "Crystalline", and "Crystal". "Amorphous" includes completely amorphous. "Crystalline" includes CAAC (c-axis-aligned crystalline), nc (nanocrystalline), and CAC (Cloud-Aligned Composite) (excluding single crystal and poly crystal). Note that "Crystalline" excludes single crystal, poly crystal, and completely amorphous. "Crystal" includes single crystal and poly crystal.

Note that the structures in the thick frame in FIG. 21A are in an intermediate state between "Amorphous" and "Crystal", and belong to a new crystalline phase. That is, these structures are completely different from "Amorphous", which is energetically unstable, and "Crystal".

A crystal structure of a film or a substrate can be evaluated with an X-ray diffraction (XRD) spectrum. FIG. 21B shows an XRD spectrum, which is obtained by GIXD (Grazing-Incidence XRD) measurement, of a CAAC-IGZO film classified into "Crystalline" (the horizontal axis represents 2θ [deg.] and the vertical axis represents intensity in arbitrary unit (a.u.)). Note that a GIXD method is also referred to as a thin film method or a Seemann-Bohlin method. The XRD spectrum that is shown in FIG. 21B and obtained by GIXD measurement is hereinafter simply referred to as an XRD spectrum in some cases. The CAAC-IGZO film in FIG. 21B has a composition in the vicinity of In:Ga:Zn=4:2:3 [atomic ratio]. The CAAC-IGZO film in FIG. 21B has a thickness of 500 nm.

As shown in FIG. 21B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 21B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 21C shows a diffraction pattern of a CAAC-IGZO film. FIG. 21C shows a diffraction pattern obtained with the NBED in which an electron beam is incident in the direction parallel to the substrate. The CAAC-IGZO film in FIG. 21C has a composition in the vicinity of In:Ga:Zn=4:2:3 [atomic ratio]. In the nanobeam electron diffraction method, electron diffraction is performed with a probe diameter of 1 nm.

As shown in FIG. 21C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 21A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, reduction in electron mobility due to the crystal grain boundary is less likely to occur. Moreover, since the crystallinity of an oxide semiconductor might be decreased by entry of impurities, formation of defects, and the like, the CAAC-OS can be regarded as an oxide semiconductor that has small amounts of impurities, defects (e.g., oxygen vacancies), and the like. Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter greater than the diameter of a nanocrystal (e.g., greater than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or less than the diameter of a nanocrystal (e.g., greater than or equal to 1 nm and less than or equal to 30 nm).

[a-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. As another example, the first region has higher [In] and lower [Ga] than the second region. As another example, the first region has higher [In] than the second region and has lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (μ), and excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor with a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.
<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2 \times 10^{18}$ atoms/$cm^3$, preferably lower than or equal to $2 \times 10^{17}$ atoms/$cm^3$.

When the oxide semiconductor contains an alkali metal or an alkaline earth metal, defect states are formed and carriers are generated in some cases. Accordingly, a transistor including an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1 \times 10^{18}$ atoms/$cm^3$, preferably lower than or equal to $2 \times 10^{16}$ atoms/$cm^3$.

When the oxide semiconductor contains nitrogen, the oxide semiconductor easily becomes n-type by generation of electrons serving as carriers and an increase in carrier concentration. As a result, a transistor including an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5 \times 10^{19}$ atoms/$cm^3$, preferably lower than or equal to $5 \times 10^{18}$ atoms/$cm^3$, further preferably lower than or equal to $1 \times 10^{18}$ atoms/$cm^3$, still further preferably lower than or equal to $5 \times 10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1 \times 10^{20}$ atoms/$cm^3$, preferably lower than $1 \times 10^{19}$ atoms/$cm^3$, further preferably lower than $5 \times 10^{18}$ atoms/$cm^3$, still further preferably lower than $1 \times 10^{18}$ atoms/$cm^3$.

When an oxide semiconductor with sufficiently reduced impurities is used for the channel formation region of the transistor, stable electrical characteristics can be given.

Note that this embodiment can be combined with any of the other embodiments in this specification as appropriate.

Embodiment 5

This embodiment will describe examples of a semiconductor wafer where the memory device described in the above embodiment and the like are formed and electronic components incorporating the memory device.
<Semiconductor Wafer>

First, an example of a semiconductor wafer where a memory device and the like are formed is described with reference to FIG. 22A.

Figure 22A:
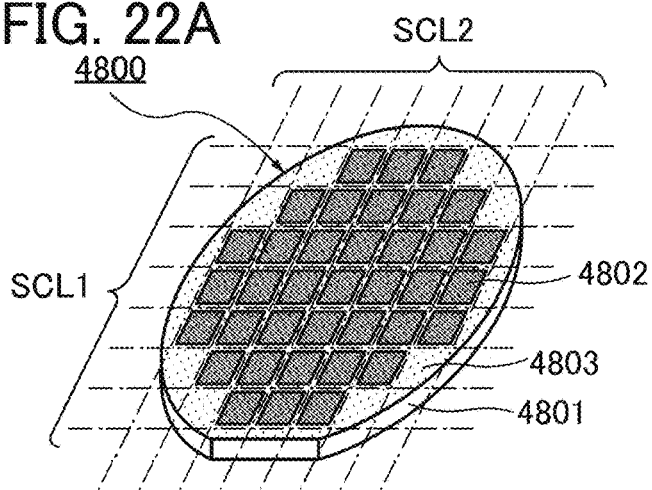
FIG. 22A is a perspective view illustrating an example of a semiconductor wafer.

A semiconductor wafer 4800 illustrated in FIG. 22A includes a wafer 4801 and a plurality of circuit portions 4802 provided on a top surface of the wafer 4801. Note that a portion without the circuit portion 4802 on the top surface of the wafer 4801 is a spacing 4803 that is a region for dicing.

The semiconductor wafer 4800 can be manufactured by forming the plurality of circuit portions 4802 on the surface of the wafer 4801 by a pre-process. After that, a surface of the wafer 4801 opposite to the surface provided with the plurality of circuit portions 4802 may be ground to thin the wafer 4801. Through this step, warpage or the like of the wafer 4801 is reduced and the size of the component can be reduced.

A dicing step is performed as a next step. The dicing is performed along scribe lines SCL1 and scribe lines SCL2 (referred to as dicing lines or cutting lines in some cases) indicated by dashed-dotted lines. Note that to perform the dicing step easily, it is preferable that the spacing 4803 be provided so that the plurality of scribe lines SCL1 are parallel to each other, the plurality of scribe lines SCL2 are parallel to each other, and the scribe lines SCL1 are perpendicular to the scribe lines SCL2.

Figure 22B:
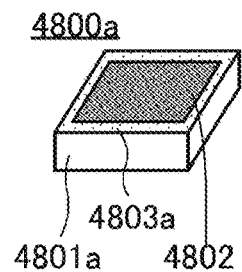
FIG. 22B is a perspective view illustrating an example of a chip.

With the dicing step, a chip 4800a illustrated in FIG. 22B can be cut out from the semiconductor wafer 4800. The chip 4800a includes a wafer 4801a, the circuit portion 4802, and a spacing 4803a. Note that it is preferable to make the spacing 4803a small as much as possible. In this case, the width of the spacing 4803 between adjacent circuit portions 4802 is substantially the same as a cutting allowance of the scribe line SCL1 or a cutting allowance of the scribe line SCL2.

Note that the shape of the element substrate of one embodiment of the present invention is not limited to the shape of the semiconductor wafer 4800 illustrated in FIG. 22A. The element substrate may be a rectangular semiconductor wafer, for example. The shape of the element substrate can be changed as appropriate, depending on a manufacturing process of an element and an apparatus for manufacturing the element.
<Electronic Component>

Figure 22C:
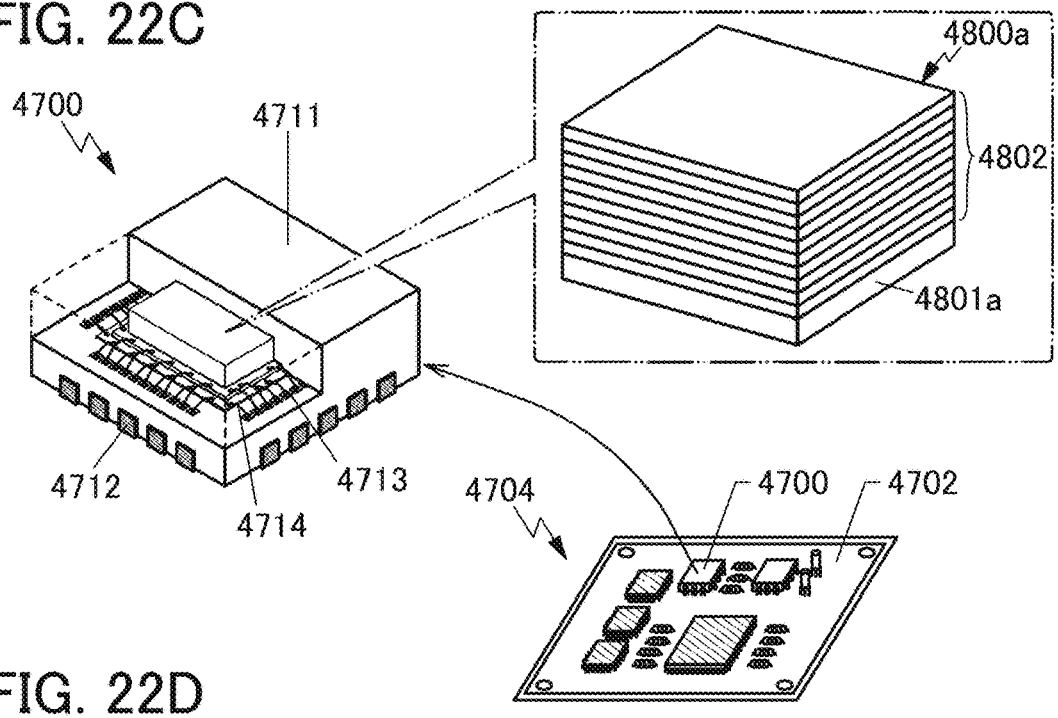
FIG. 22C and FIG. 22D are perspective views illustrating examples of electronic components.

FIG. 22C is a perspective view of an electronic component 4700 and a substrate (a mounting board 4704) on which the electronic component 4700 is mounted. The electronic component 4700 illustrated in FIG. 22C includes a chip 4800a in a mold 4711. Note that the chip 4800a illustrated in FIG. 22C is shown to have a structure in which the circuit portions 4802 are stacked. That is, the memory device described in the above embodiment can be used for the circuit portion 4802. To illustrate the inside of the electronic component 4700, some portions are omitted in FIG. 22C. The electronic component 4700 includes a land 4712 outside the mold 4711. The land 4712 is electrically connected to an electrode pad 4713, and the electrode pad 4713 is electrically connected to the chip 4800a through a wire 4714. The electronic component 4700 is mounted on a printed circuit board 4702, for example. A plurality of such electronic components are combined and electrically connected to each other on the printed circuit board 4702, so that the mounting board 4704 is completed.

Figure 22D:
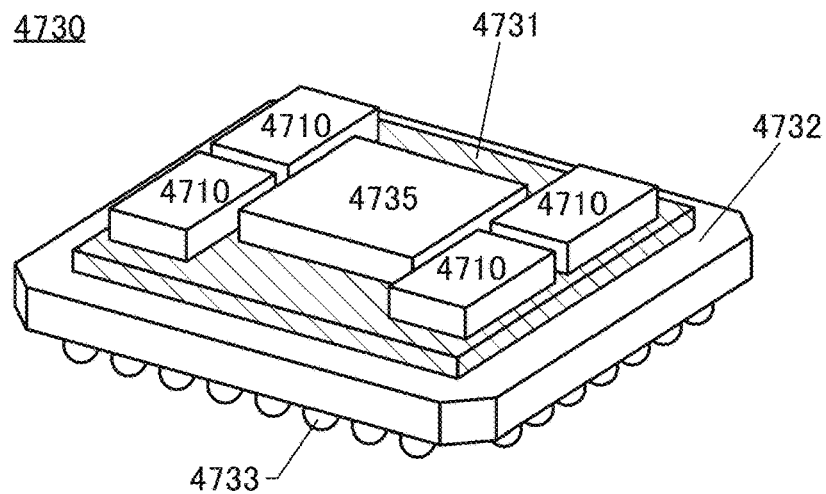

FIG. 22D is a perspective view of an electronic component 4730. The electronic component 4730 is an example of a SiP (System in package) or an MCM (Multi Chip Module). In the electronic component 4730, an interposer 4731 is provided on a package substrate 4732 (a printed circuit board), and a semiconductor device 4735 and a plurality of semiconductor devices 4710 are provided on the interposer 4731.

The electronic component 4730 includes the semiconductor devices 4710. Examples of the semiconductor device 4710 include the memory device described in the above embodiment and a high bandwidth memory (HBM). An integrated circuit (a semiconductor device) such as a CPU, a GPU, an FPGA, or a memory device can be used as the semiconductor device 4735.

As the package substrate 4732, a ceramic substrate, a plastic substrate, a glass epoxy substrate, or the like can be used. As the interposer 4731, a silicon interposer, a resin interposer, or the like can be used.

The interposer 4731 includes a plurality of wirings and has a function of electrically connecting a plurality of integrated circuits with different terminal pitches. The plurality of wirings have a single-layer structure or a multi-layer structure. In addition, the interposer 4731 has a function of electrically connecting an integrated circuit provided on the interposer 4731 to an electrode provided on the package substrate 4732. Accordingly, the interposer is sometimes referred to as a "redistribution substrate" or an "intermediate substrate". Furthermore, a through electrode is provided in the interposer 4731 and the through electrode is used to electrically connect an integrated circuit and the package substrate 4732 in some cases. In the case of using a silicon interposer, a TSV (Through Silicon Via) can also be used as the through electrode.

A silicon interposer is preferably used as the interposer 4731. The silicon interposer can be manufactured at lower cost than an integrated circuit because it is not necessary to provide an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In a SiP, an MCM, or the like using a silicon interposer, a decrease in reliability due to a difference in expansion coefficient between an integrated circuit and the interposer is less likely to occur. Furthermore, a surface of a silicon interposer has high planarity, and a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on the interposer.

A heat sink (a radiator plate) may be provided to overlap with the electronic component 4730. In the case of providing a heat sink, the heights of integrated circuits provided on the interposer 4731 are preferably equal to each other. For example, in the electronic component 4730 described in this embodiment, the heights of the semiconductor devices 4710 and the semiconductor device 4735 are preferably equal to each other.

To mount the electronic component 4730 on another substrate, an electrode 4733 may be provided on a bottom portion of the package substrate 4732. FIG. 22D illustrates an example in which the electrode 4733 is formed of a solder ball. Solder balls are provided in a matrix on the bottom portion of the package substrate 4732, so that BGA (Ball Grid Array) mounting can be achieved. Alternatively, the electrode 4733 may be formed of a conductive pin. When conductive pins are provided in a matrix on the bottom portion of the package substrate 4732, PGA (Pin Grid Array) mounting can be achieved.

The electronic component 4730 can be mounted on another substrate by any of various mounting methods other than BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

Note that this embodiment can be combined with any of the other embodiments in this specification as appropriate.

Embodiment 6

In this embodiment, a CPU that can include the memory device of the above embodiment will be described.

Figure 23:
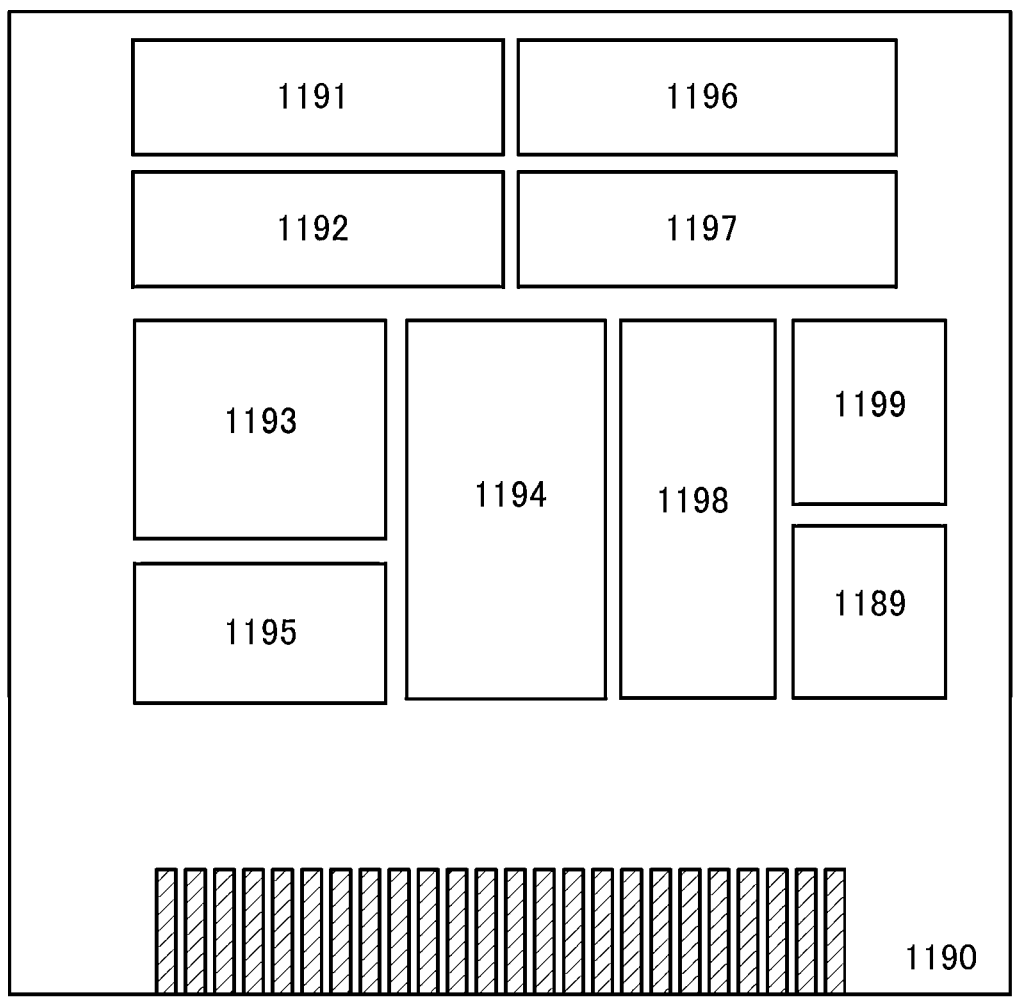
FIG. 23 is a block diagram illustrating a CPU.

FIG. 23 is a block diagram illustrating a configuration example of a CPU part of which employs the memory device described in the above embodiment.

The CPU illustrated in FIG. 23 includes an ALU 1191 (ALU: Arithmetic logic unit), an ALU controller 1192, an instruction decoder 1193, an interrupt controller 1194, a timing controller 1195, a register 1196, a register controller 1197, a bus interface 1198 (Bus I/F), a rewritable ROM 1199, and a ROM interface 1189 (ROM I/F) over a substrate 1190. A semiconductor substrate, an SOI substrate, a glass substrate, or the like is used as the substrate 1190. The ROM 1199 and the ROM interface 1189 may be provided over a separate chip. Needless to say, the CPU illustrated in FIG. 23 is just an example of a simplified configuration, and actual CPUs have a variety of configurations depending on the usage. For example, a CPU may have a configuration in which a plurality of cores each including the CPU illustrated in FIG. 23 or an arithmetic circuit are included and operate in parallel, that is, a GPU-like configuration. The number of bits that the CPU can process in an internal arithmetic circuit or a data bus can be 8, 16, 32, or 64, for example.

An instruction that is input to the CPU through the bus interface 1198 is input to the instruction decoder 1193 and decoded therein, and then input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device, a peripheral circuit, or the like on the basis of its priority or a mask state, and processes the request. The register controller 1197 generates an address of the register 1196, and reads or writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator portion for generating an internal clock signal based on a reference clock signal, and supplies the internal clock signal to the above various circuits.

In the CPU illustrated in FIG. 23, a memory cell is provided in the register 1196. The register 1196 may include the memory device described in the above embodiment, for example.

In the CPU illustrated in FIG. 23, the register controller 1197 selects a retention operation in the register 1196 in accordance with an instruction from the ALU 1191. That is, the register controller 1197 selects whether data retention by a flip-flop is performed or data retention by a capacitor is performed in the memory cell included in the register 1196. In the case where data retention by the flip-flop is selected, power supply voltage is supplied to the memory cell in the register 1196. In the case where data retention by the capacitor is selected, the data is rewritten into the capacitor, and supply of power supply voltage to the memory cell in the register 1196 can be stopped.

Note that this embodiment can be combined with any of the other embodiments in this specification as appropriate.

Embodiment 7

In this embodiment, examples of electronic devices each including the memory device described in the above embodiment will be described. FIG. 24A to FIG. 24I illustrate electronic devices each of which includes the electronic component 4700 including the memory device.

[Mobile Phone]

Figure 24A:
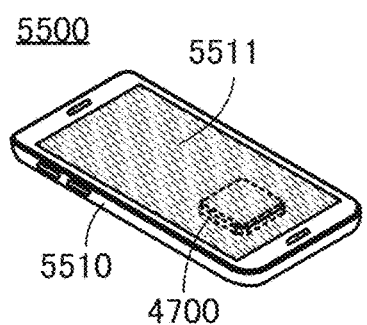
FIG. 24A to FIG. 24I are each a perspective view or a schematic view illustrating an example of a product.

An information terminal 5500 illustrated in FIG. 24A is a mobile phone (smartphone), which is a type of information terminal. The information terminal 5500 includes a housing 5510 and a display portion 5511, and as input interfaces, a touch panel is provided in the display portion 5511 and a button is provided in the housing 5510.

By using the memory device described in the above embodiment, the information terminal 5500 can retain a temporary file generated at the time of executing an application (e.g., a web browser's cache).

[Wearable Terminal]

Figure 24B:
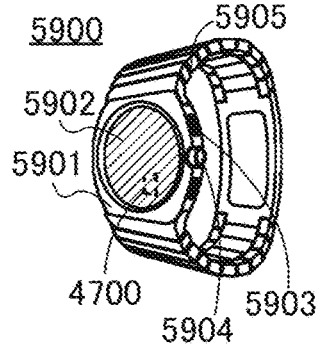

FIG. 24B illustrates an information terminal 5900 as an example of a wearable terminal. The information terminal 5900 includes a housing 5901, a display portion 5902, an operation button 5903, an operator 5904, a band 5905, and the like.

Like the information terminal 5500 described above, the wearable terminal can retain a temporary file generated at the time of executing an application by using the memory device described in the above embodiment.

[Information Terminal]

Figure 24C:

FIG. 24C illustrates a notebook information terminal 5300. The notebook information terminal 5300 illustrated in FIG. 24C includes, for example, a display portion 5331 in a housing 5330a and a keyboard portion 5350 in a housing 5330b.

Like the information terminal 5500 described above, the notebook information terminal 5300 can retain a temporary file generated at the time of executing an application by using the memory device described in the above embodiment.

Although the smartphone, the wearable terminal, and the notebook information terminal are respectively illustrated in FIG. 24A to FIG. 24C as examples of the electronic device, one embodiment of the present invention can be applied to information terminals other than a smartphone, a wearable terminal, and a notebook information terminal. Examples of information terminals other than a smartphone, a wearable terminal, and a notebook information terminal include a PDA (Personal Digital Assistant), a desktop information terminal, and a workstation.

[Household Appliance]

Figure 24D:
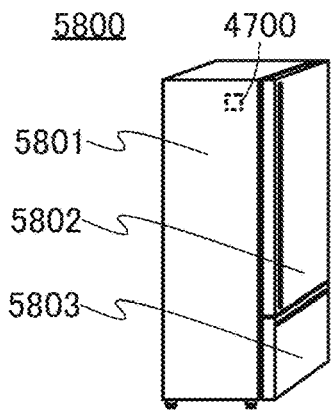

FIG. 24D illustrates an electric refrigerator-freezer 5800 as an example of a household appliance. The electric refrigerator-freezer 5800 includes a housing 5801, a refrigerator door 5802, a freezer door 5803, and the like.

When the memory device described in the above embodiment is used in the electric refrigerator-freezer 5800, the electric refrigerator-freezer 5800 can be used for IoT (Internet of Things), for example. With the use of IoT, the electric refrigerator-freezer 5800 can send and receive data on food stored in the electric refrigerator-freezer 5800 and food expiration dates, for example, to/from the above-described information terminal and the like via the Internet. When sending the data, the electric refrigerator-freezer 5800 can retain the data as a temporary file in the memory device.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audiovisual appliance.

[Game Machine]

Figure 24E:
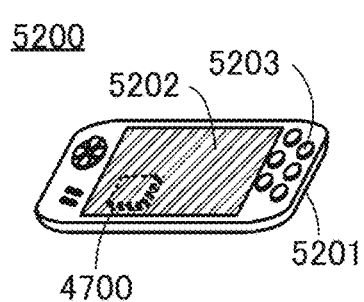

FIG. 24E illustrates a portable game machine 5200 as an example of a game machine. The portable game machine 5200 includes a housing 5201, a display portion 5202, a button 5203, and the like.

Videos displayed on the portable game machine 5200 can be output with a display device such as a television device, a personal computer display, a game display, and a head-mounted display.

When the memory device described in the above embodiment is used in the portable game machine 5200, the portable game machine 5200 with low power consumption can be achieved. Moreover, heat generation from a circuit can be reduced owing to low power consumption; thus, the influence of heat generation on the circuit itself, a peripheral circuit, and a module can be reduced.

Moreover, with the use of the memory device described in the above embodiment, the portable game machine 5200 can retain a temporary file necessary for arithmetic operation that occurs during game play.

Although FIG. 24E illustrates the portable game machine as an example of a game machine, the electronic device of one embodiment of the present invention is not limited thereto. Examples of the electronic device of one embodiment of the present invention include a stationary game machine, an arcade game machine installed in entertainment facilities (e.g., a game center and an amusement park), and a throwing machine for batting practice installed in sports facilities.

[Moving Vehicle]

The memory device described in the above embodiment can be used in an automobile, which is a moving vehicle, and around the driver's seat in an automobile.

Figure 24F:
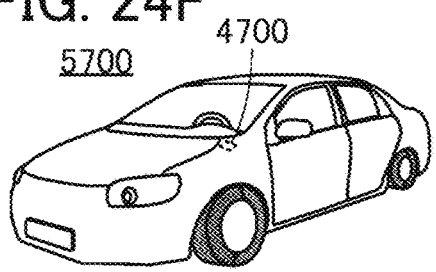

FIG. 24F illustrates an automobile 5700 as an example of a moving vehicle.

An instrument panel that provides various kinds of information by displaying a speedometer, a tachometer, a mileage, a fuel meter, a gearshift state, air-conditioning settings, and the like is provided around the driver's seat in the automobile 5700. In addition, a display device showing the above information may be provided around the driver's seat.

In particular, the display device can compensate for the view obstructed by the pillar or the like, the blind areas for the driver's seat, and the like by displaying a video taken by an imaging device (not illustrated) provided for the automobile 5700, thereby providing a high level of safety.

The memory device described in the above embodiment can temporarily retain data; thus, the memory device can be used to retain temporary data necessary in an automatic driving system for the automobile 5700 and a system for navigation and risk prediction, for example. The display device may be configured to display temporary information regarding navigation, risk prediction, or the like. Moreover, the memory device may be configured to hold a video of a driving recorder provided in the automobile 5700.

Although an automobile is described above as an example of a moving vehicle, the moving vehicle is not limited to an automobile. Other examples of moving vehicles include a train, a monorail train, a ship, and a flying object (a helicopter, an unmanned aircraft (drone), an airplane, and a rocket).

[Camera]

The memory device described in the above embodiment can be used in a camera.

Figure 24G:
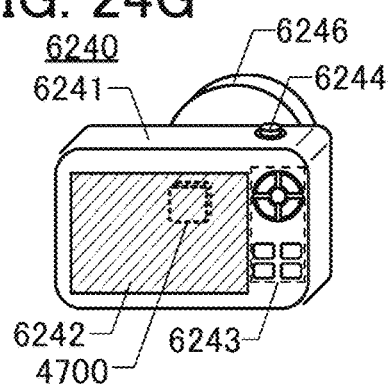

FIG. 24G illustrates a digital camera 6240 as an example of an imaging device. The digital camera 6240 includes a housing 6241, a display portion 6242, operation buttons 6243, a shutter button 6244, and the like, and a detachable lens 6246 is attached to the digital camera 6240. Here, the lens 6246 of the digital camera 6240 is detachable from the housing 6241 for replacement; alternatively, the lens 6246 may be incorporated into the housing 6241. Moreover, the digital camera 6240 may be configured to be equipped with a stroboscope, a viewfinder, or the like.

When the memory device described in the above embodiment is used in the digital camera 6240, the digital camera 6240 with low power consumption can be achieved. Moreover, heat generation from a circuit can be reduced owing to low power consumption; thus, the influence of heat generation on the circuit itself, a peripheral circuit, and a module can be reduced.

[ICD]

The memory device described in the above embodiment can be used in an implantable cardioverter-defibrillator (ICD).

Figure 24H:
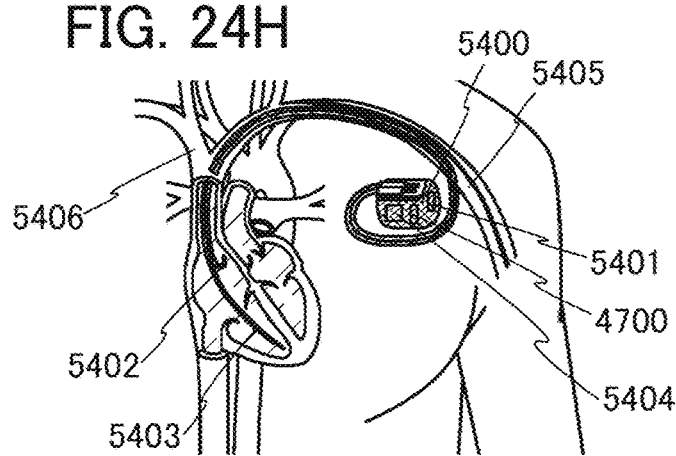

FIG. 24H is a schematic cross-sectional view showing an example of an ICD. An ICD main unit 5400 includes at least a battery 5401, the electronic component 4700, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with an end of one of the wires placed in the right ventricle and an end of the other wire placed in the right atrium.

The ICD main unit 5400 functions as a pacemaker and paces the heart when the heart rate is not within a predetermined range. When the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In the ICD main unit 5400, data on the heart rate obtained by the sensor or the like, the number of times the treatment with pacing is performed, and the time taken for the treatment, for example, can be stored in the electronic component 4700.

The antenna 5404 can receive electric power, and the battery 5401 is charged with the electric power. When the ICD main unit 5400 includes a plurality of batteries, safety can be increased. Specifically, even when one of the batteries in the ICD main unit 5400 is dead, the other batteries can function properly; thus, the batteries also function as an auxiliary power source.

In addition to the antenna 5404 capable of receiving electric power, an antenna that can transmit physiological signals may be included to construct, for example, a system that monitors cardiac activity by checking physiological signals such as a pulse, a respiratory rate, a heart rate, and body temperature with an external monitoring device.

[Expansion Device for PC]

The memory device described in the above embodiment can be used in a computer such as a PC (Personal Computer) and an expansion device for an information terminal.

Figure 24I:
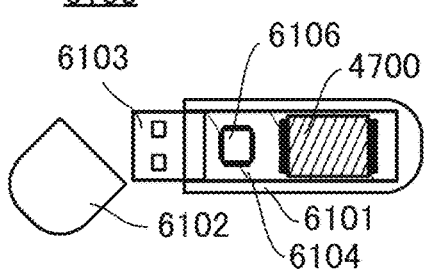

FIG. 24I illustrates, as an example of the expansion device, a portable expansion device 6100 that is externally attached to a PC and includes a chip capable of holding data. When the expansion device 6100 is connected to a PC with a USB (Universal Serial Bus), for example, data can be stored in the chip. FIG. 24I illustrates the portable expansion device 6100; however, the expansion device of one embodiment of the present invention is not limited thereto and may be a relatively large expansion device including a cooling fan or the like, for example.

The expansion device 6100 includes a housing 6101, a cap 6102, a USB connector 6103, and a substrate 6104. The substrate 6104 is held in the housing 6101. The substrate 6104 is provided with a circuit for driving the memory device described in the above embodiment and the like. For example, the substrate 6104 is provided with the electronic component 4700 and a controller chip 6106. The USB connector 6103 functions as an interface for connection to an external device.

Although not illustrated, the memory device described in the above embodiment can also be used in, for example, a computer such as a PC (Personal Computer), and an SD card and an SSD (Solid State Drive) that can be attached to expansion devices for information terminals.

By using the semiconductor device or the memory device described in Embodiment 1 or Embodiment 2 as the memory devices included in the above electronic devices, novel electronic devices can be provided.

Note that this embodiment can be combined with any of the other embodiments in this specification as appropriate.

REFERENCE NUMERALS

MCA: memory cell array, MC: memory cell, MC[1,1]: memory cell, MC[m,1]: memory cell, MC[1,$n$]: memory cell, MC[m,n]: memory cell, MCs: memory cell, MCa: circuit, MCb: circuit, WDD: circuit, RDD: circuit, WRWD: circuit, FECD: circuit, M1: transistor, M1$a$: transistor, M1$b$: transistor, FJA: FTJ element, FJAa: FTJ element, FJAb: FTJ element, FJB: FTJ element, ANA: circuit element, SW1: switch, SW2: switch, OP: operational amplifier, LE: load, WRDL: wiring, WRDL[1]: wiring, WRDL[n]: wiring, WRWL: wiring, WRWL[1]: wiring, WRWL[m]: wiring, FCA: wiring, FCA[1]: wiring, FCA[m]: wiring, FCB: wiring, FCB[1]: wiring, FCB[m]: wiring, IL: wiring, OL: wiring, SL1: wiring, SL2: wiring, RFL: wiring, 100: memory device, 300: transistor, 310: substrate, 310A: substrate, 312: element isolation layer, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 411: insulator, 412: insulator, 413: insulator, 414: insulator, 416: conductor, 500: transistor, 503: conductor, 503a: conductor, 503b: conductor, 510: insulator, 512: insulator, 514: insulator, 516: insulator, 522: insulator, 524: insulator, 530: oxide, 530a: oxide, 530b: oxide, 530ba: region, 530bb: region, 530bc: region, 540: conductor, 540a: conductor, 540b: conductor, 541: insulator, 541a: insulator, 541b: insulator, 542: conductor, 542a: conductor, 542b: conductor, 543: oxide, 543a: oxide, 543b: oxide, 544: insulator, 550: insulator, 550a: insulator, 550b: insulator, 552: insulator, 554: insulator, 560: conductor, 560a: conductor, 560b: conductor, 571: insulator, 571a: insulator, 571b: insulator, 574: insulator, 576: insulator, 580: insulator, 581: insulator, 582: insulator, 586: insulator, 600: capacitor, 610: conductor, 612: conductor, 620: conductor, 630: insulator, 631: insulator, 632: insulator, 640: insulator, 641: insulator, 642: insulator, 650: insulator, 660: conductor, 700: FTJ element, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 4700: electronic component, 4702: printed circuit board, 4704: mounting board, 4710: semiconductor device, 4711: mold, 4712: land, 4713: electrode pad, 4714: wire, 4730: electronic component, 4731: interposer, 4732: package substrate, 4733: electrode, 4735: semiconductor device, 4800: semiconductor wafer, 4800a: chip, 4801: wafer, 4801a: wafer, 4802: circuit portion, 4803: spacing, 4803a: spacing, 5200: portable game machine, 5201: housing, 5202: display portion, 5203: button, 5300: notebook information terminal, 5330a: housing, 5330b: housing, 5331: display portion, 5350: keyboard portion, 5400: ICD main unit, 5401: battery, 5402: wire, 5403: wire, 5404: antenna, 5405: subclavian vein, 5406: superior vena cava, 5500: information terminal, 5510: housing, 5511: display portion, 5700: automobile, 5800: electric refrigerator-freezer, 5801: housing, 5802: refrigerator door, 5803: freezer door, 5900: information terminal, 5901: housing, 5902: display portion, 5903: operation button, 5904: operator, 5905: band, 6100: expansion device, 6101: housing, 6102: cap, 6103: USB connector, 6104: substrate, 6106: controller chip, 6240: digital camera, 6241: housing, 6242: display portion, 6243: operation button, 6244: shutter button, 6246: lens

The invention claimed is:

1. A semiconductor device comprising:
a first circuit, a second circuit, and a third circuit,
wherein the first circuit and the second circuit are arranged in a same row direction,
wherein the first circuit comprises a first transistor and a first element,
wherein the second circuit comprises a second transistor and a second element,
wherein the third circuit comprises a switch, an operational amplifier, and a load,
wherein the first element and the second element each comprise an input terminal, a tunnel insulating film, a dielectric, and an output terminal,
wherein in each of the first element and the second element, the input terminal, the tunnel insulating film, the dielectric, and the output terminal are stacked in this order,
wherein a gate of the first transistor and a gate of the second transistor are electrically connected to each other,
wherein one of a source and a drain of the first transistor is electrically connected to the output terminal of the first element,
wherein one of a source and a drain of the second transistor is electrically connected to the input terminal of the second element,
wherein a first terminal of the switch is electrically connected to the other of the source and the drain of the first transistor and the other of the source and the drain of the second transistor,
wherein a second terminal of the switch is electrically connected to an inverting input terminal of the operational amplifier and a first terminal of the load,
wherein an output terminal of the operational amplifier is electrically connected to a second terminal of the load, and
wherein the load comprises at least one of a resistor, a capacitor, and a transistor.

2. The semiconductor device according to claim 1,
wherein the tunnel insulating film comprises silicon oxide or silicon nitride, and
wherein the dielectric comprises an oxide containing one or both of hafnium and zirconium.

3. A semiconductor device comprising:
a first circuit, a second circuit, and a third circuit,
wherein the first circuit and the second circuit are arranged in a same row direction,
wherein the first circuit comprises a first transistor and a first ferroelectric capacitor,
wherein the second circuit comprises a second transistor and a second ferroelectric capacitor,
wherein the third circuit comprises a switch, an operational amplifier, and a load,
wherein a gate of the first transistor and a gate of the second transistor are electrically connected to each other,
wherein one of a source and a drain of the first transistor is electrically connected to a first terminal of the first ferroelectric capacitor,
wherein one of a source and a drain of the second transistor is electrically connected to a first terminal of the second ferroelectric capacitor,
wherein a first terminal of the switch is electrically connected to the other of the source and the drain of the first transistor and the other of the source and the drain of the second transistor,
wherein a second terminal of the switch is electrically connected to an inverting input terminal of the operational amplifier and a first terminal of the load,
wherein an output terminal of the operational amplifier is electrically connected to a second terminal of the load,
wherein the load comprises at least one of a resistor, a capacitor, and a transistor,
wherein the first ferroelectric capacitor and the second ferroelectric capacitor each comprise a dielectric, and
wherein the dielectric comprises an oxide containing one or both of hafnium and zirconium.

4. A semiconductor device comprising:
a first circuit, a second circuit, and a third circuit,
wherein the first circuit and the second circuit are arranged in a same row direction,
wherein the first circuit comprises a first transistor and a first circuit element, wherein the second circuit comprises a second transistor and a second circuit element, wherein the third circuit comprises a switch, an operational amplifier, and a load, wherein a gate of the first transistor and a gate of the second transistor are electrically connected to each other, wherein one of a source and a drain of the first transistor is electrically connected to a first terminal of the first circuit element, wherein one of a source and a drain of the second transistor is electrically connected to a first terminal of the second circuit element, wherein a first terminal of the switch is electrically connected to the other of the source and the drain of the first transistor and the other of the source and the drain of the second transistor, wherein a second terminal of the switch is electrically connected to an inverting input terminal of the operational amplifier and a first terminal of the load, wherein an output terminal of the operational amplifier is electrically connected to a second terminal of the load, wherein the load comprises at least one of a resistor, a capacitor, and a transistor, and wherein the first circuit element and the second circuit element each comprise any one of a variable resistor, a magnetic tunnel junction element, and a phase change memory element.

5. An electronic device comprising:

the semiconductor device according to claim 1, and a housing.

* * * * *